United States Patent
Lutz et al.

(10) Patent No.: US 7,449,355 B2
(45) Date of Patent: *Nov. 11, 2008

(54) ANTI-STICTION TECHNIQUE FOR ELECTROMECHANICAL SYSTEMS AND ELECTROMECHANICAL DEVICE EMPLOYING SAME

(75) Inventors: Markus Lutz, Palo Alto, CA (US); Aaron Partridge, Palo Alto, CA (US); Wilhelm Frey, Stuttgart (DE); Markus Ulm, Menlo Park, CA (US); Matthias Metz, Palo Alto, CA (US); Brian Stark, San Francisco, CA (US); Gary Yama, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 360 days.

This patent is subject to a terminal disclaimer.

(21) Appl. No.: 11/115,828

(22) Filed: Apr. 27, 2005

(65) Prior Publication Data

US 2006/0246631 A1    Nov. 2, 2006

(51) Int. Cl.
*H01L 21/00* (2006.01)
*H01L 21/461* (2006.01)
(52) U.S. Cl. .................. 438/50; 438/52; 438/706
(58) Field of Classification Search ............ 438/50, 438/52, 706
See application file for complete search history.

(56) References Cited

U.S. PATENT DOCUMENTS 4,849,071 A    7/1989    Evans et al.

(Continued)

FOREIGN PATENT DOCUMENTS

EP    1 167 979    1/2002

OTHER PUBLICATIONS

"Chemical Vapor Deposition of Fluoroalkylsilane Monolayer Films for Adhesion Control in Microelectromechanical Systems", Mayer et al., J. Vac. Sci. Technol. B 18(5), Sep./Oct. 2000, pp. 2433-2440.

(Continued)

*Primary Examiner*—Luan Thai
(74) *Attorney, Agent, or Firm*—Kenyon & Kenyon LLP

(57) ABSTRACT

A mechanical structure is disposed in a chamber, at least a portion of which is defined by the encapsulation structure. A first method provides a channel cap having at least one preform portion disposed over or in at least a portion of an anti-stiction channel to seal the anti-stiction channel, at least in part. A second method provides a channel cap having at least one portion disposed over or in at least a portion of an anti-stiction channel to seal the anti-stiction channel, at least in part. The at least one portion is fabricated apart from the electromechanical device and thereafter affixed to the electromechanical device. A third method provides a channel cap having at least one portion disposed over or in at least a portion of the anti-stiction channel to seal an anti-stiction channel, at least in part. The at least one portion may comprise a wire ball, a stud, metal foil or a solder preform. A device includes a substrate, an encapsulation structure and a mechanical structure. An anti-stiction layer is disposed on at least a portion of the mechanical structure. An anti-stiction channel is formed in at least one of the substrate and the encapsulation structure. A cap has at least one preform portion disposed over or in at least a portion of the anti-stiction channel to seal the anti-stiction channel, at least in part.

36 Claims, 89 Drawing Sheets

U.S. PATENT DOCUMENTS

| | | | |
|---|---|---|---|
| 4,945,769 A | 8/1990 | Sidner et al. | |
| 5,445,991 A | 8/1995 | Lee | |
| 5,470,797 A | 11/1995 | Mastrangelo | |
| 5,616,514 A | 4/1997 | Muchow et al. | |
| 5,683,591 A | 11/1997 | Offenberg | |
| 5,759,876 A | 6/1998 | Singlevich et al. | |
| 5,804,083 A | 9/1998 | Ishii et al. | |
| 5,906,310 A | 5/1999 | Vinciarelli et al. | |
| 5,922,212 A | 7/1999 | Kano et al. | |
| 5,963,788 A | 10/1999 | Barron et al. | |
| 6,146,917 A | 11/2000 | Zhang et al. | |
| 6,318,175 B1 | 11/2001 | Muchow et al. | |
| 6,352,935 B1 | 3/2002 | Collins et al. | |
| 6,423,563 B2 | 7/2002 | Fukada et al. | |
| 6,477,901 B1 | 11/2002 | Tadigadapa et al. | |
| 6,492,309 B1 | 12/2002 | Behr et al. | |
| 6,500,348 B2 | 12/2002 | Chase et al. | |
| 6,507,082 B2 | 1/2003 | Thomas | |
| 6,521,508 B1 | 2/2003 | Cheong et al. | |
| 6,528,875 B1 | 3/2003 | Glenn et al. | |
| 6,590,267 B1 | 7/2003 | Goodwin-Johansson et al. | |
| 6,602,351 B2 | 8/2003 | DeYoung et al. | |
| 6,621,392 B1 | 9/2003 | Volant et al. | |
| 6,625,047 B2 * | 9/2003 | Coleman, Jr. | 365/51 |
| 6,625,342 B2 | 9/2003 | Staple et al. | |
| 6,716,275 B1 | 4/2004 | Reed et al. | |
| 6,739,497 B2 | 5/2004 | Fortin et al. | |
| 6,743,740 B2 | 6/2004 | Brask | |
| 6,764,875 B2 | 7/2004 | Shook | |
| 6,777,263 B1 * | 8/2004 | Gan et al. | 438/106 |
| 6,808,954 B2 * | 10/2004 | Ma et al. | 438/51 |
| 6,815,361 B1 | 11/2004 | Bae et al. | |
| 6,815,818 B2 | 11/2004 | Moore et al. | |
| 6,818,464 B2 | 11/2004 | Heschel | |
| 6,822,326 B2 | 11/2004 | Enquist et al. | |
| 6,829,131 B1 | 12/2004 | Loeb et al. | |
| 6,835,657 B2 | 12/2004 | Ong | |
| 6,844,218 B2 | 1/2005 | Potts | |
| 6,844,609 B2 | 1/2005 | Motsiff et al. | |
| 6,847,124 B2 | 1/2005 | Semi | |
| 6,858,910 B2 | 2/2005 | Coyle et al. | |
| 6,930,367 B2 | 8/2005 | Lutz et al. | |
| 7,074,637 B2 * | 7/2006 | Lutz et al. | 438/50 |
| 2002/0132062 A1 | 9/2002 | Jacobs | |
| 2002/0179126 A1 | 12/2002 | DeYoung et al. | |
| 2002/0197002 A1 | 12/2002 | Lin | |
| 2003/0002019 A1 | 1/2003 | Miller | |
| 2003/0016337 A1 | 1/2003 | Duncan et al. | |
| 2003/0038327 A1 | 2/2003 | Smith | |
| 2003/0054588 A1 | 3/2003 | Patel et al. | |
| 2003/0102552 A1 | 6/2003 | Martin et al. | |
| 2003/0146464 A1 | 8/2003 | Prophet | |
| 2003/0155643 A1 | 8/2003 | Freidhoff | |
| 2003/0161949 A1 | 8/2003 | Ashurst et al. | |
| 2003/0178635 A1 | 9/2003 | Volant et al. | |
| 2003/0183916 A1 * | 10/2003 | Heck et al. | 257/684 |
| 2004/0266038 A1 | 12/2004 | Heschel | |
| 2005/0255645 A1 | 11/2005 | Lutz et al. | |

OTHER PUBLICATIONS

Gold Stud Bump Applications, Tutorial 24, George A. Riley, FlipChips Dot Com, posted Nov. 2002 at www.flipchips.com/tutorial24.html, 6 pages.

"Solder Bump Technology: Present and Future", Franka et al., SemiconductorFabtech.com, TAP Resource, Feb. 2005, posted at www.semiconductorfabtech.com/features/tap/articles/02.289.html.

* cited by examiner

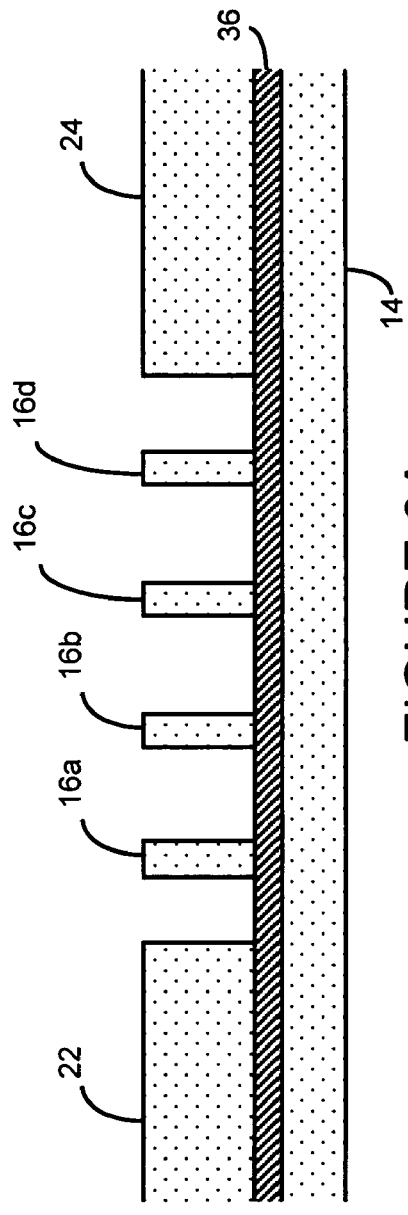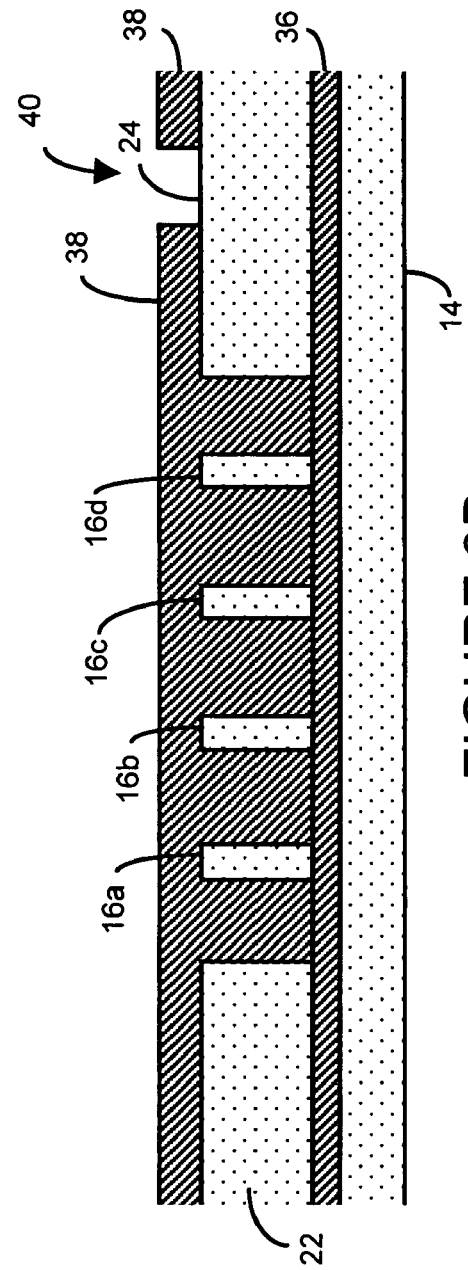

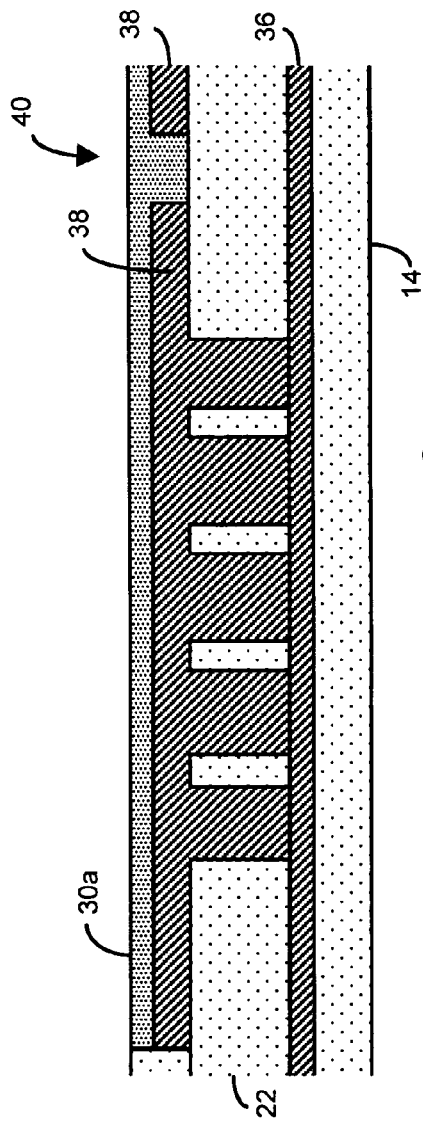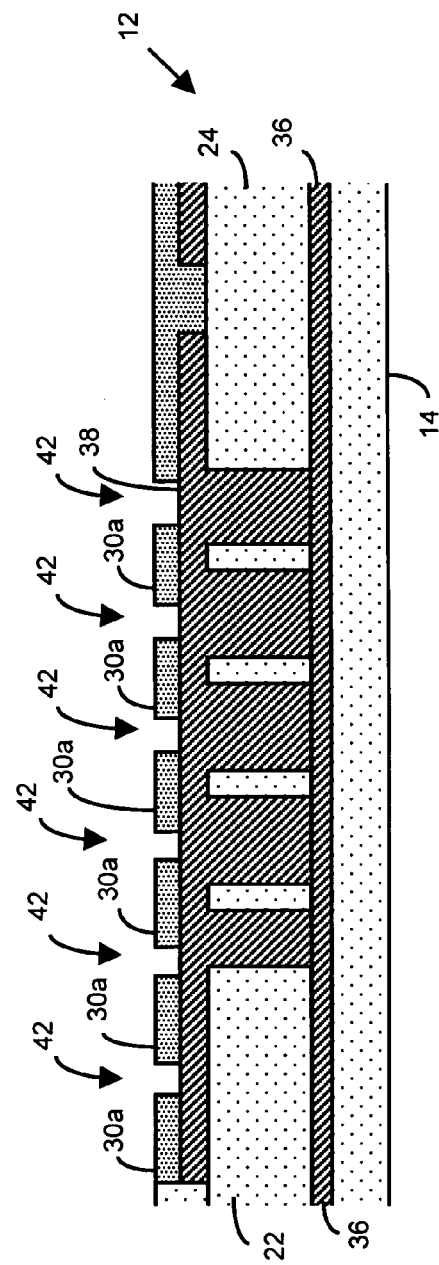

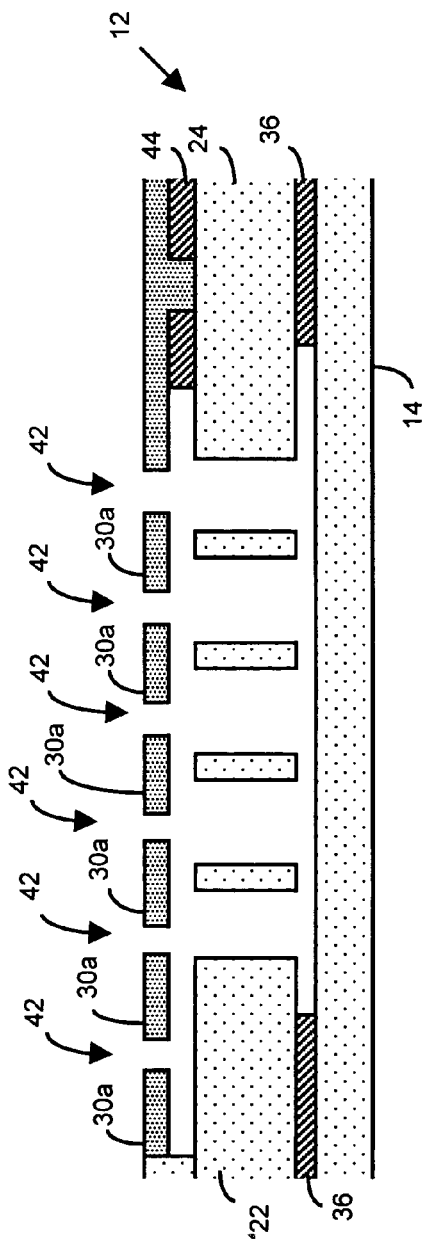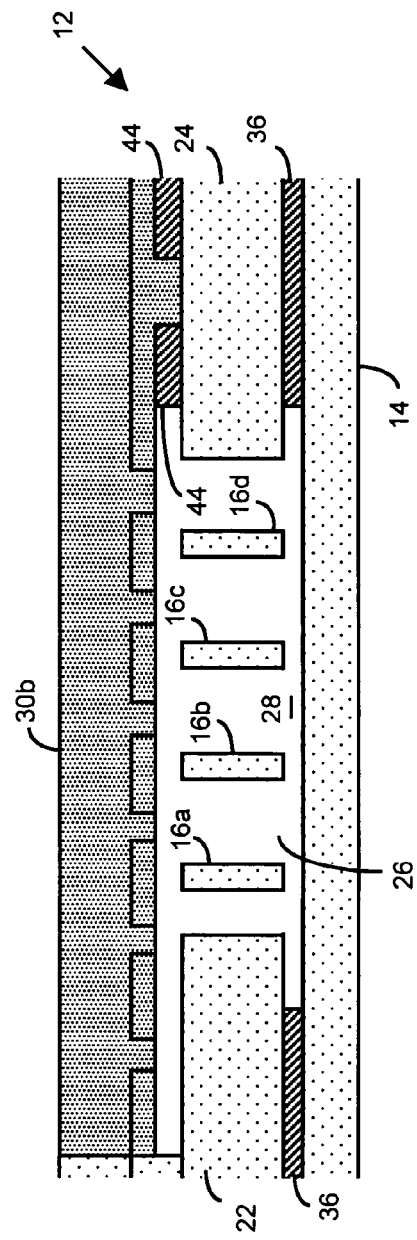

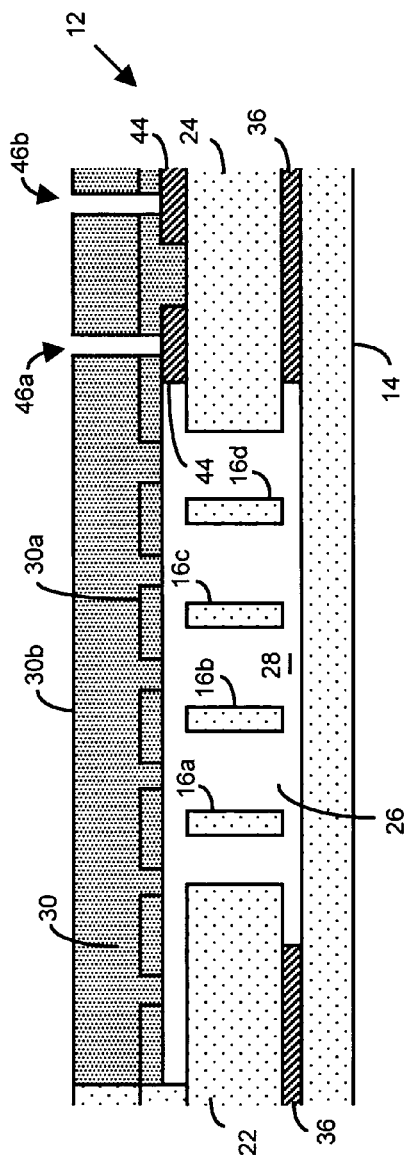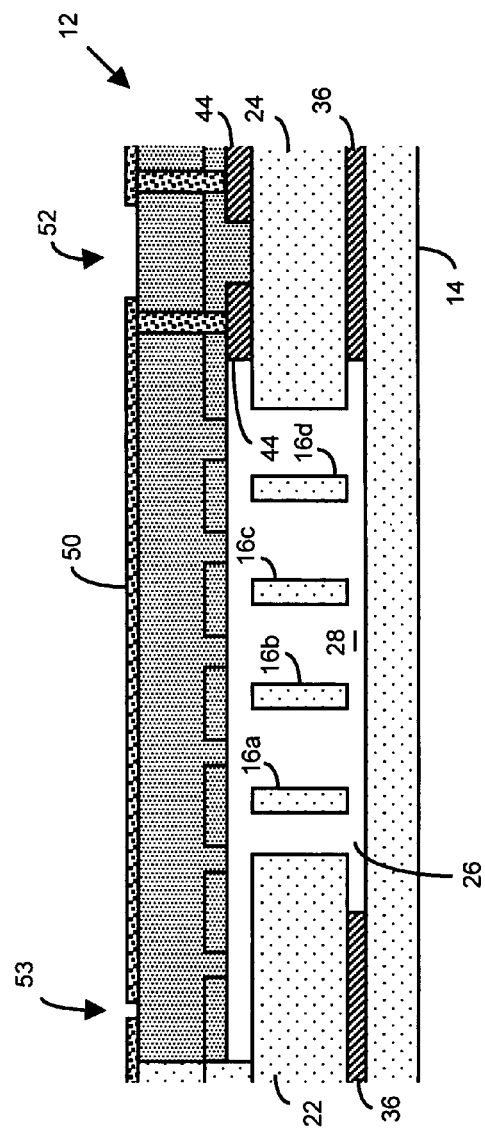

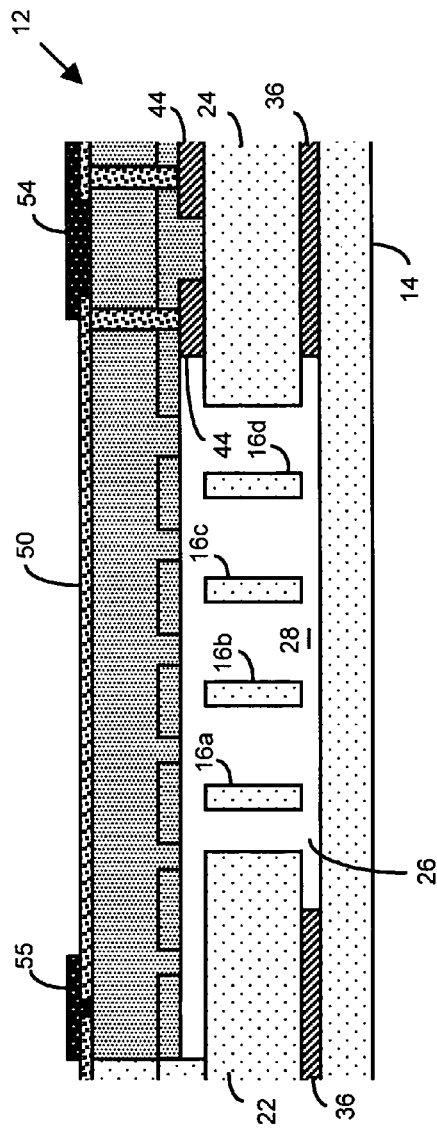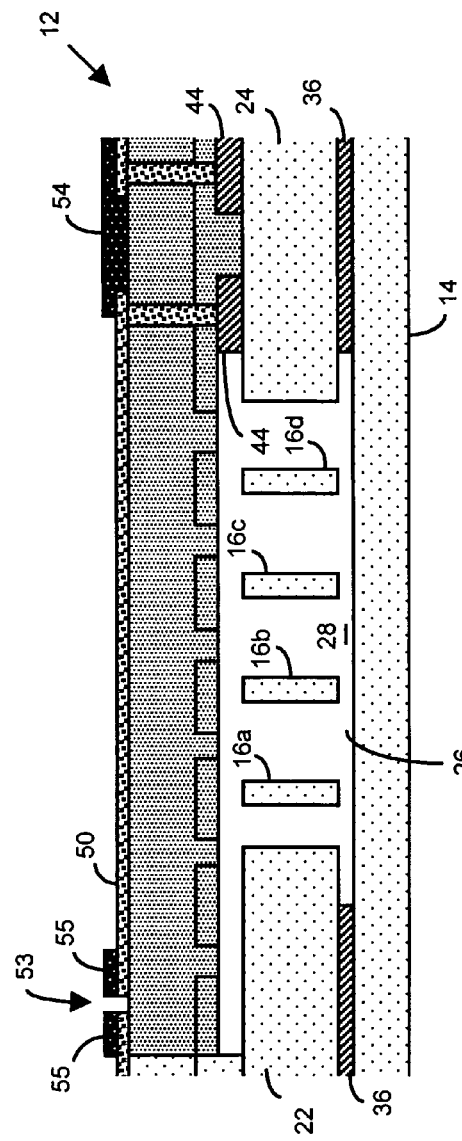

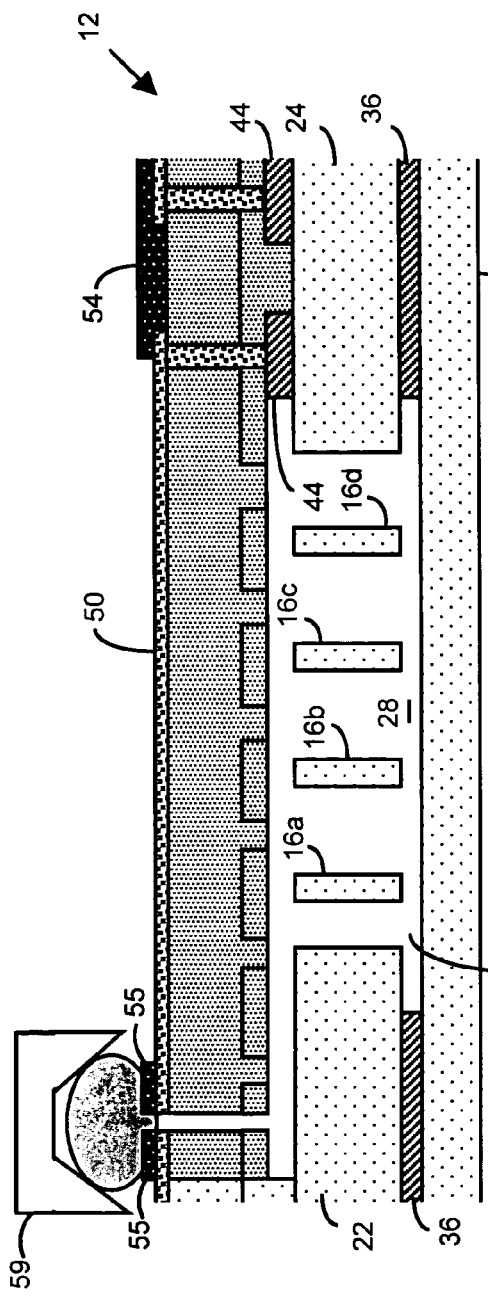
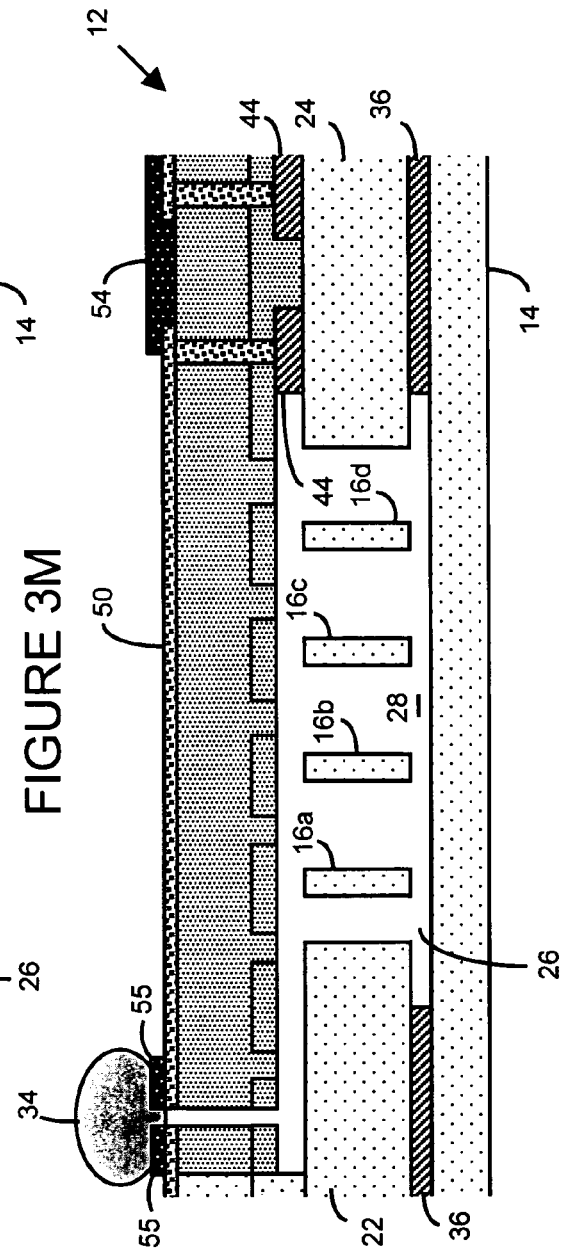
FIGURE 3M
FIGURE 3N

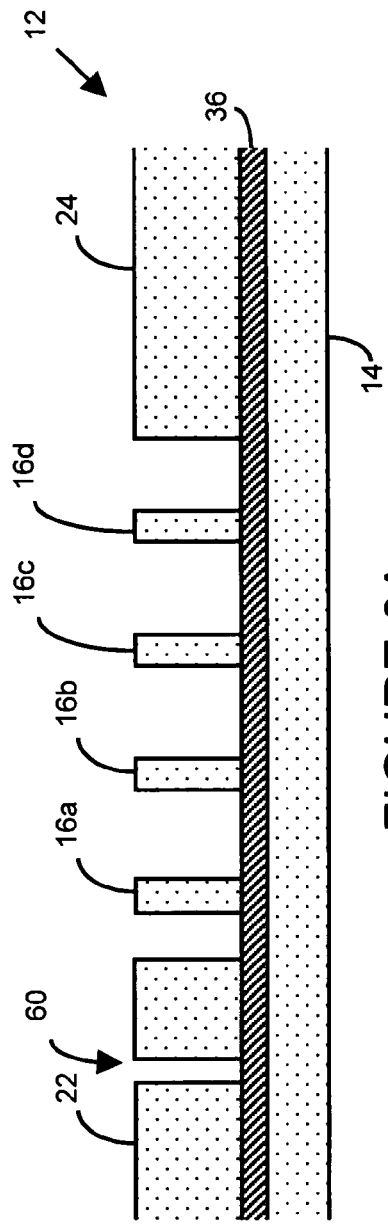
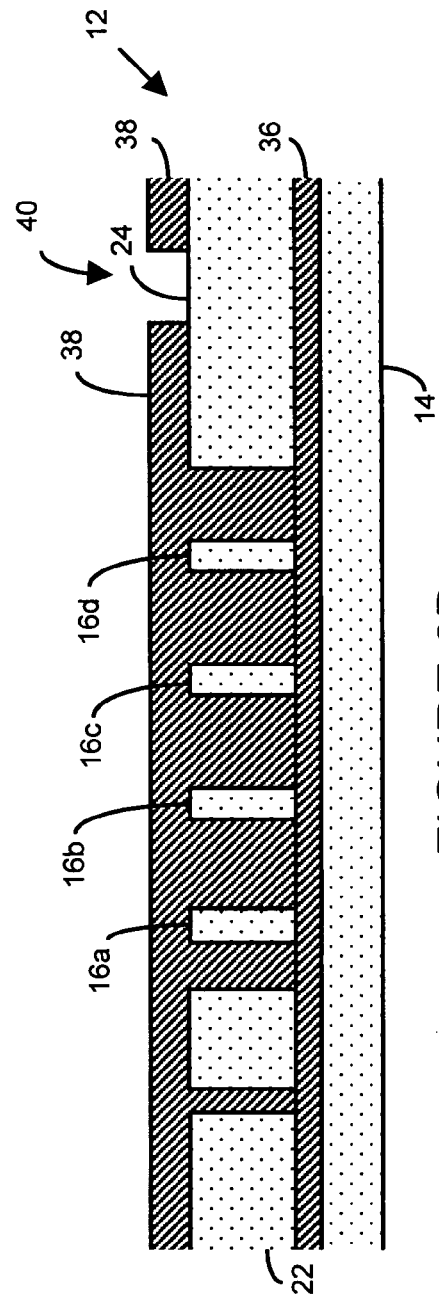

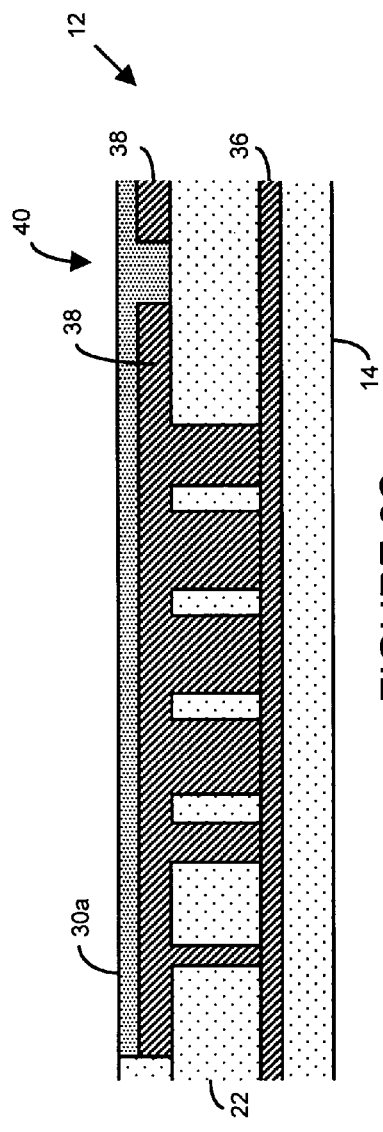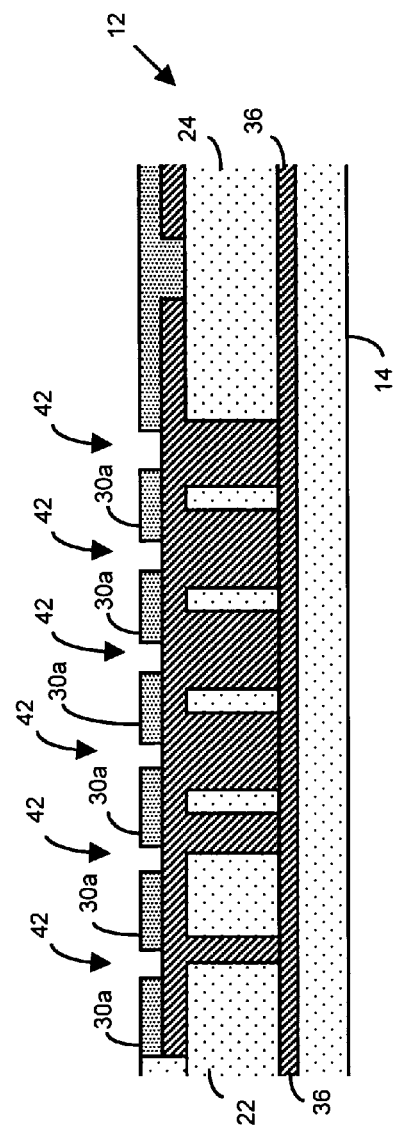

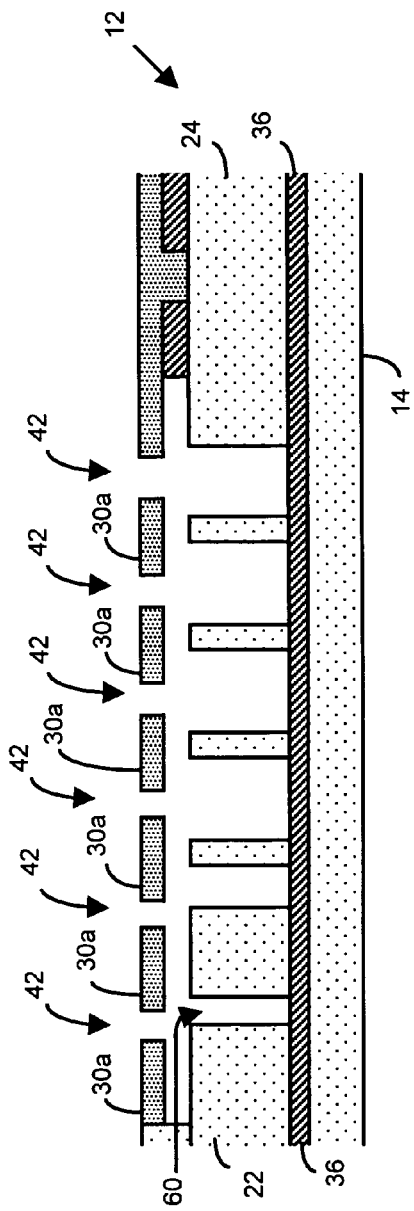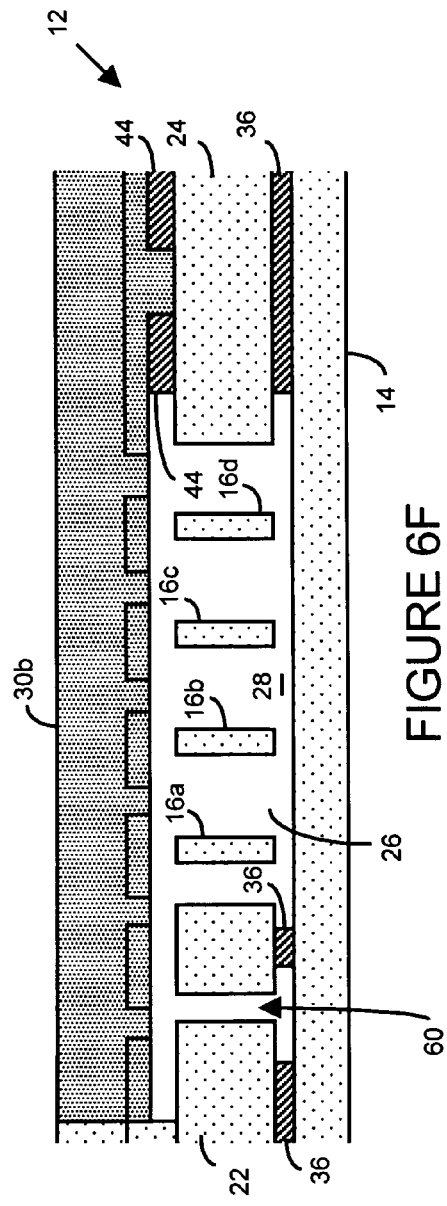

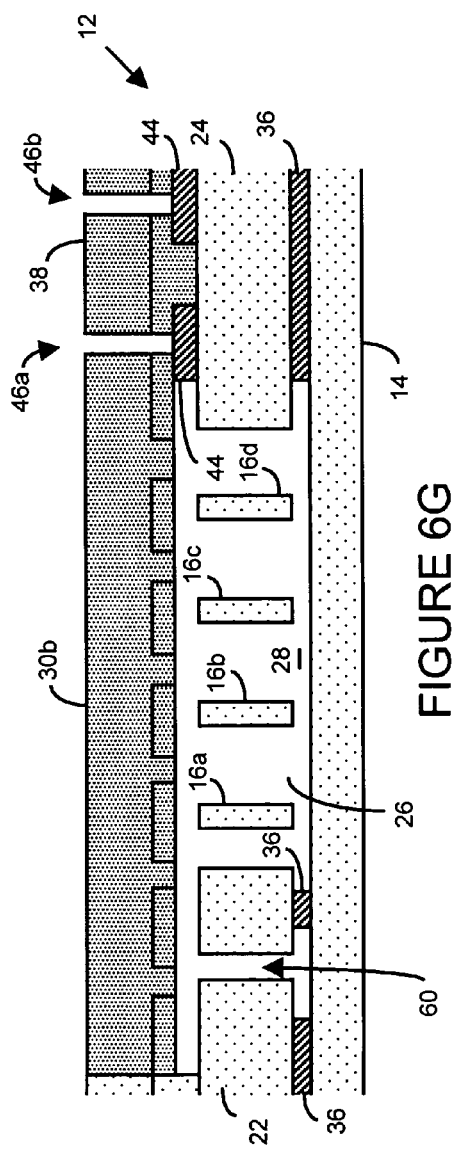
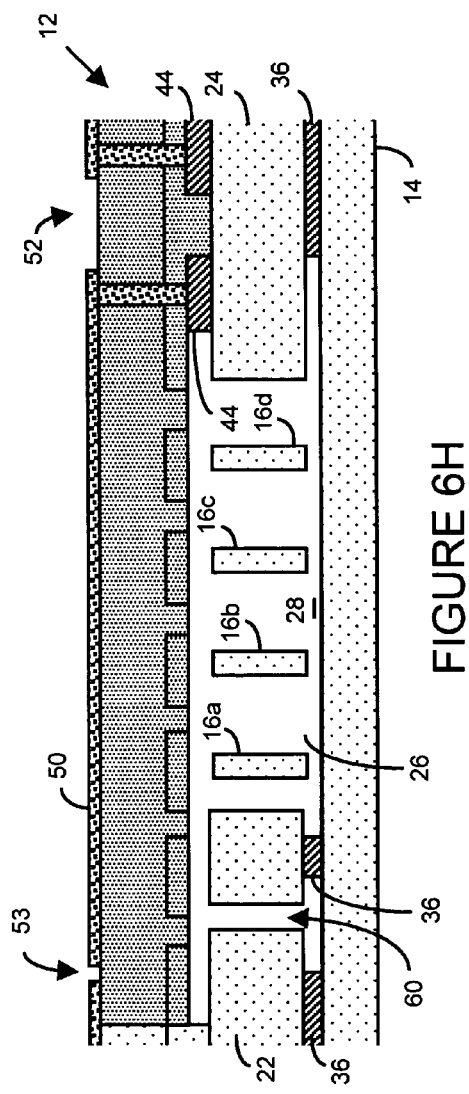

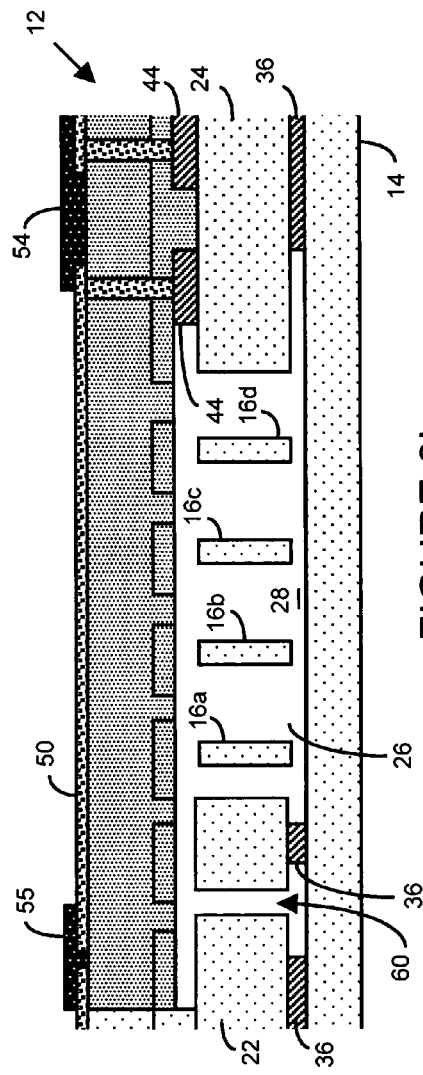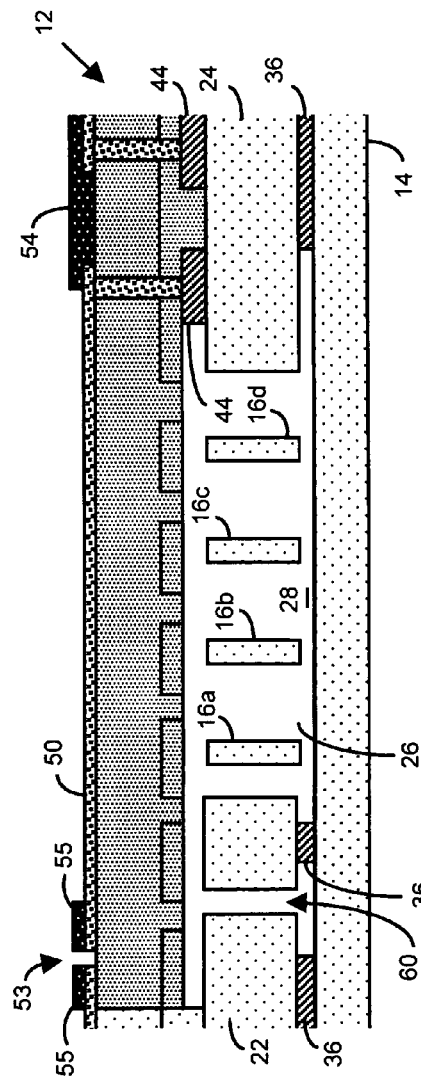

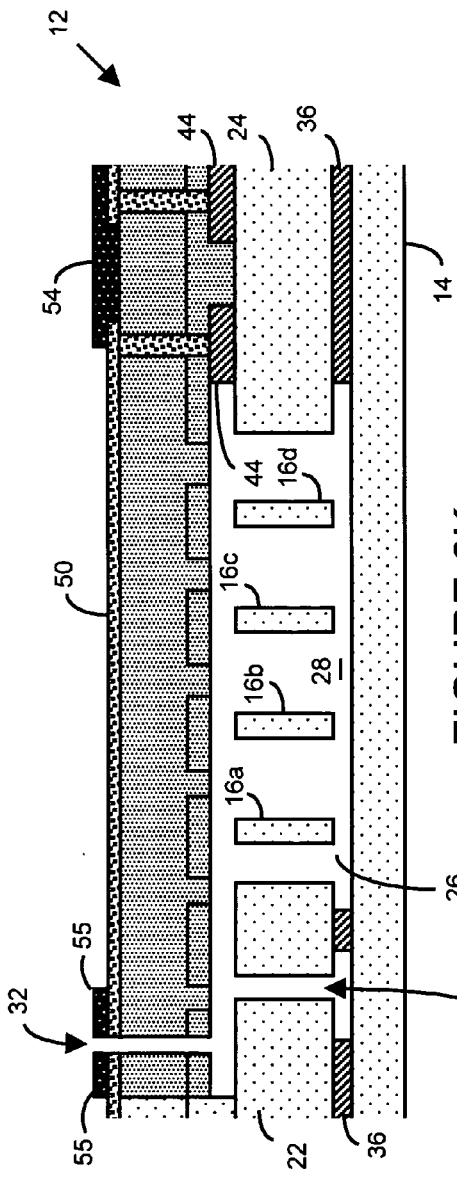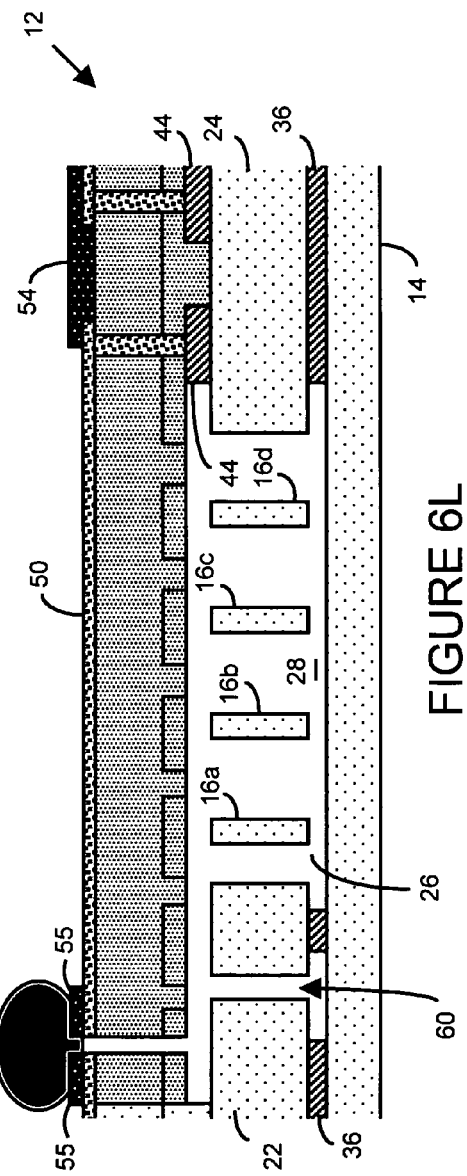

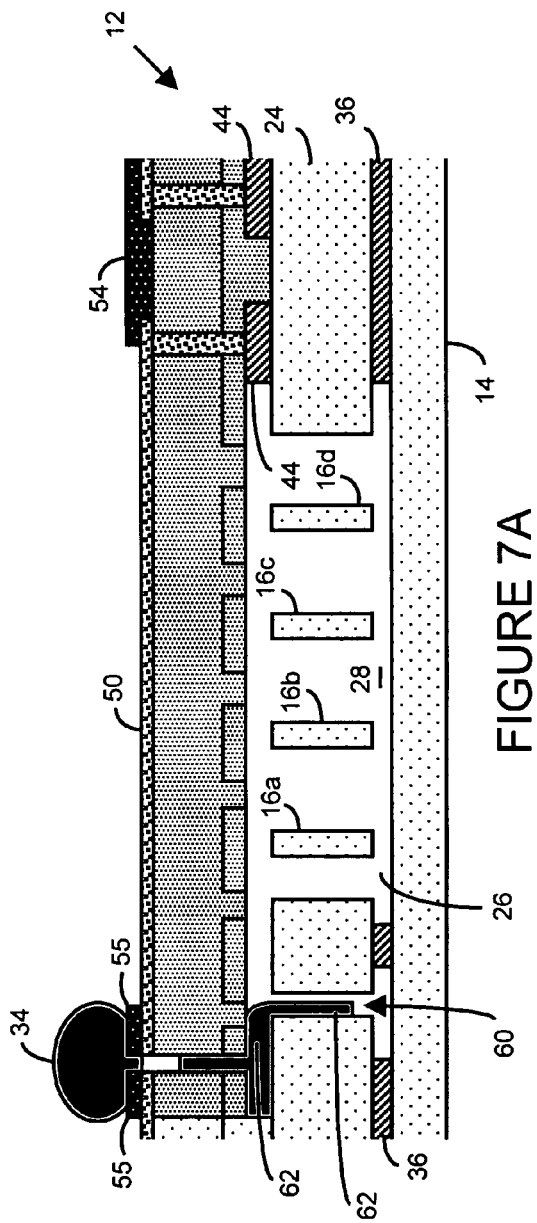
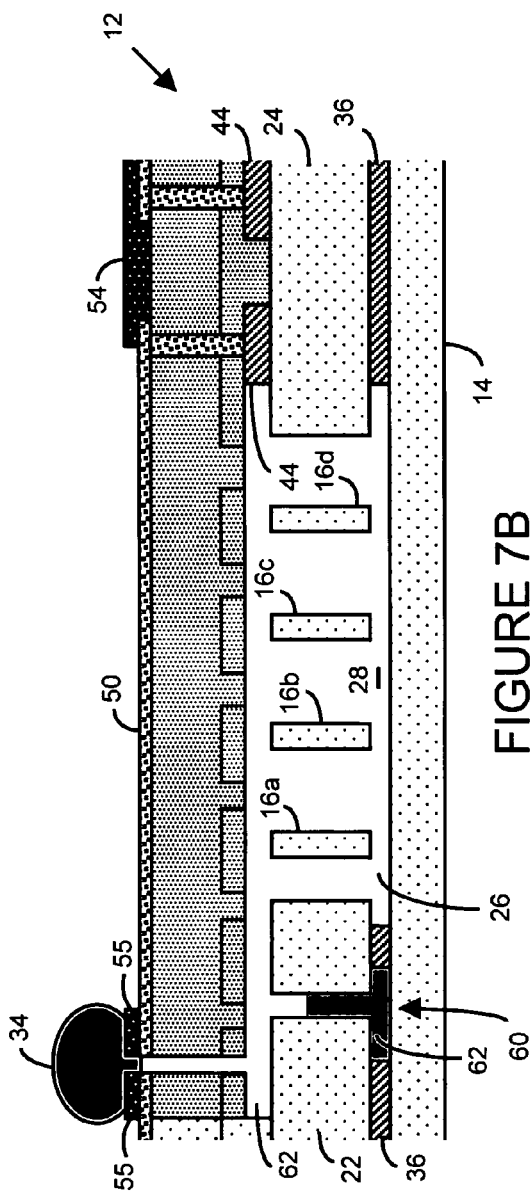
FIGURE 7A
FIGURE 7B

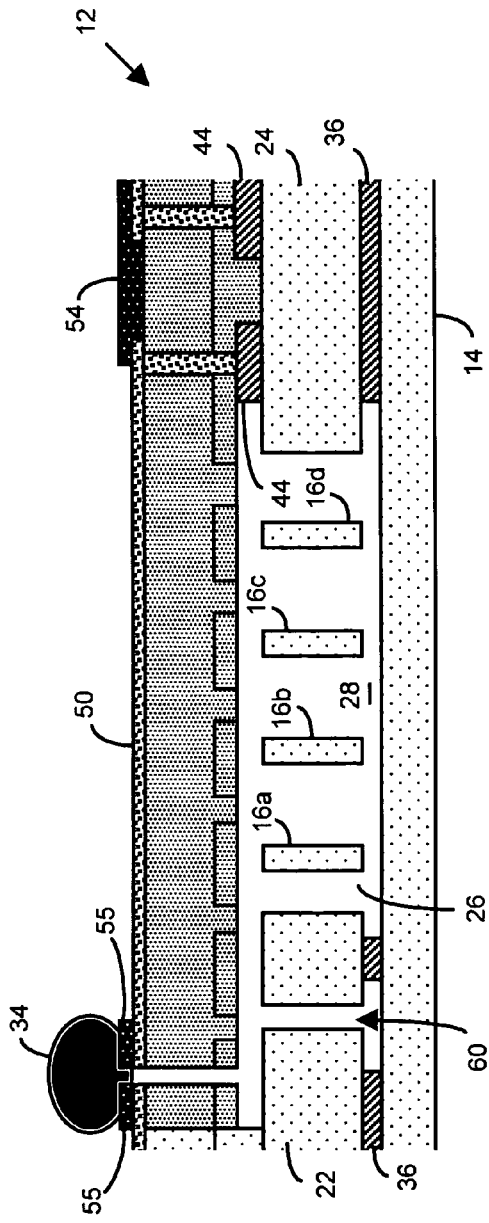
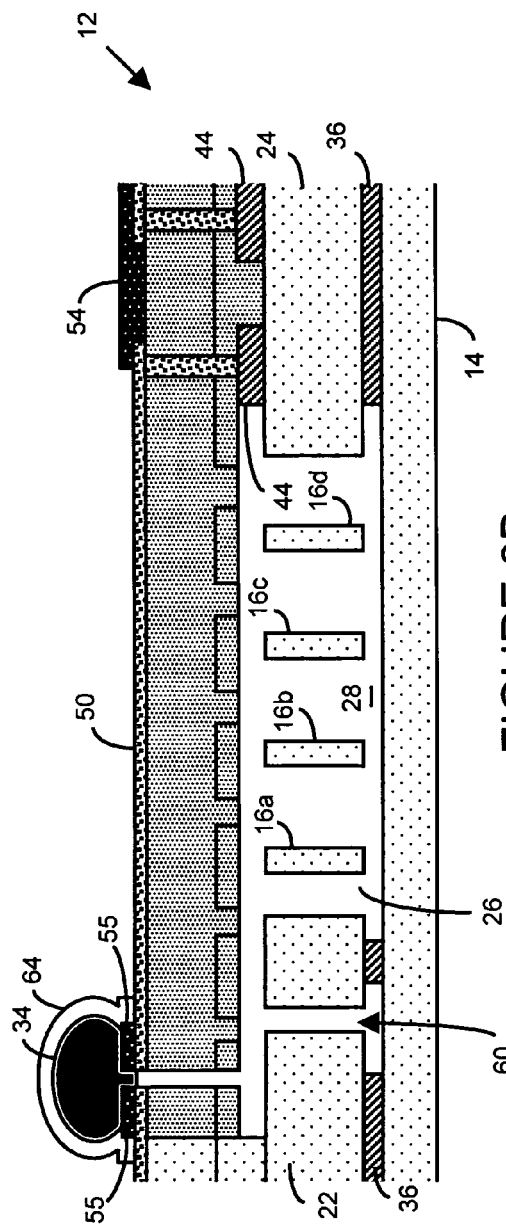
FIGURE 8A
FIGURE 8B

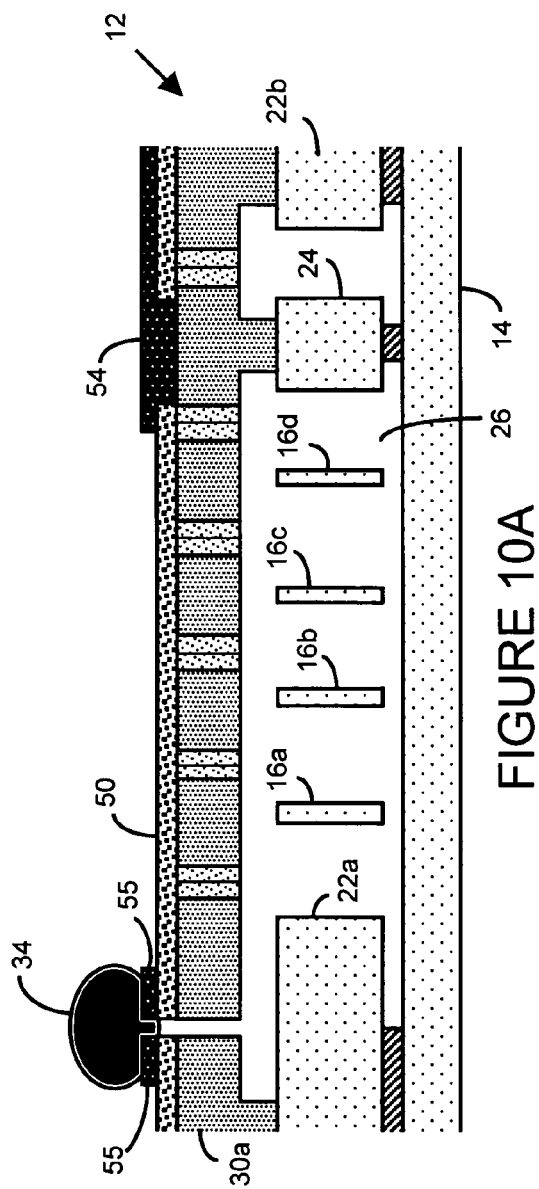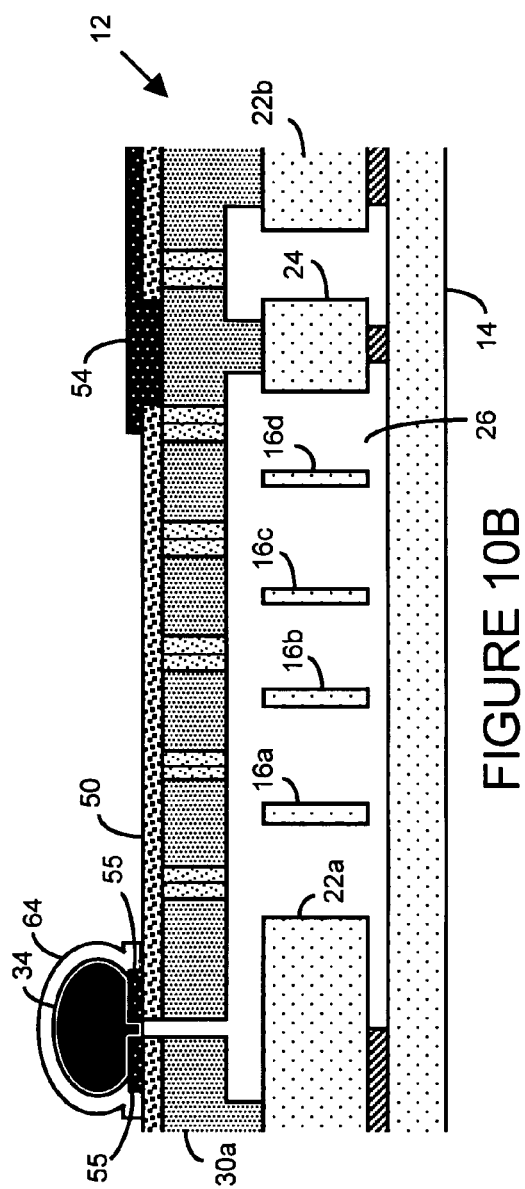
FIGURE 10A
FIGURE 10B

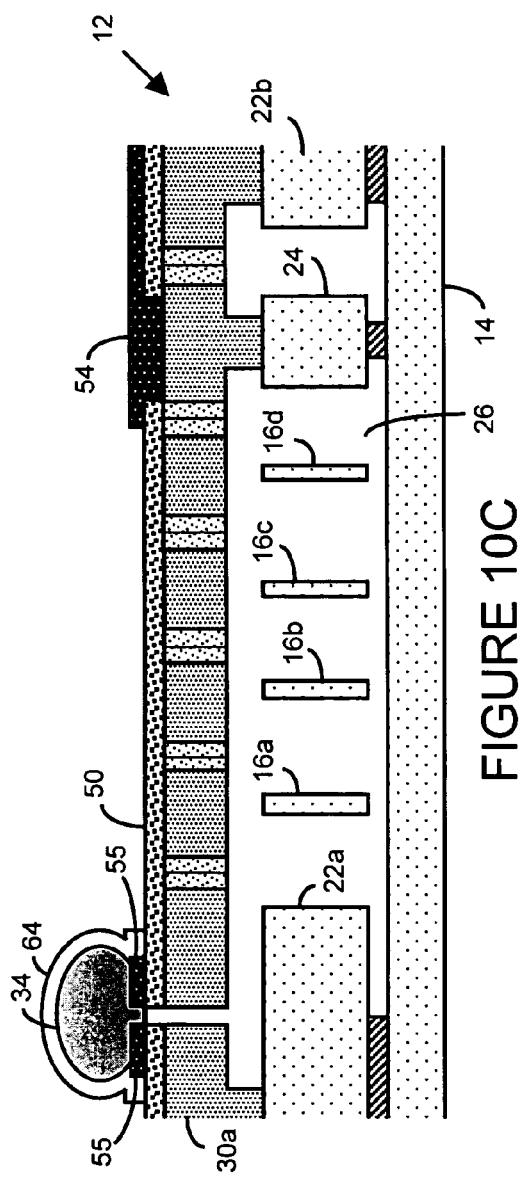
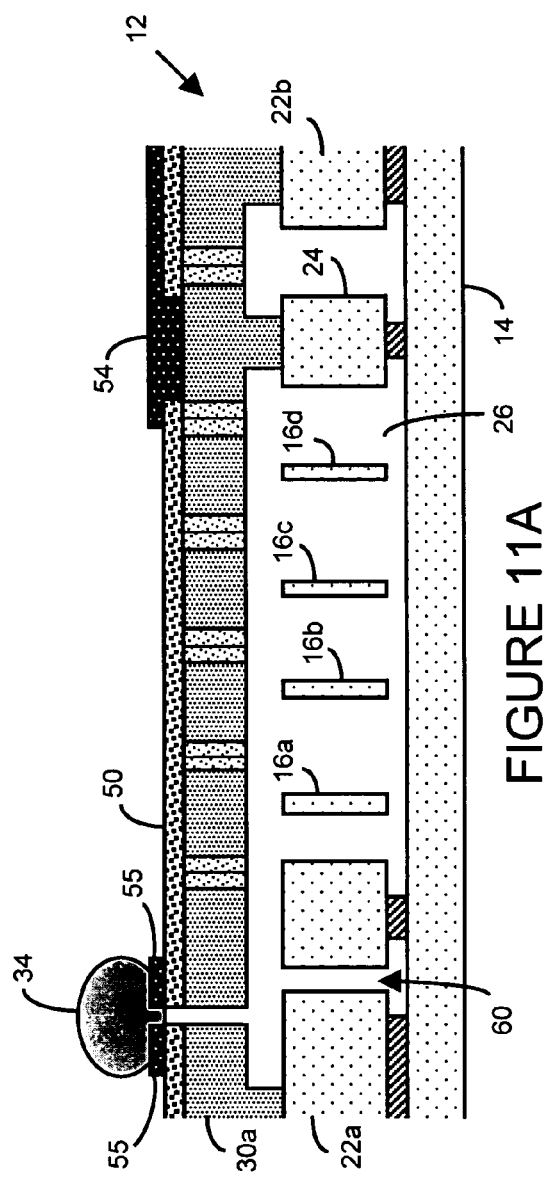

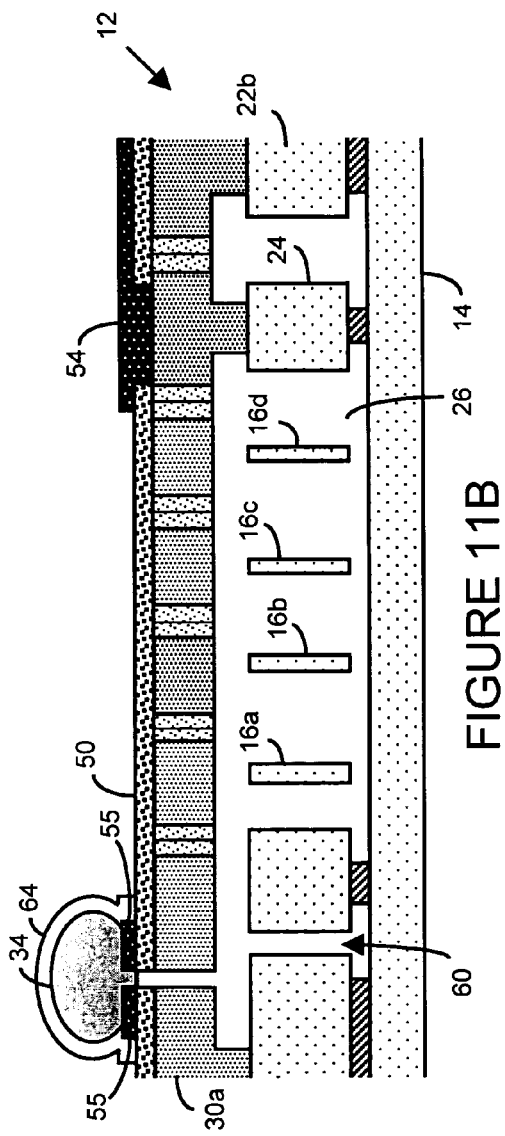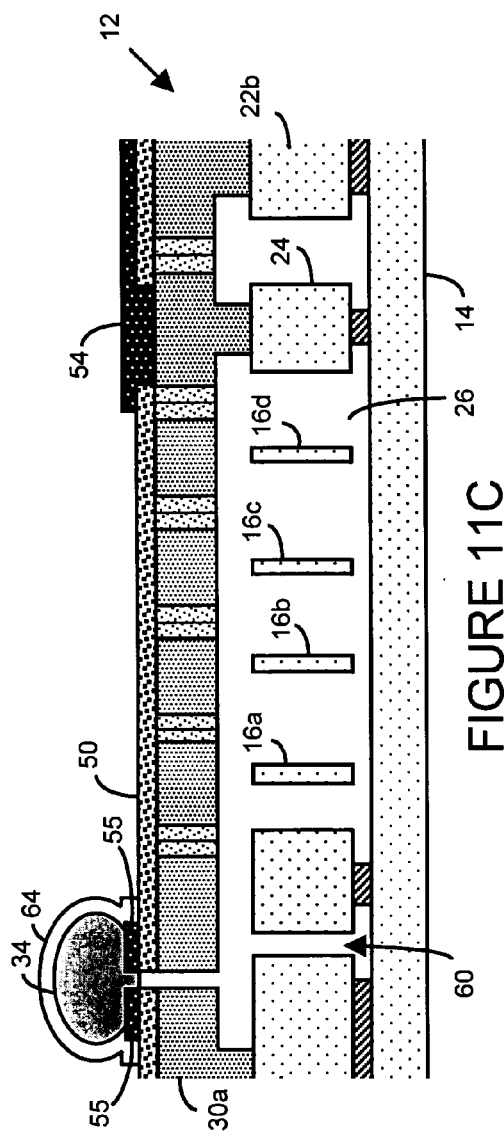

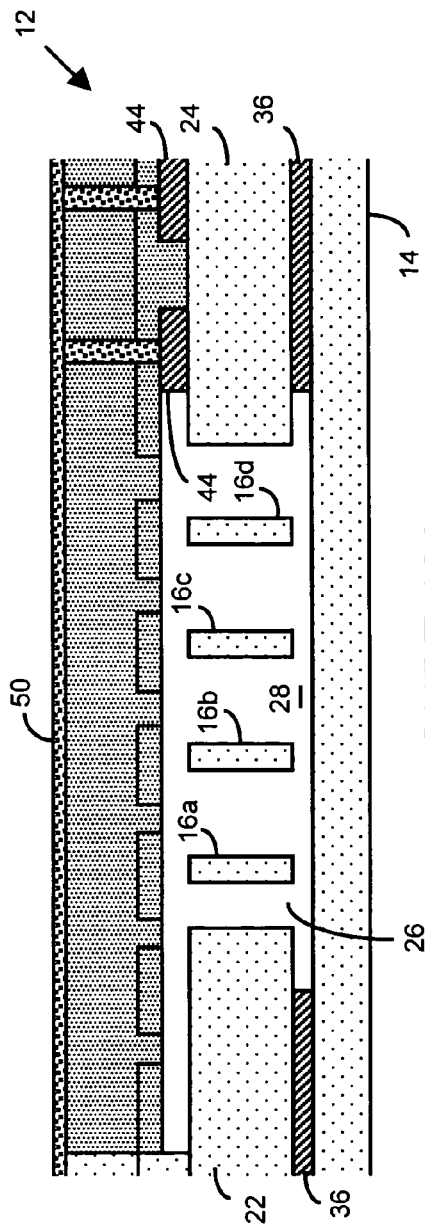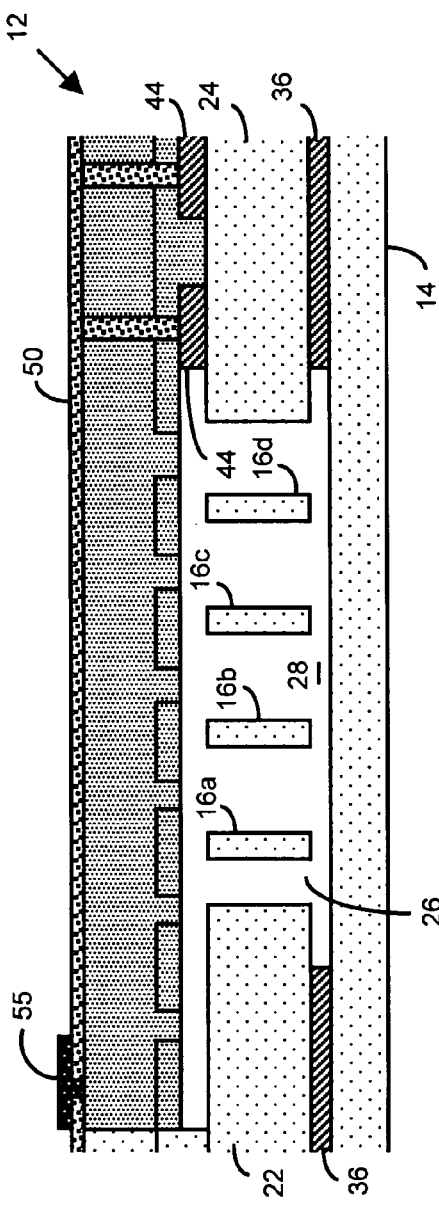

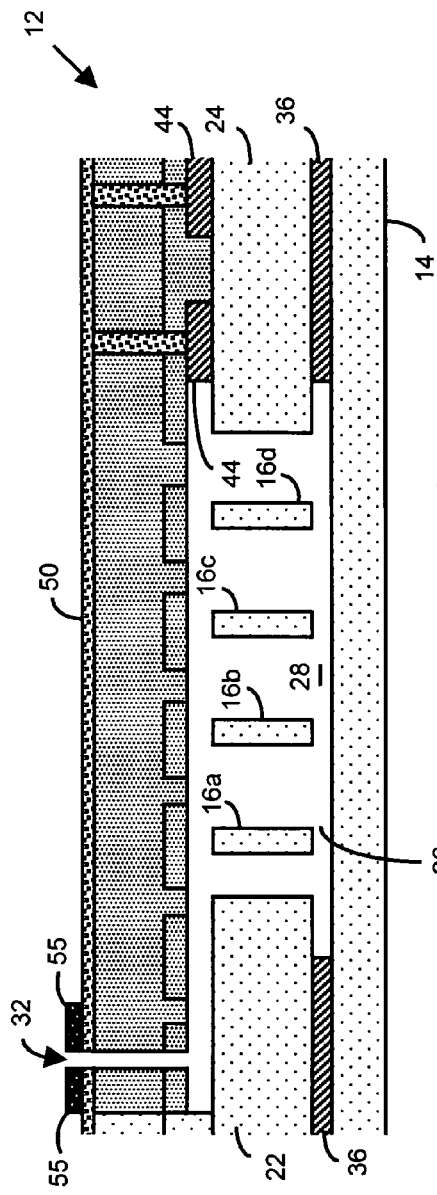
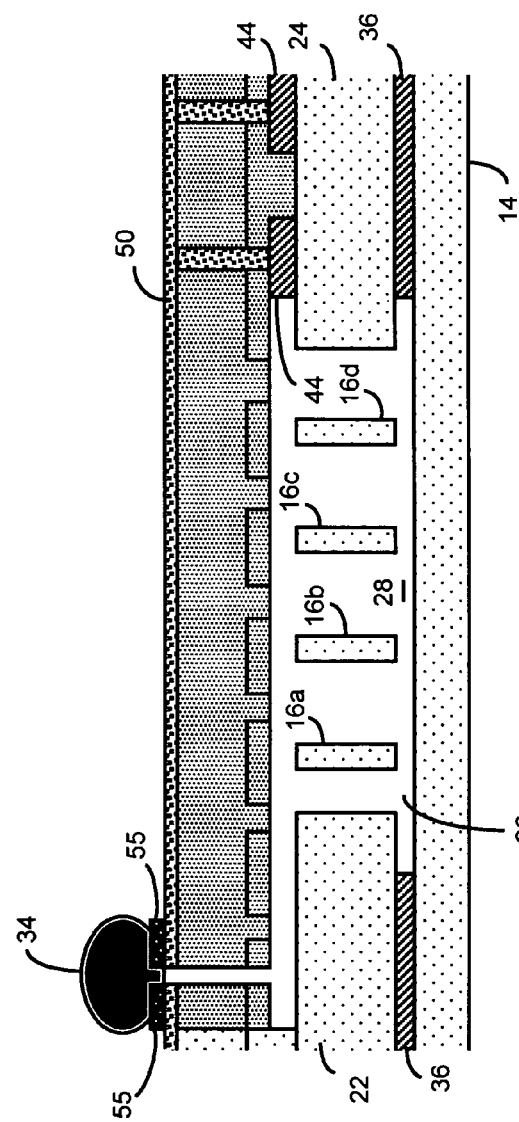
FIGURE 16C
FIGURE 16D

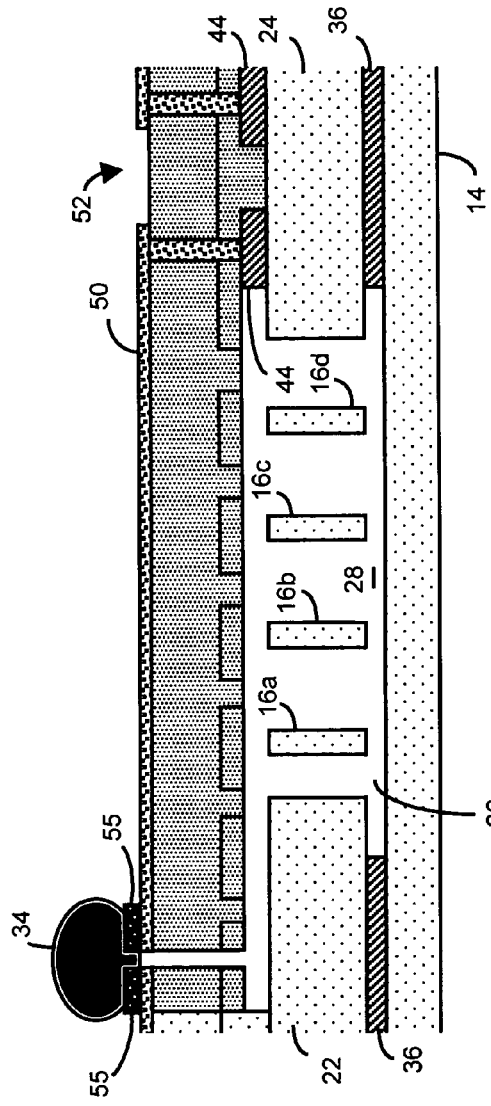
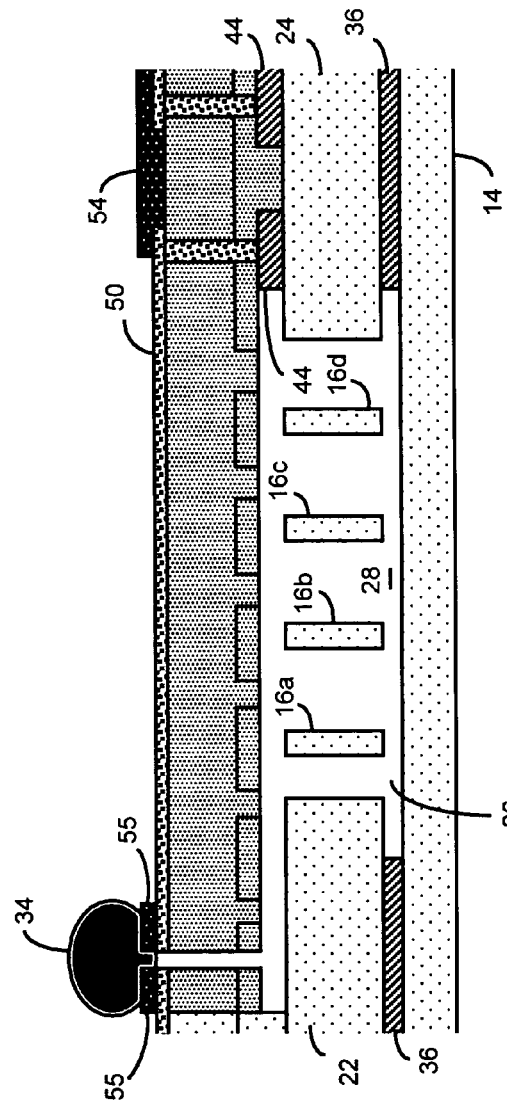
FIGURE 16E
FIGURE 16F

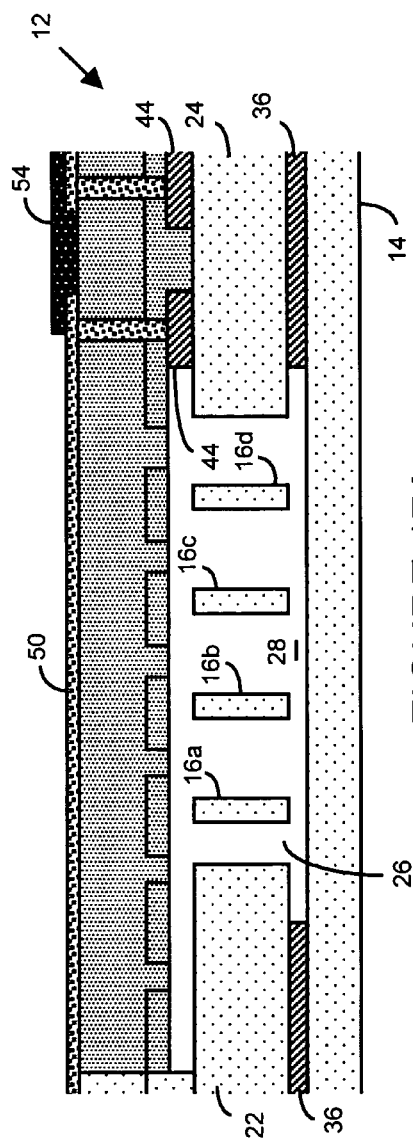
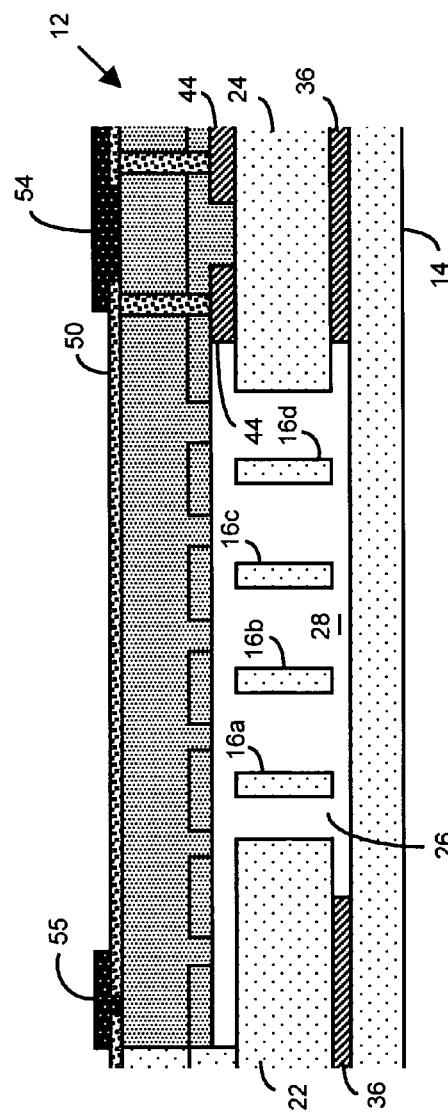
FIGURE 17A
FIGURE 17B

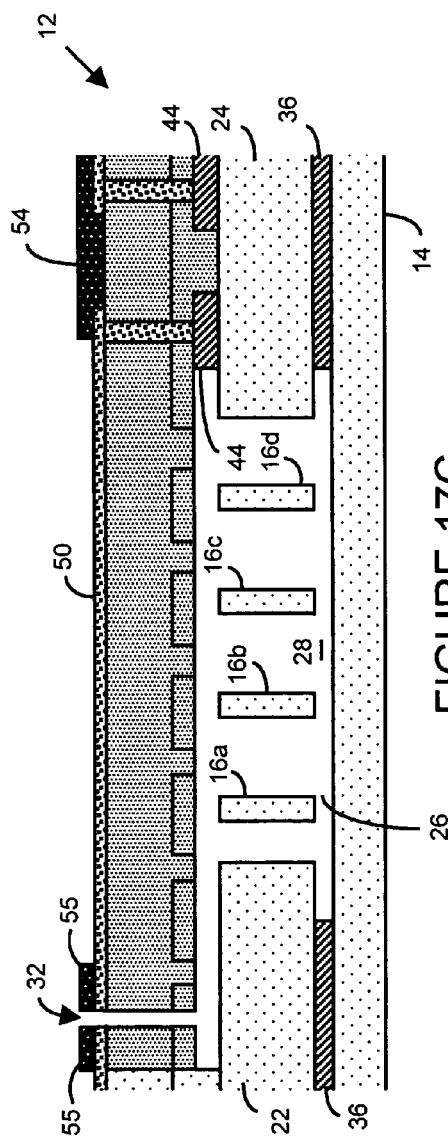
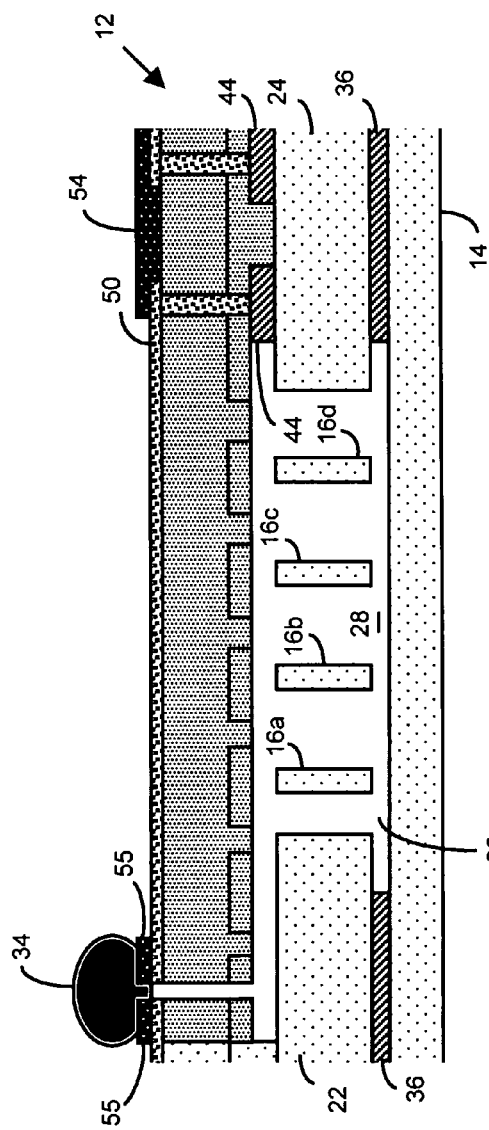
FIGURE 17C
FIGURE 17D

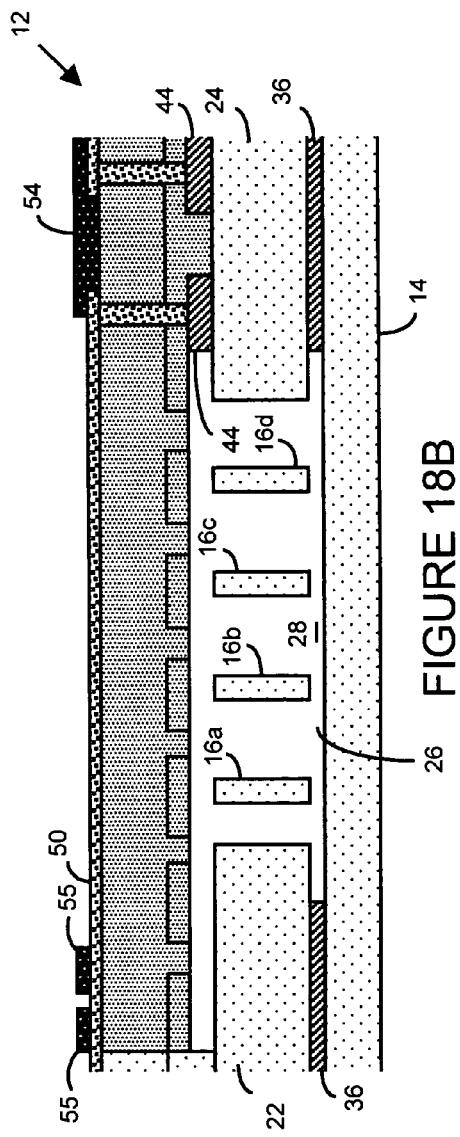
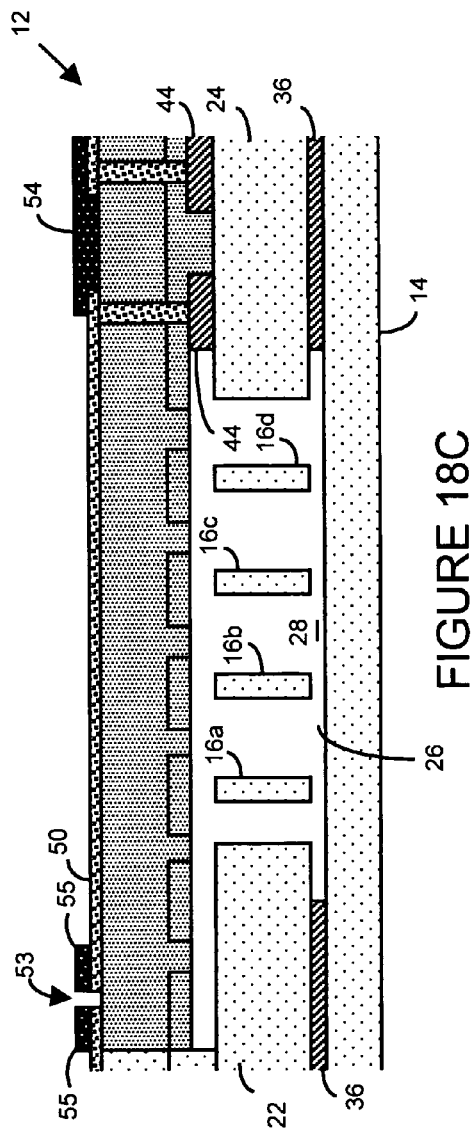

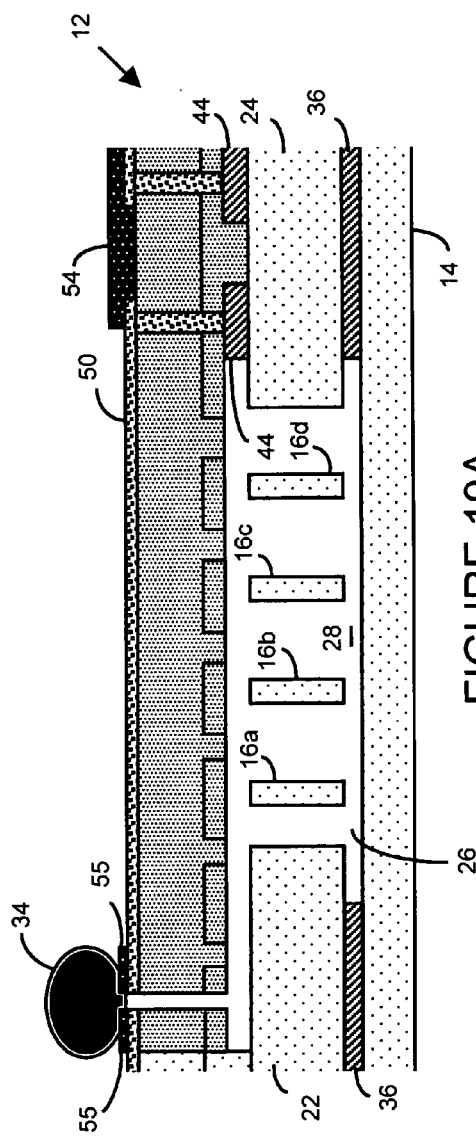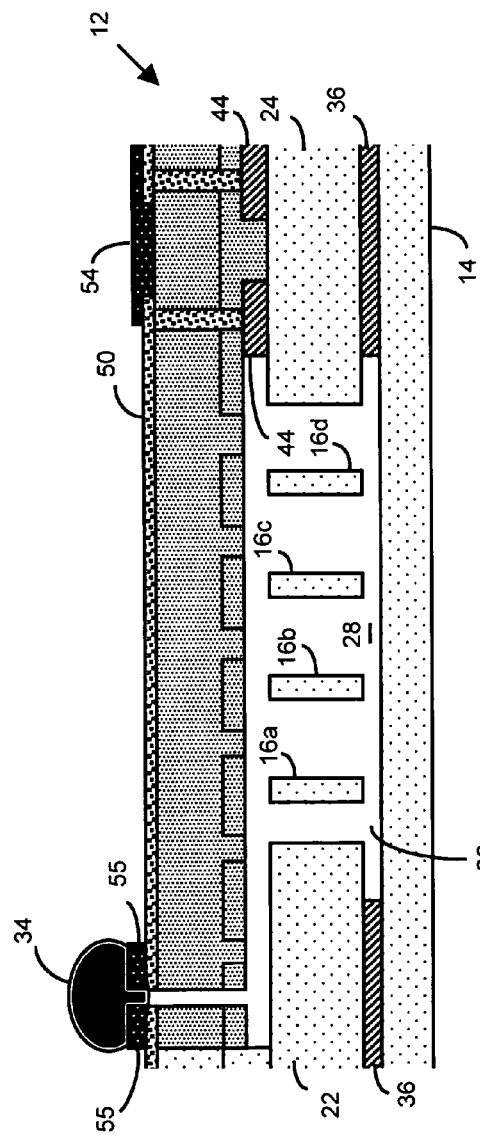

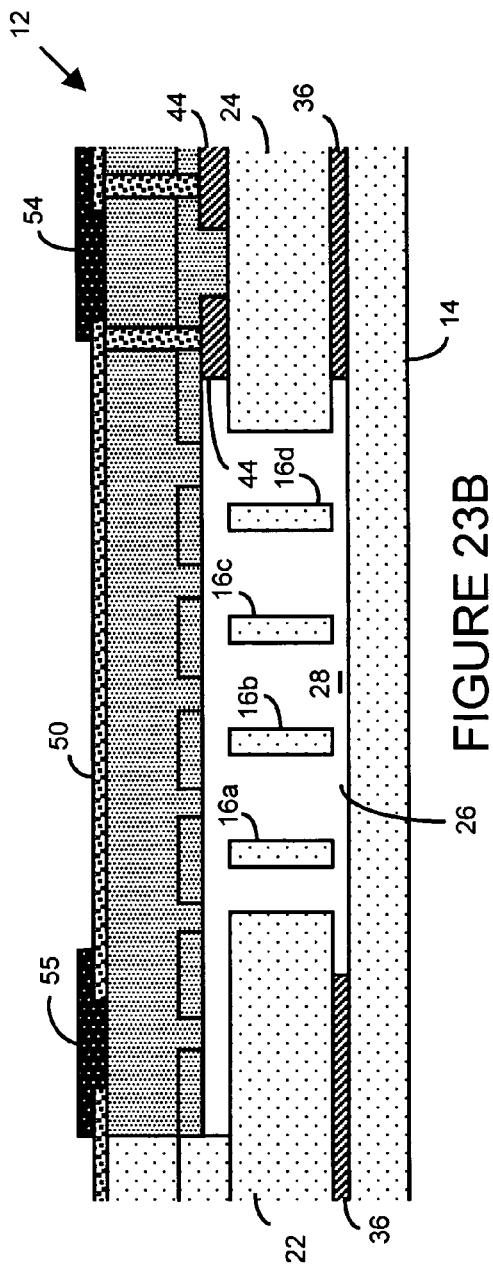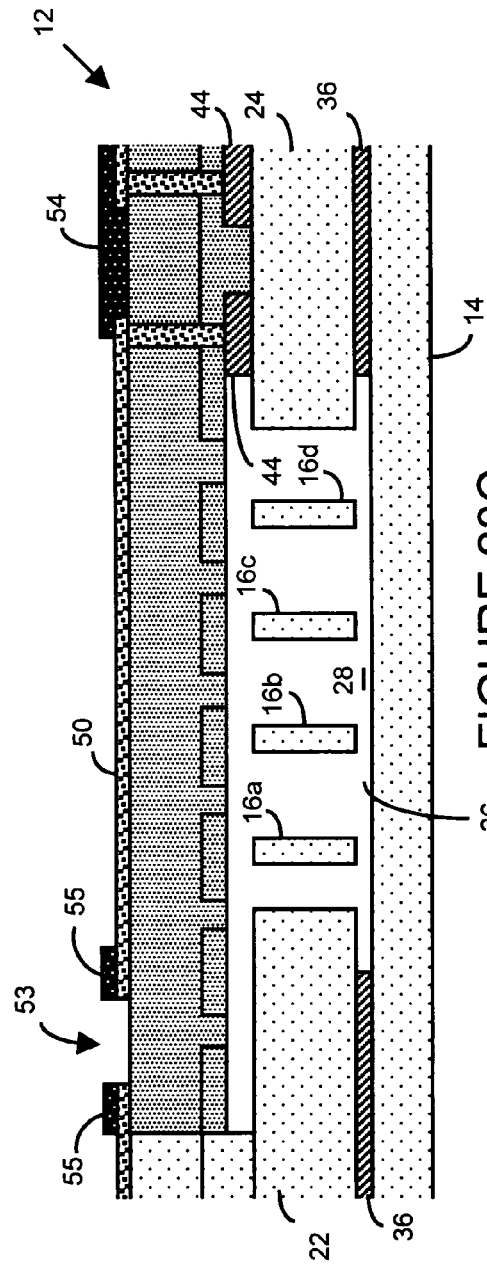

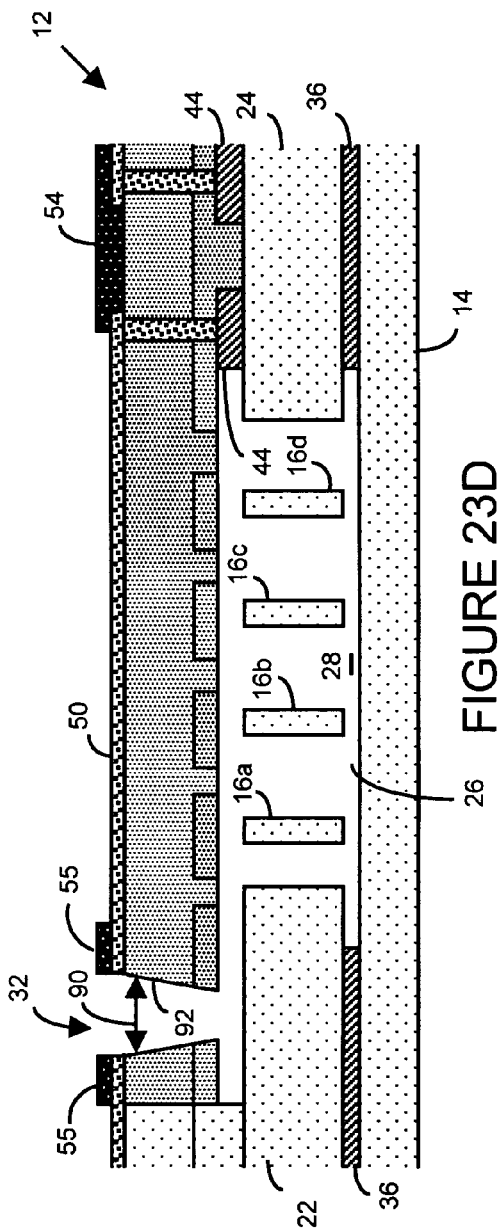
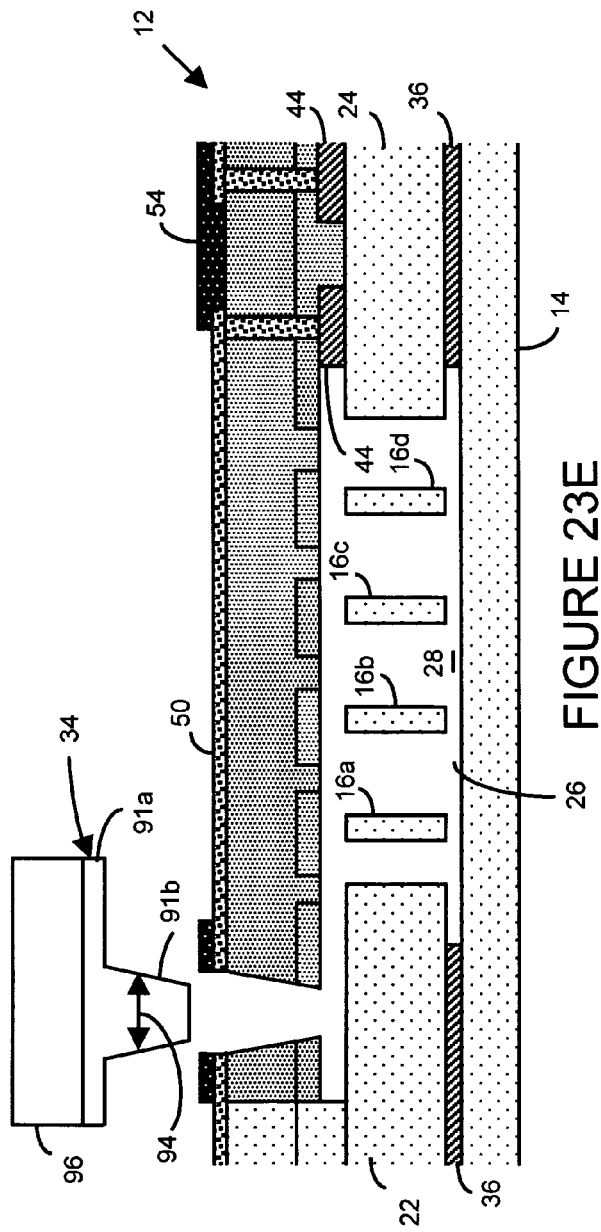

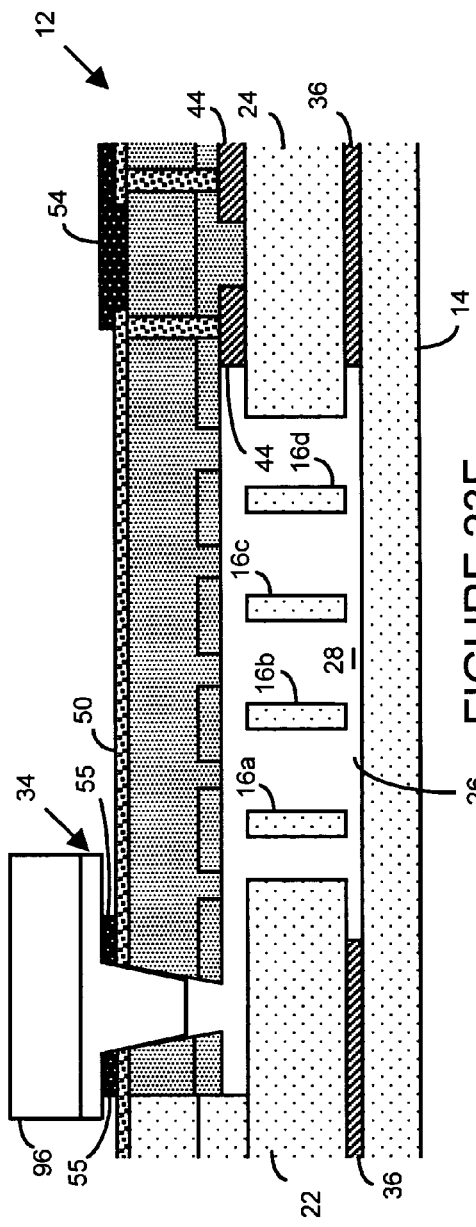
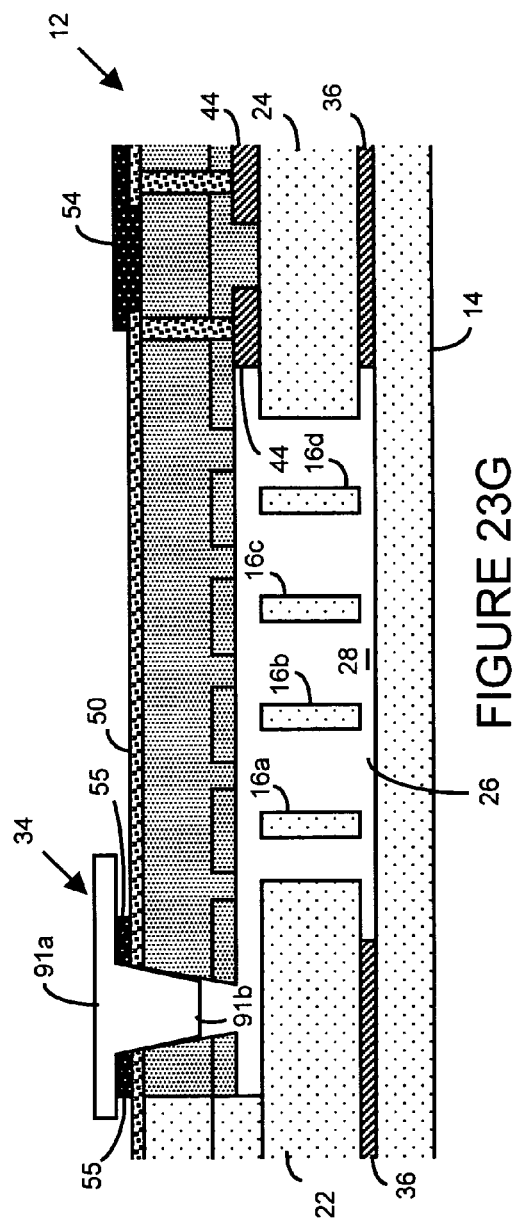
FIGURE 23F
FIGURE 23G

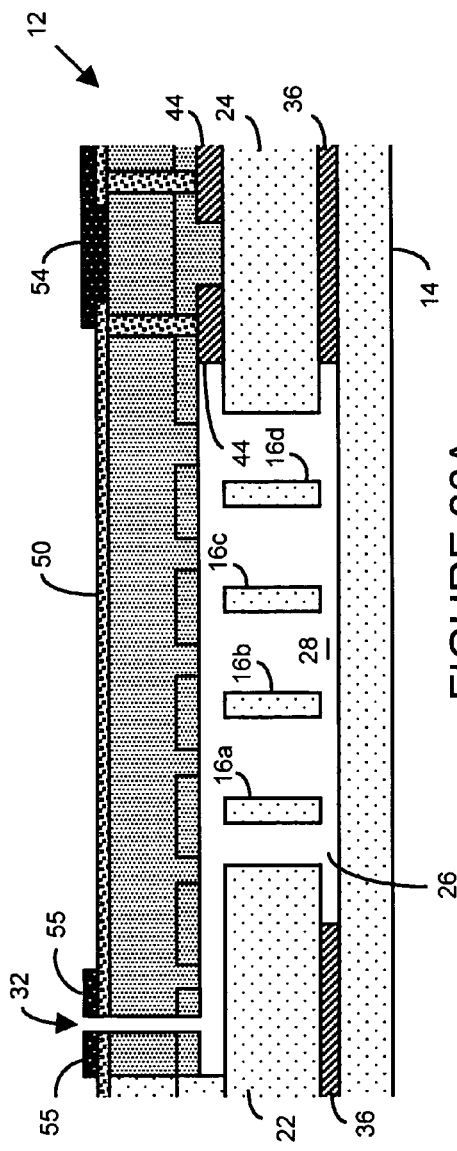
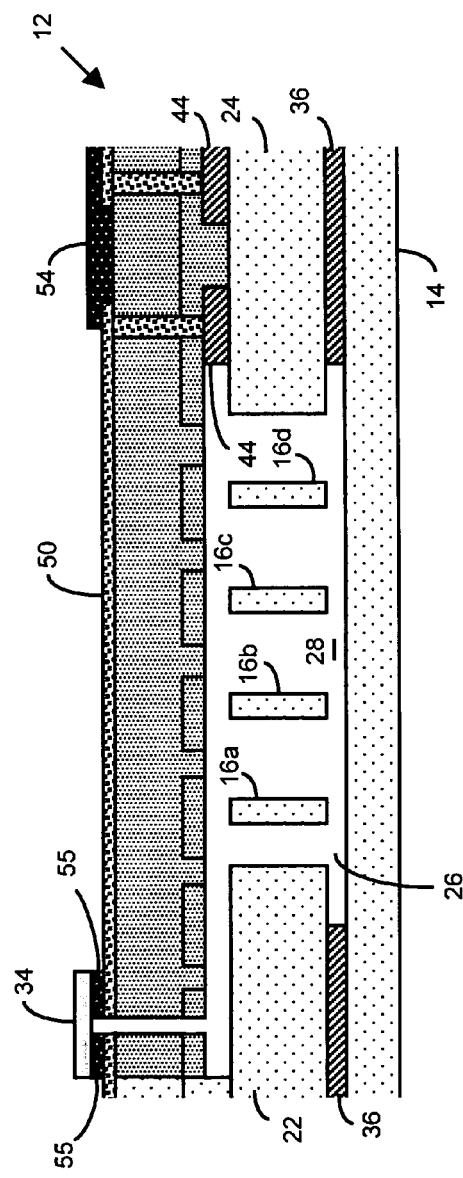
FIGURE 26A
FIGURE 26B

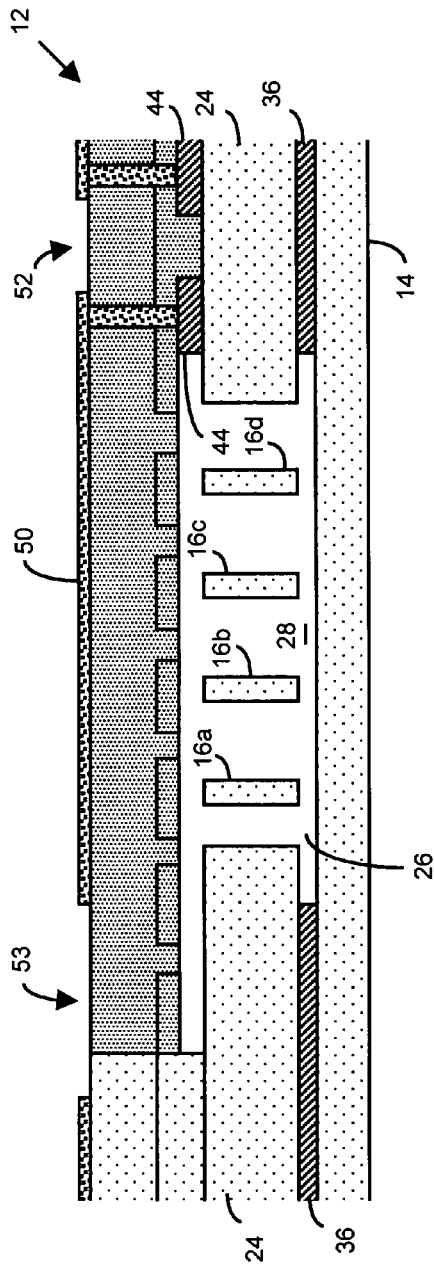
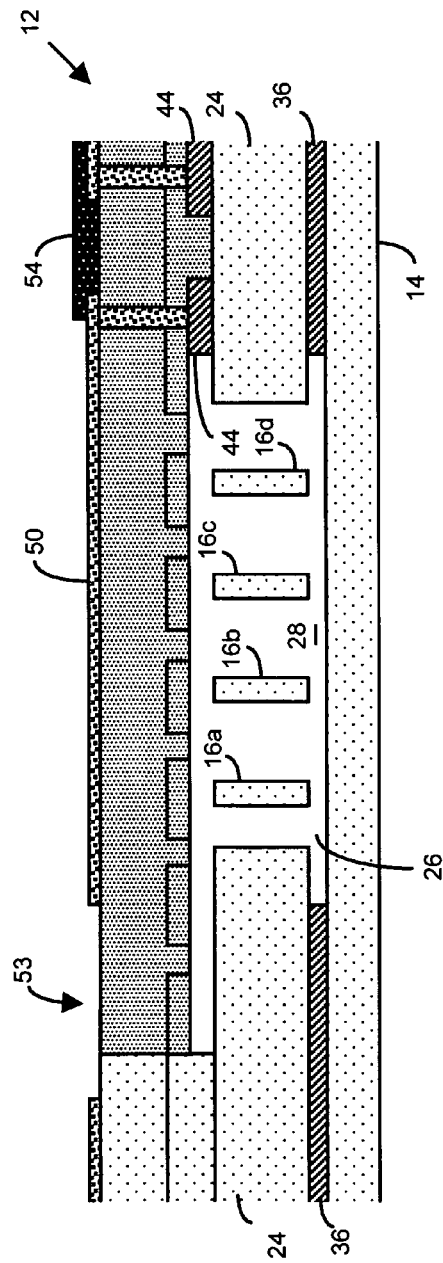
FIGURE 28A
FIGURE 28B

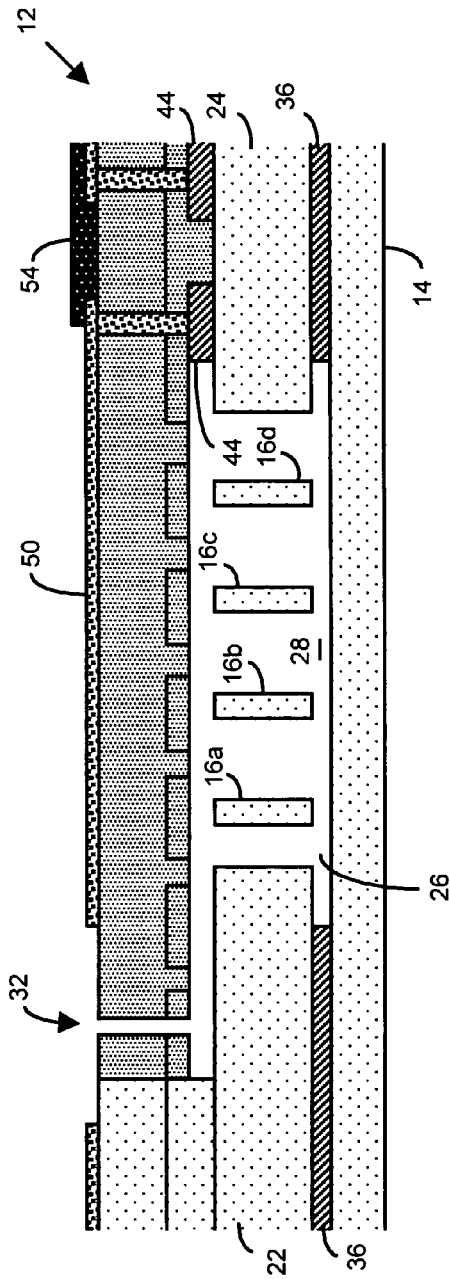
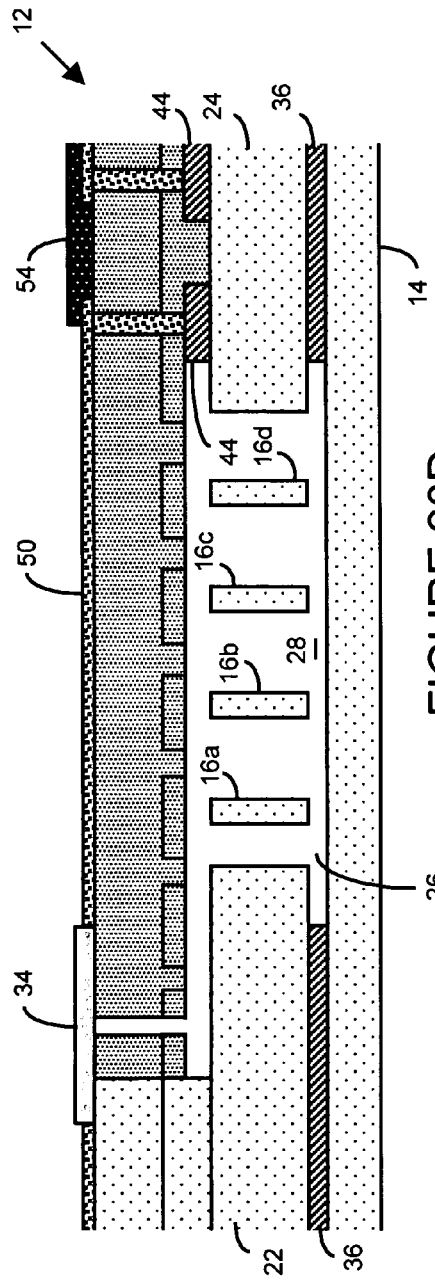
FIGURE 28C
FIGURE 28D

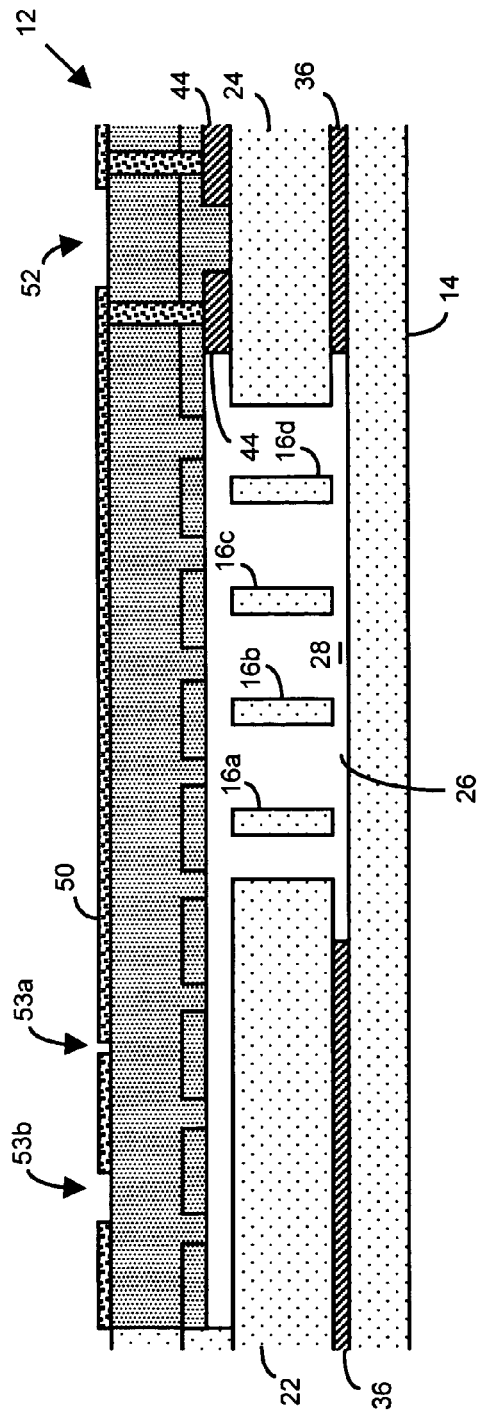
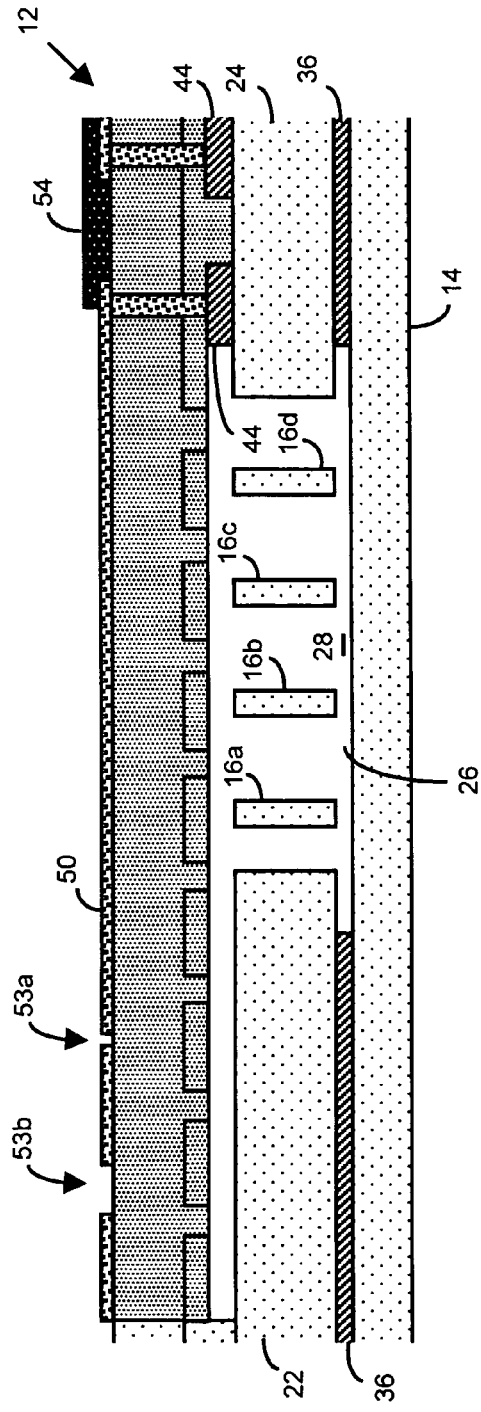
FIGURE 30A
FIGURE 30B

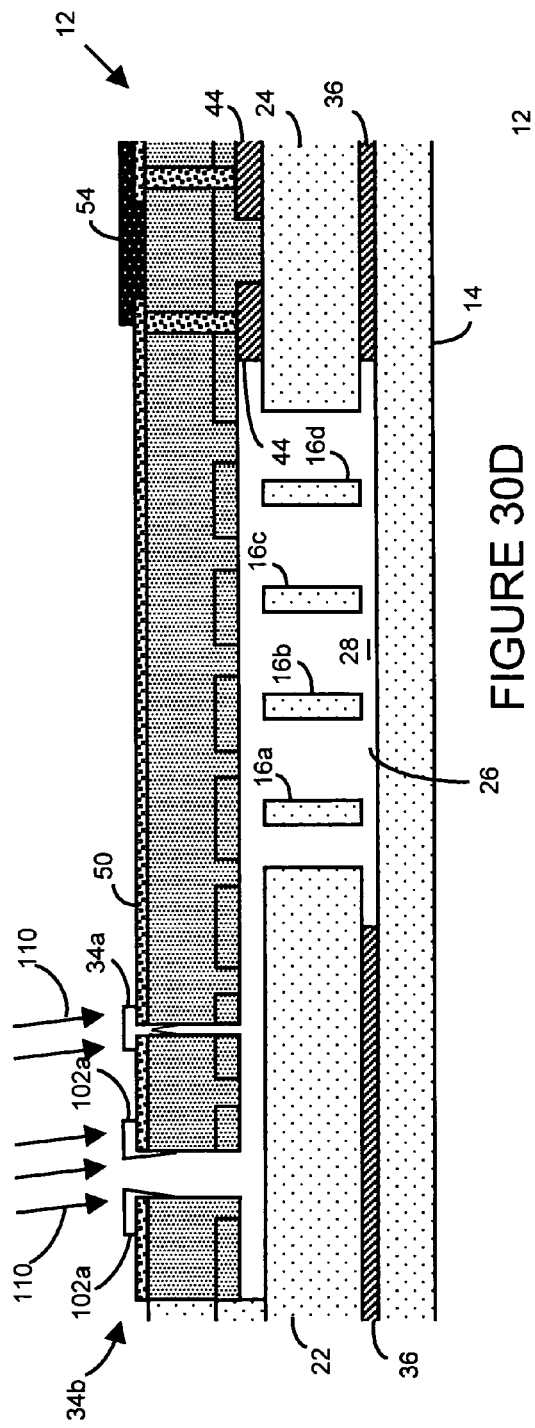
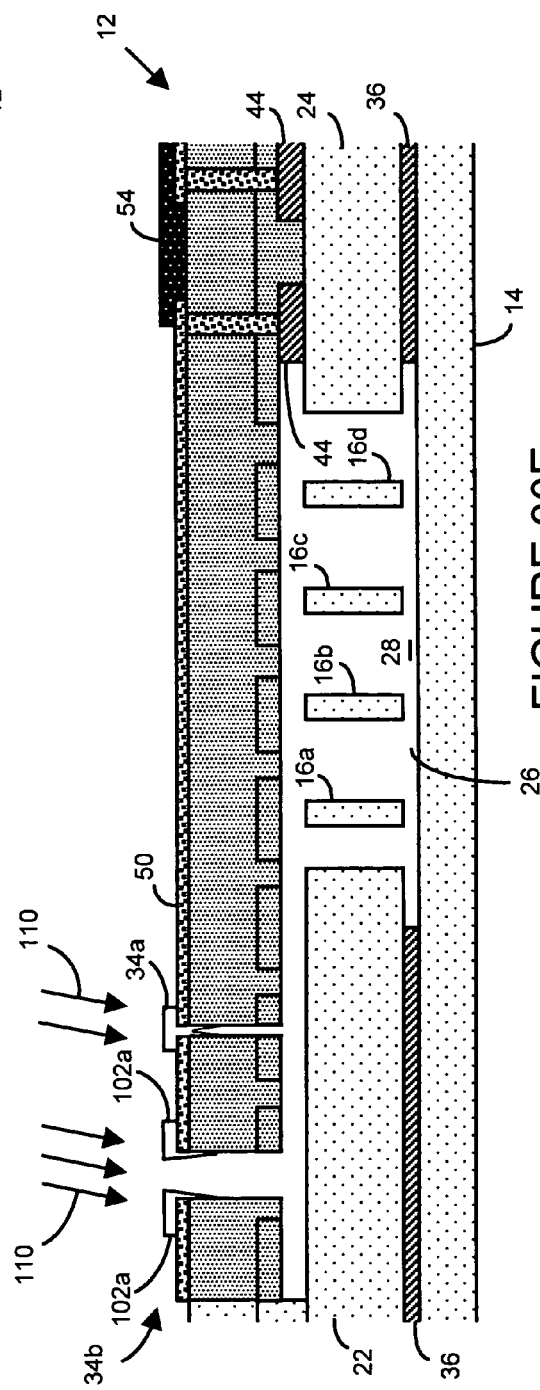
FIGURE 30D
FIGURE 30E

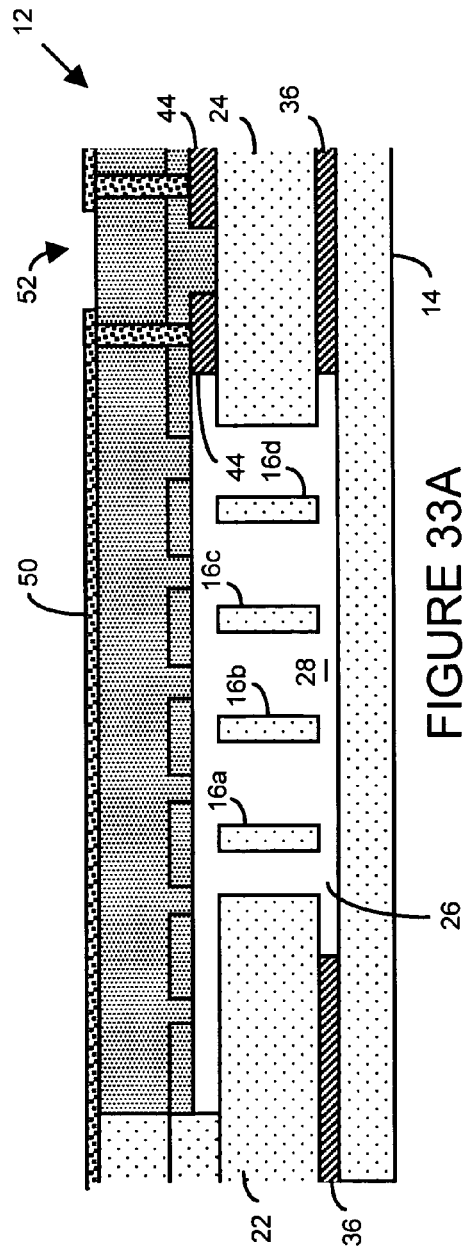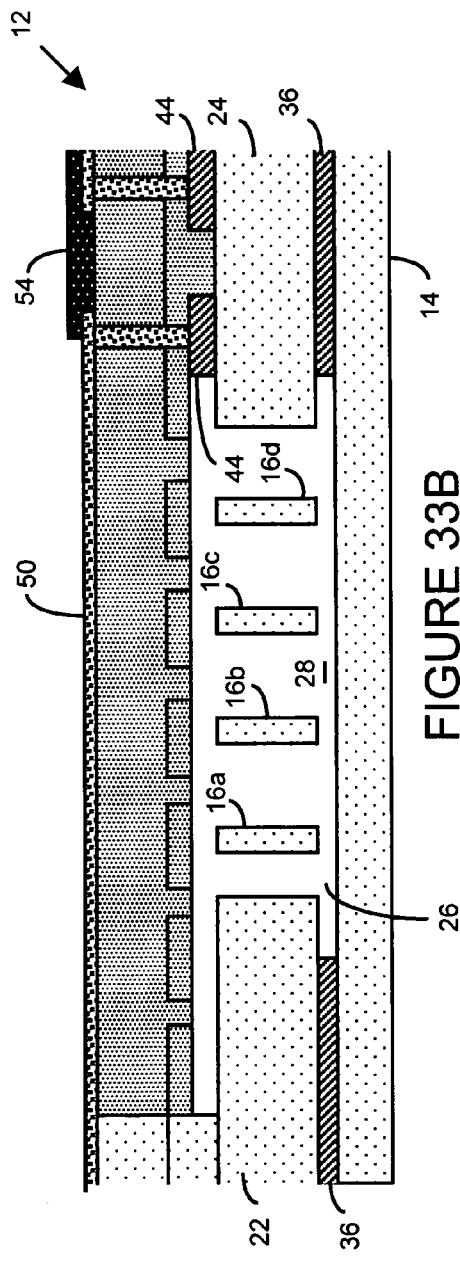
FIGURE 33A
FIGURE 33B

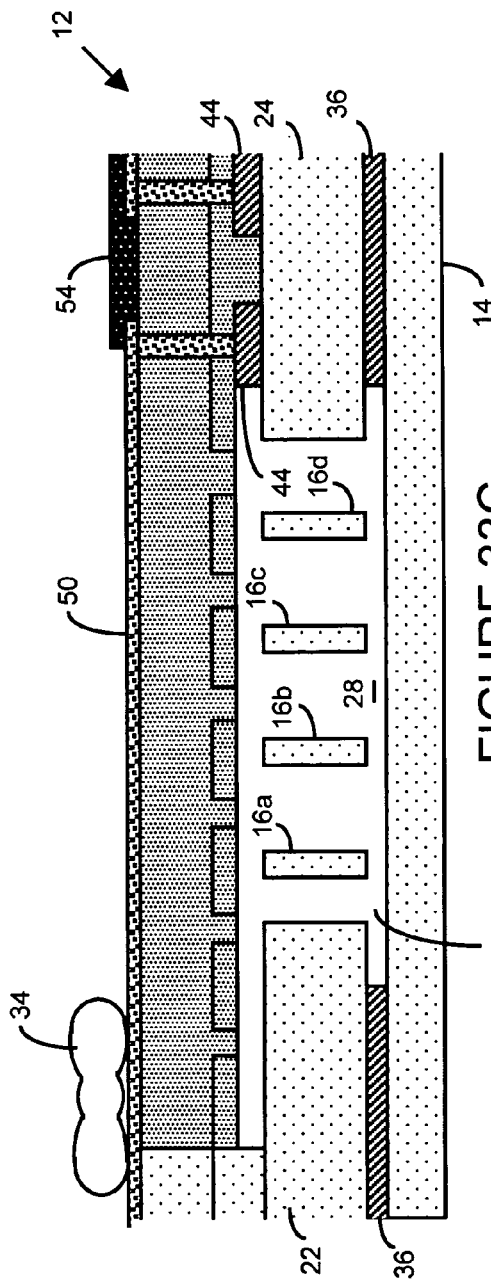
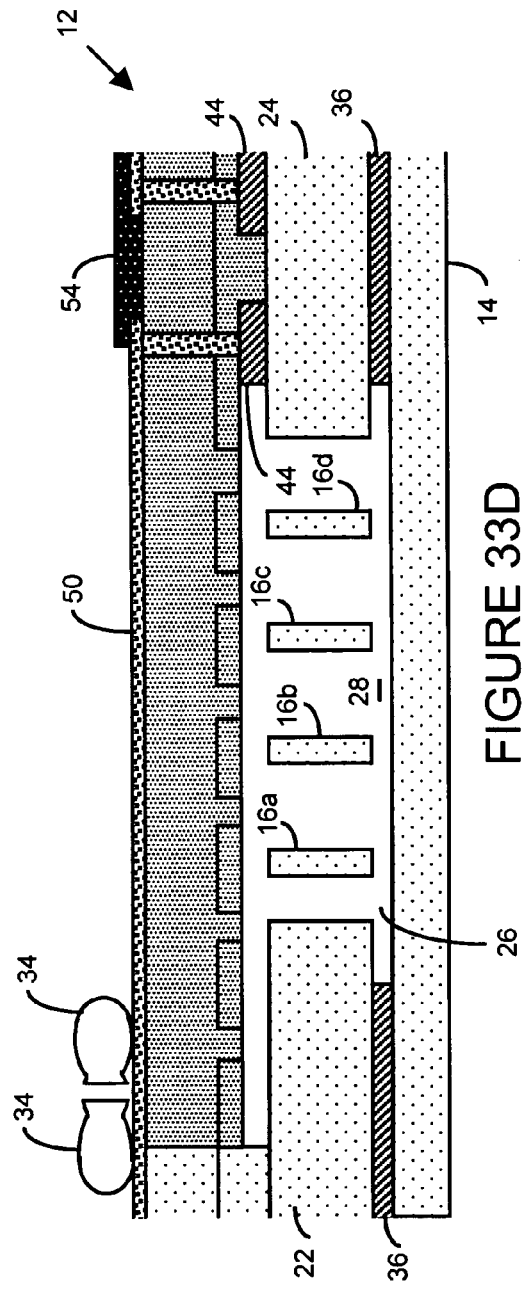

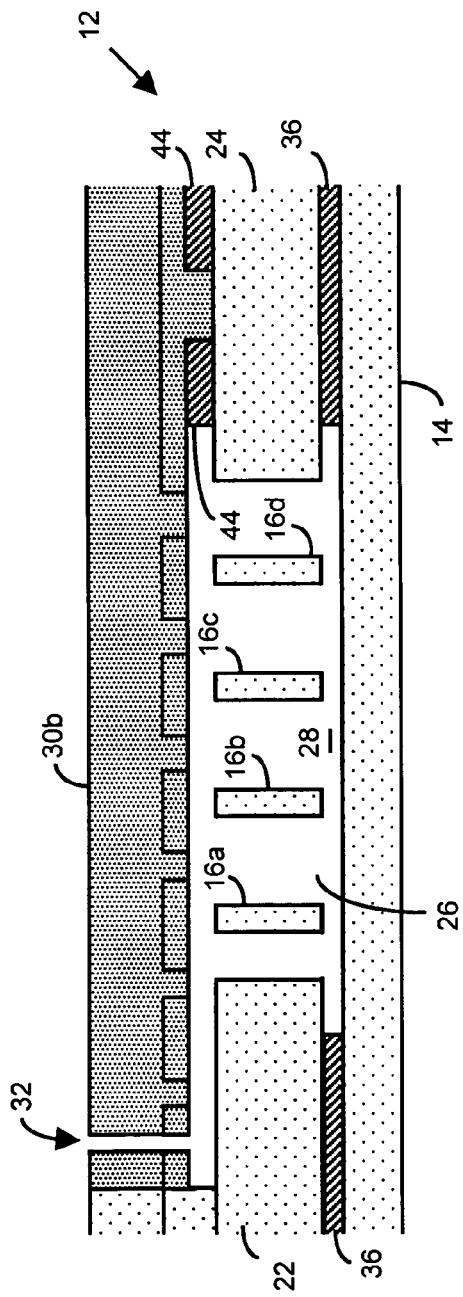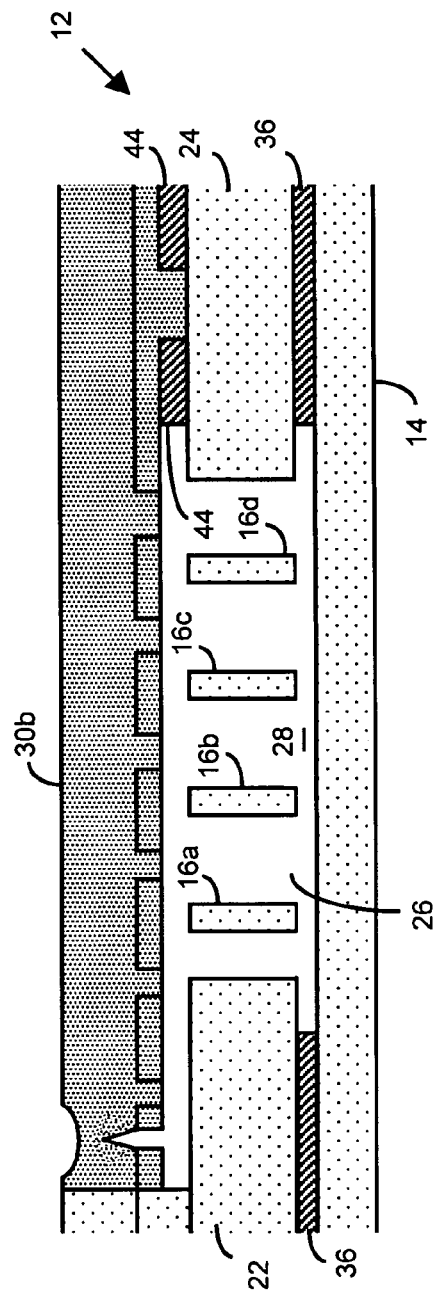
FIGURE 35A
FIGURE 35B

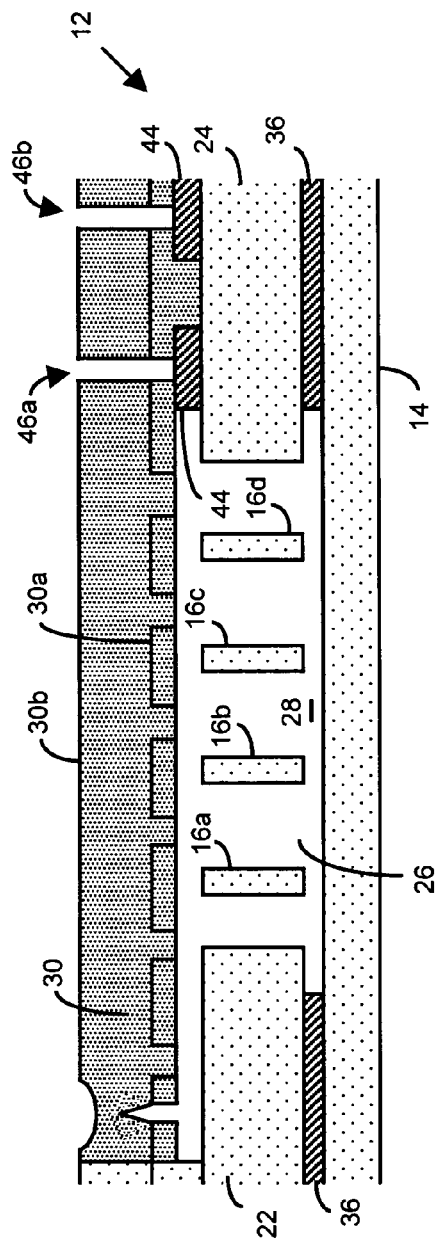
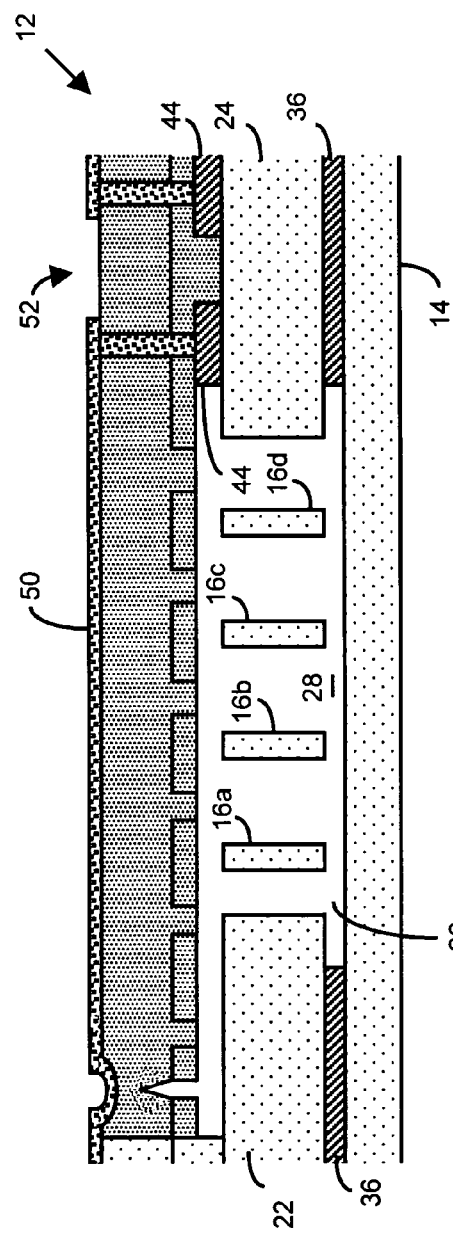
FIGURE 35C
FIGURE 35D

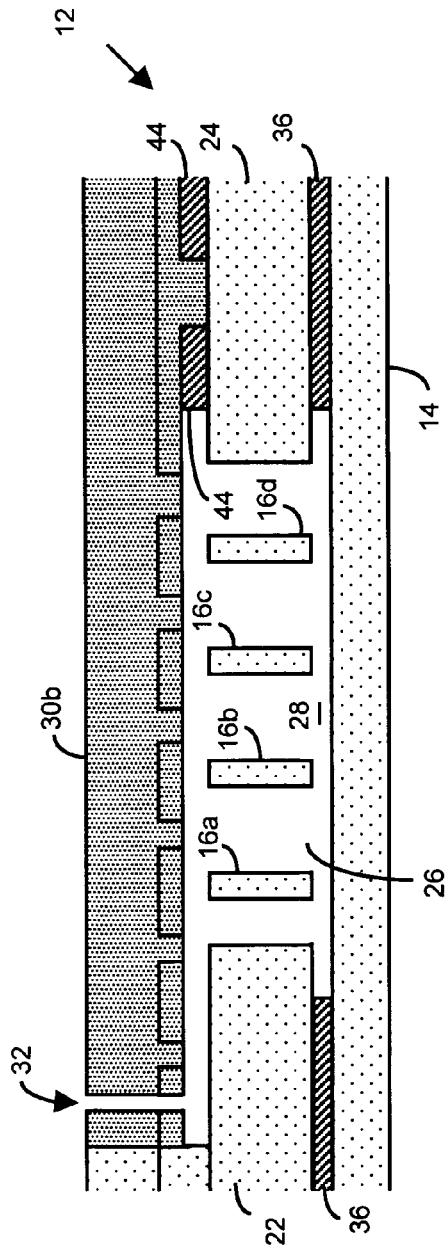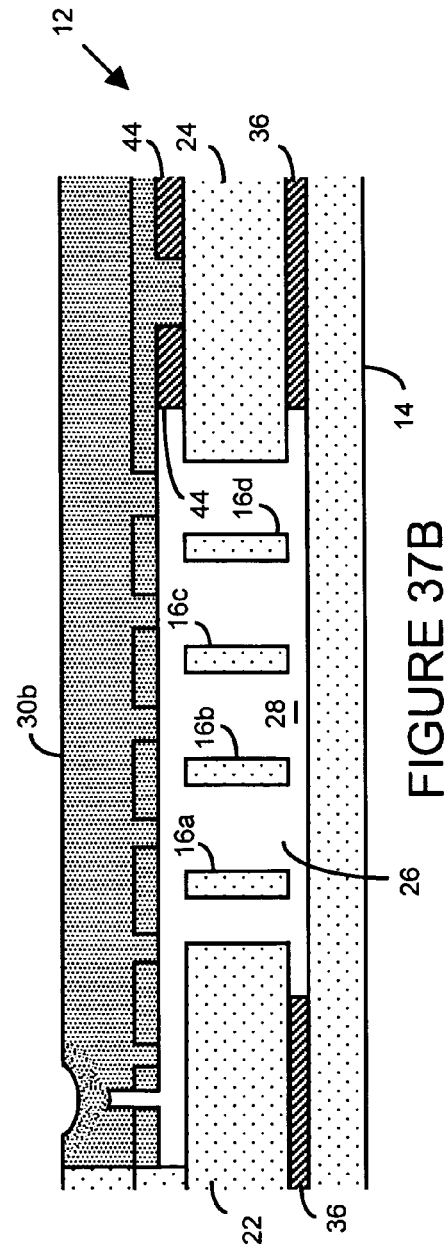

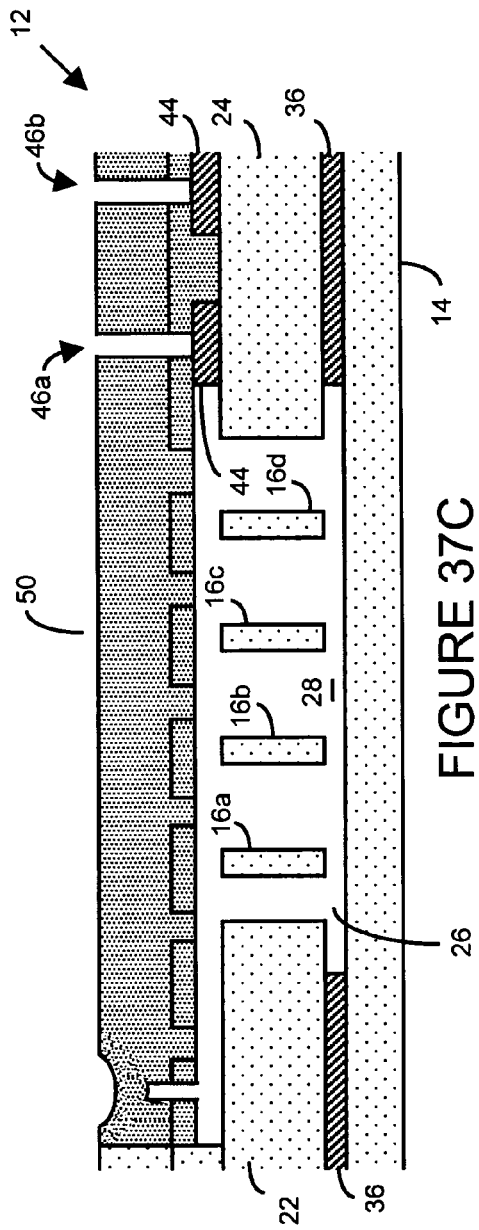
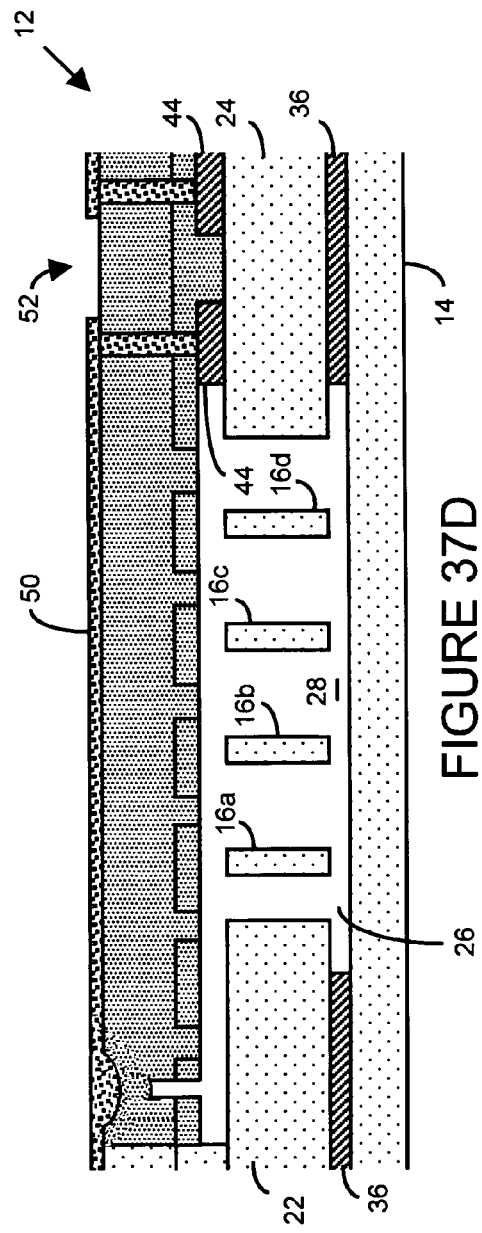

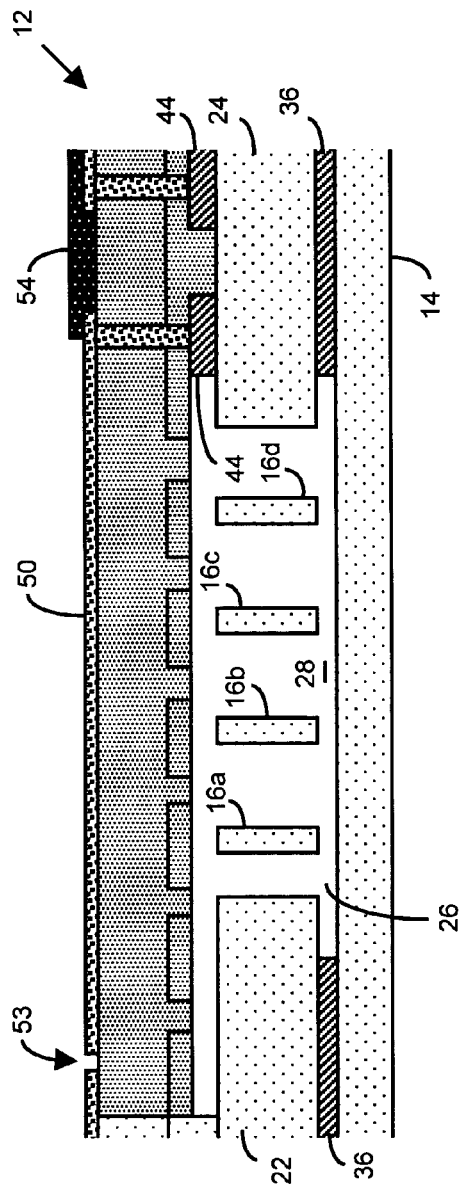
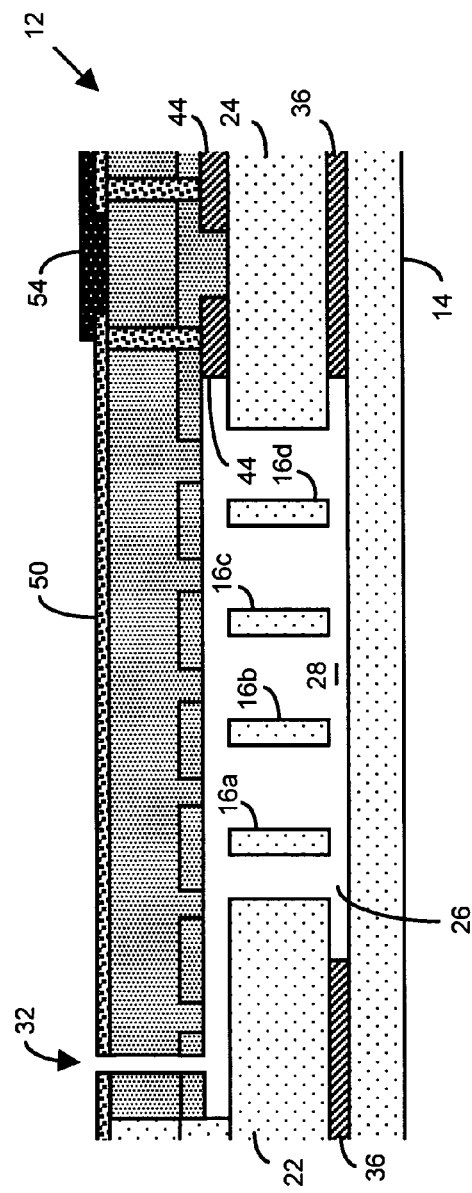
FIGURE 39A
FIGURE 39B

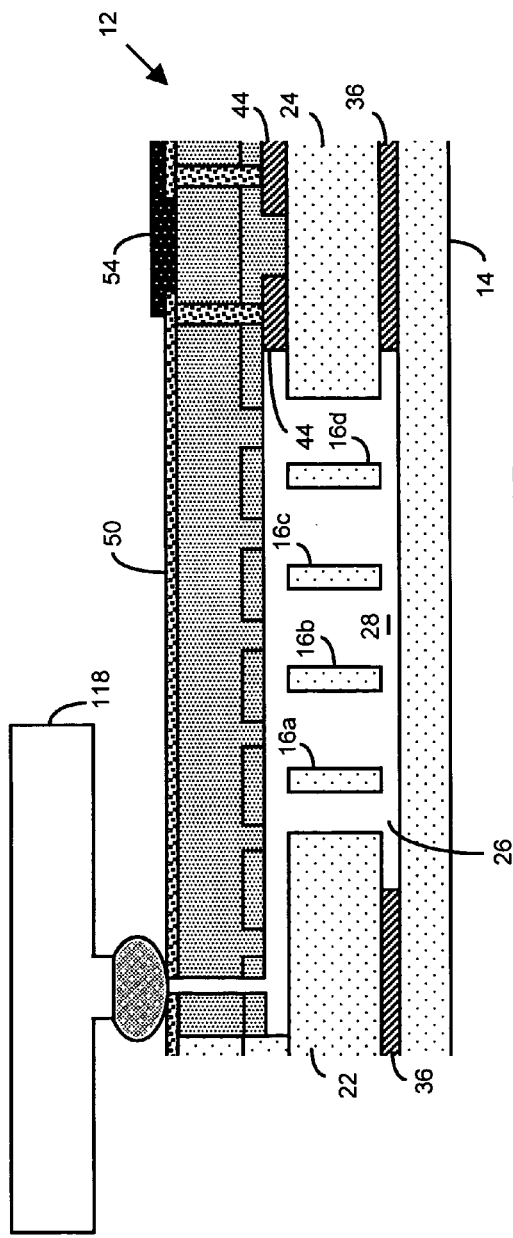
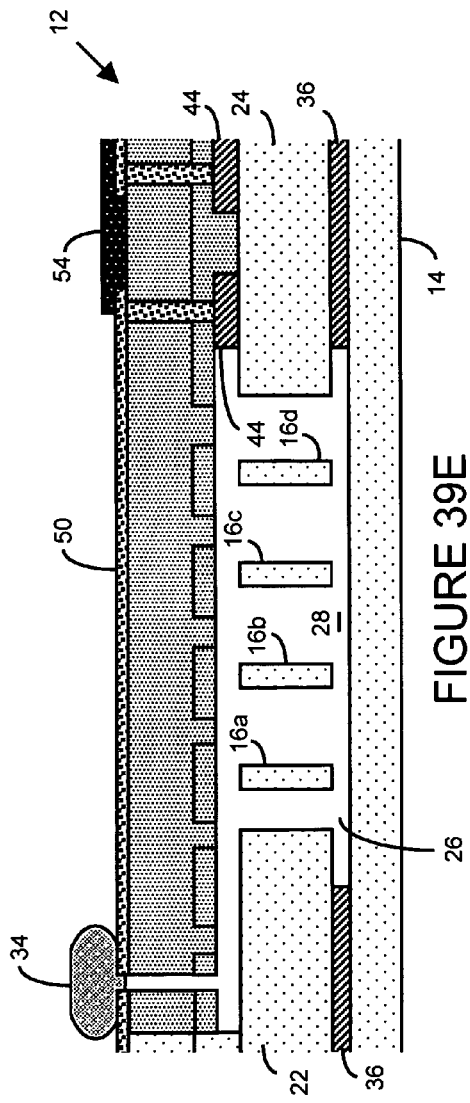
FIGURE 39D
FIGURE 39E

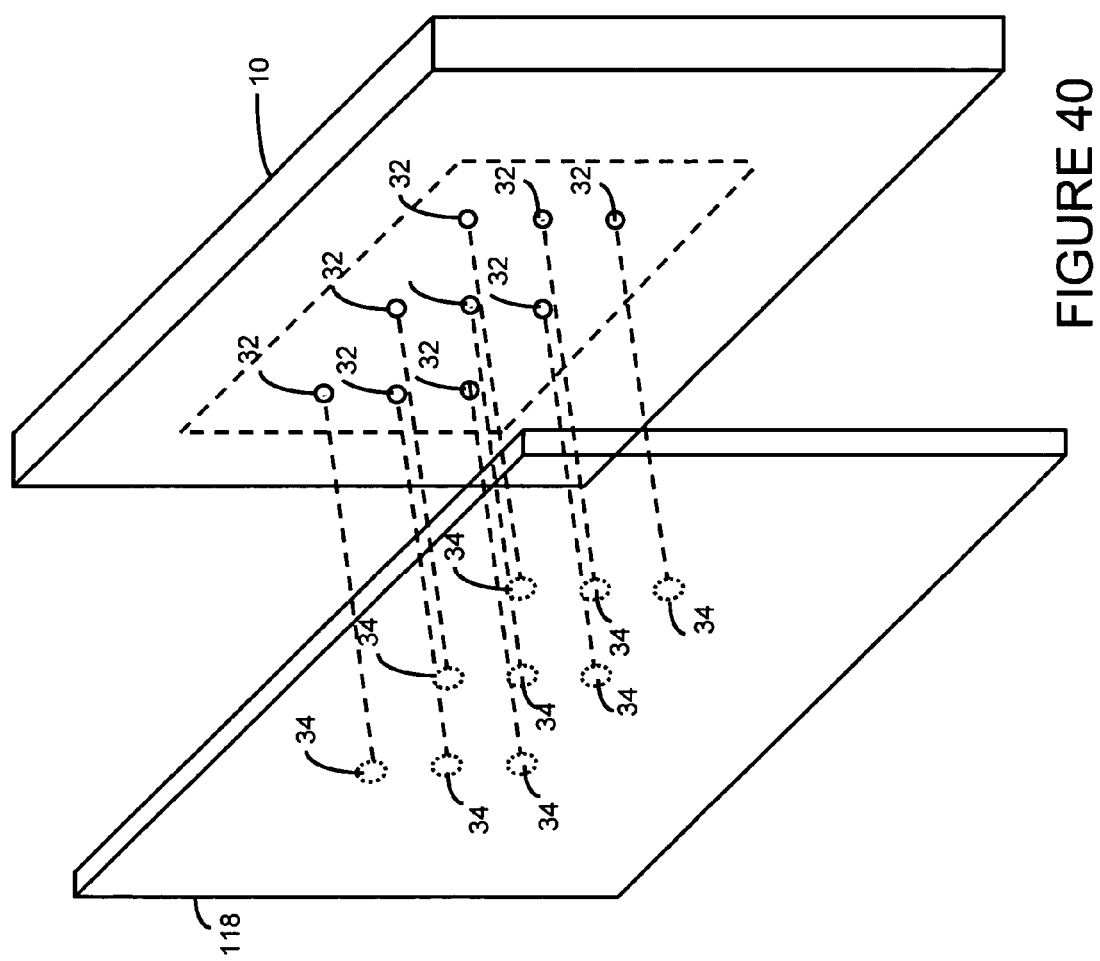

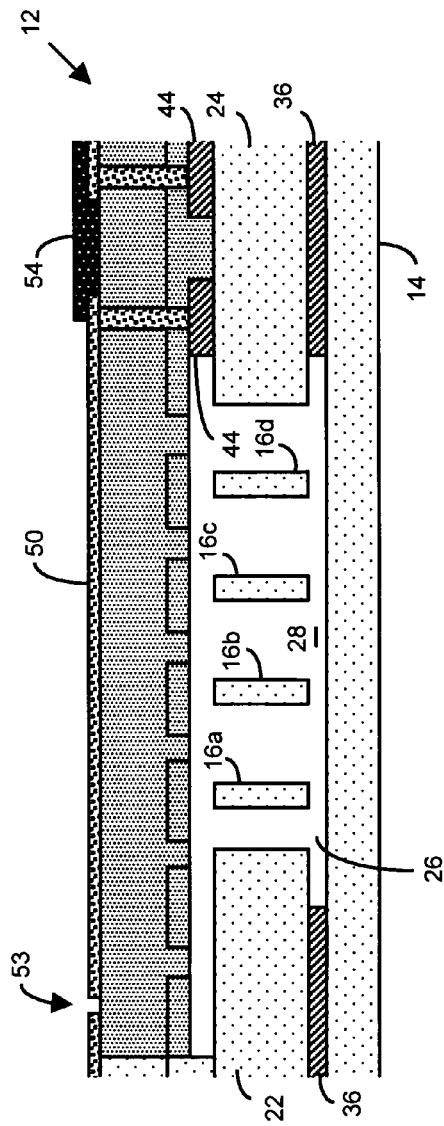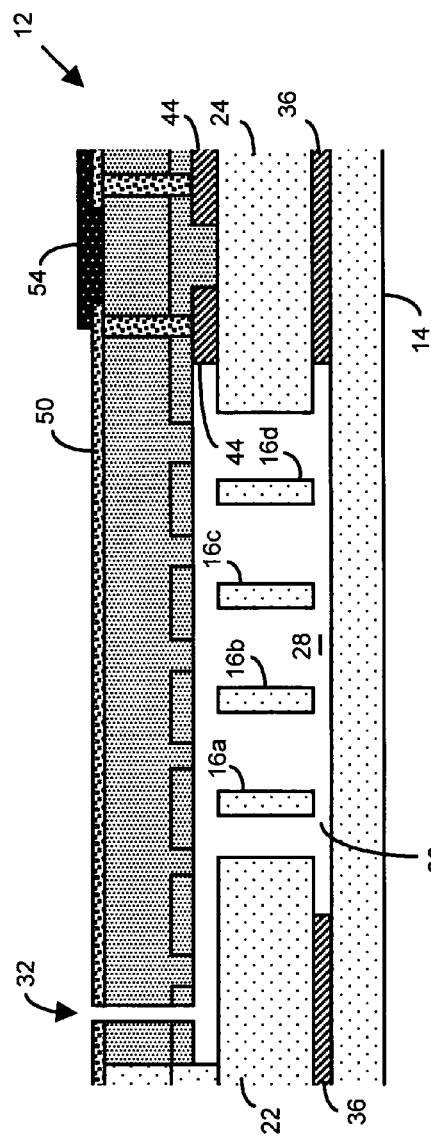
FIGURE 42A
FIGURE 42B

ANTI-STICTION TECHNIQUE FOR ELECTROMECHANICAL SYSTEMS AND ELECTROMECHANICAL DEVICE EMPLOYING SAME

This invention relates to electromechanical systems and techniques for fabricating microelectromechanical and/or nanoelectromechanical systems; and more particularly, in one aspect, to fabricating or manufacturing microelectromechanical and nanoelectromechanical systems having mechanical structures that are encapsulated using thin film or wafer bonding encapsulation techniques, and including suitable anti-stiction characteristics.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics. MEMS typically include a mechanical structure fabricated from or on, for example, a silicon substrate using micromachining techniques.

MEMS often operate through the movement of certain elements or electrodes, relative to fixed or stationary electrodes, of the mechanical structures. This movement tends to result in a change in gap distances between moving electrodes and stationary or fixed electrodes (for example, the gap between opposing electrodes). (See, for example, U.S. Pat. Nos. 6,240,782, 6,450,029, 6,500,348, 6,577,040, 6,624,726, and U.S. Patent Applications 2003/0089394, 2003/0160539, and 2003/0173864). For example, the MEMS may be based on the position of a deflectable or moveable electrode of a mechanical structure relative to a stationary electrode.

The mechanical structures are typically sealed in a chamber. The delicate mechanical structure may be sealed in, for example, a hermetically sealed metal container (for example, a TO-8 "can", see, for example, U.S. Pat. No. 6,307,815), bonded to a semiconductor or glass-like substrate having a chamber to house, accommodate or cover the mechanical structure (see, for example, U.S. Pat. Nos. 6,146,917; 6,352, 935; 6,477,901; and 6,507,082), or encapsulated by a thin film using micromachining techniques during, for example, wafer level packaging of the mechanical structures. (See, for example, International Published Patent Applications Nos. WO 01/77008 A1 and WO 01/77009 A1).

In the context of the hermetically sealed metal container, the substrate on, or in which the mechanical structure resides may be disposed in and affixed to the metal container. The hermetically sealed metal container also serves as a primary package as well.

In the context of the semiconductor or glass-like substrate packaging technique, the substrate of the mechanical structure may be bonded to another substrate whereby the bonded substrates form a chamber within which the mechanical structure resides. In this way, the operating environment of the mechanical structure may be controlled and the structure itself protected from, for example, inadvertent contact. The two bonded substrates may or may not be the primary package for the MEMS as well.

Thin film wafer level packaging employs micromachining techniques to encapsulate the mechanical structure in a chamber using, for example, a conventional oxide ($SiO_2$) deposited or formed using conventional techniques (i.e., oxidation using low temperature techniques (LTO), tetraethoxysilane (TEOS) or the like). (See, for example, WO 01/77008 A1, FIGS. 2-4). When implementing this technique, the mechanical structure is encapsulated prior to packaging and/or integration with integrated circuitry.

Under certain conditions, for example, during operation, the deflectable or moveable electrode may contact the stationary or fixed electrode and the electrodes may become stuck. This may be the result of, for example, rapid, sudden and/or violent acceleration of the MEMS. When electrodes of a mechanical structure become stuck, it is generally known as stiction. Stiction is common in MEMS and may be caused by, for example, van der Waals force, cold welding, arcing, molecular or atomic bonding, surface tension of, for example, liquids formed on the contacting parts, and/or electrostatic forces due to surface charge. Stiction typically renders the MEMS inoperative.

There are many different and diverse techniques/approaches to address, minimize, overcome and/or avoid the debilitating affects of stiction. (See, for example, U.S. Pat. Nos. 6,621,392, 6,625,047 and 6,625,342 and U.S. Patent Application Nos. 2003/0155643 and 2003/0178635). One approach is to apply a lubricant or passivation layer, for example, perfluorodecanoic acid ("PFDA") on the mechanical structure, including the moveable and fixed electrodes. In this regard, PFDA may be deposited in a monolayer, typically through a vapor deposition, and forms an extremely low energy surface. (See, for example, U.S. Patent Application No. 2003/0161949). This approach is quite common in substrate packaging technique.

In wafer level packaging of mechanical structures, however, the thin encapsulation film is often deposited at high temperatures. In addition, additional or further processing, for example, MEMS integration with electronic circuitry often requires use of high temperature processes (for example, during the formation or fabrication of the integrated circuits). Conventional lubricants or passivation layers are susceptible to destruction when subjected to those temperatures required for fabricating the thin film encapsulation or integrated circuits. Thus, after encapsulation, the mechanical structures are more prone to stiction as a consequence of the post-mechanical structure processing.

There is a need for, among other things, a MEMS employing an anti-stiction technique that is compatible with thin film encapsulation and/or wafer bonding techniques and overcomes one, some or all of the shortcomings of the conventional anti-stiction techniques. There is a need for, among other things, a MEMS having mechanical structure that is encapsulated using thin film encapsulation and/or wafer bonding techniques, that possesses suitable anti-stiction techniques and overcomes the cost, design, operation and/or manufacturing shortcomings of conventional anti-stiction techniques. There is a need for a MEMS having low adhesion energy mechanical structures that are encapsulated using wafer level thin film and/or wafer bonding encapsulation techniques.

SUMMARY OF THE INVENTION

There are many inventions described and illustrated herein. In a first aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and providing a channel cap having at least one preform portion disposed over or in at least a portion of the anti-stiction channel to seal the anti-stiction channel, at least in part.

In a second aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and providing a channel cap having at least one portion disposed over or in at least a portion of the anti-stiction channel to seal the anti-stiction channel, at least in part. The at least one portion is fabricated apart from the electromechanical device and thereafter affixed to the electromechanical device.

In a third aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and providing a channel cap having at least one portion disposed over or in at least a portion of the anti-stiction channel to seal the anti-stiction channel, at least in part, wherein the at least one portion comprises a wire ball, a stud, metal foil or a solder preform.

In a fourth aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and depositing a preform on the electromechanical device and reflowing at least a portion of the preform to seal the anti-stiction channel, at least in part. The at least one portion may comprise a wire ball, a stud, metal foil or a solder preform.

In a fifth aspect, the present invention is an electromechanical device that includes a substrate, an encapsulation structure and a mechanical structure. The mechanical structure is disposed in a chamber, at least a portion of which is defined by the encapsulation structure. An anti-stiction layer is disposed on at least a portion of the mechanical structure. An anti-stiction channel is formed in at least one of the substrate and the encapsulation structure, the anti-stiction channel being in fluid communication with the chamber. A cap has at least one preform portion disposed over or in at least a portion of the anti-stiction channel to seal the anti-stiction channel, at least in part.

In a sixth aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and providing a channel cap having at least one portion evaporated or sputtered from a plurality of angles, to seal the anti-stiction channel, at least in part. In one embodiment, an evaporation and/or sputtering source is employed. The source and the device may be positioned relative to one another and one or both may be rotated relative to the other.

In a seventh aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming a plurality of anti-stiction channels through at least one of the substrate and the encapsulation structure, introducing an anti-stiction fluid into the chamber via at least one of the anti-stiction channels, and providing a plurality of channel caps to seal the anti-stiction channels, at least in part, wherein the plurality of anti-stiction channels have different configurations and/or the plurality of channel caps have different configurations. In one embodiment, a first one of the anti-stiction channels has a width and/or diameter that is greater than a width and/or diameter of a second one of the anti-stiction channels. In one embodiment, each of the channel caps has at least one portion that is evaporated or sputtered. One or more of the channel caps also has one or more portions that is not evaporated or sputtered.

In an eighth aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming a plurality of anti-stiction channels through at least one of the substrate and the encapsulation structure, introducing an anti-stiction fluid into the chamber via at least one of the anti-stiction channels, providing a first channel cap to seal a first one of the anti-stiction channels, and thereafter controlling or adjusting a characteristic of the environment within the chamber via a second one of the anti-stiction channels. In one embodiment, a second channel cap is provided to seal the second anti-stiction channel. The second channel cap may include at least one portion formed during or after the controlling or adjusting of the environment.

In a ninth aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and reflowing at least one portion of the electromechanical device to seal the anti-stiction channel, at least in part. Heat may be employed in reflowing the at least one portion of the device. A laser may be used in providing such heat. Shadow mask(s) may also be used. In one embodiment, a portion of the encapsulation structure is reflowed to seal the anti-stiction channel, at least in part. In another embodiment, material or materials is deposited superjacent the encapsulation structure and one or more portions of such material(s) is reflowed to seal the anti-stiction channel, at least in part. The material(s) may be deposited before, during and/or after forming the anti-stiction channel. One or more portions of the material(s) may be employed as a mask for forming the anti-stiction channel. The material(s) may comprise a preform.

In a tenth aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and providing a channel cap having at least one portion stamped over or in at least a portion of the anti-stiction channel to seal the anti-stiction channel, at least in part.

In an eleventh aspect, the present invention is a method for use in association with an electromechanical device having a substrate, an encapsulation structure and a mechanical structure. The mechanical structure is disposed in a chamber, at least a portion of which is defined by the encapsulation structure. The method comprises forming at least one anti-stiction channel through at least one of the substrate and the encapsulation structure, introducing an anti-stiction fluid into the chamber via the anti-stiction channel, and providing a channel cap having at least one portion selectively deposited over or in at least a portion of the anti-stiction channel to seal the anti-stiction channel, at least in part. Radiation from one or more radiation sources may be used to define an area, or areas, where the at least one portion is to be selectively deposited. One or more masks may also be employed in defining such area(s). The at least one selectively deposited portion may comprise, for example, an oxide material.

In a twelfth aspect, the present invention is an electromechanical device formed using any of the methods disclosed herein, or combinations thereof.

Again, there are many inventions described and illustrated herein. This Summary of the Invention is not exhaustive of the scope of the present inventions. Moreover, this Summary of the Invention is not intended to be limiting of the invention and should not be interpreted in that manner. While certain embodiments have been described and/or outlined in this Summary of the Invention, it should be understood that the present invention is not limited to such embodiments, description and/or outline. Indeed, many others embodiments, which may be different from and/or similar to, the embodiments presented in this Summary, will be apparent from the description, illustrations and/or claims, which follow. In addition, although various features, attributes and advantages have been described in this Summary of the Invention and/or are apparent in light thereof, it should be understood that such features, attributes and advantages are not required whether in one, some or all of the embodiments of the present inventions and, indeed, need not be present in any of the embodiments of the present invention.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIG. 6A-6L illustrate cross-sectional views of the fabrication of the portion of MEMS of FIG. 5, including the anti-stiction plug or cap, at various stages of the process, according to certain aspects of the present invention;

FIGS. 7A and 7B illustrate cross-sectional view of the portion of MEMS of FIG. 5, in conjunction with material "captured" by the trap, in accordance with certain aspects of the present invention;

FIGS. 8A and 8B illustrate cross-sectional views of the fabrication of a microstructure and an anti-stiction plug or cap including a diffusion barrier, according to certain aspects of the present invention;

FIGS. 10A-10C and 11A-11C illustrate cross-sectional views (sectioned along dotted line a-a' of FIG. 1) of the portion of the interdigitated or comb-like finger electrode array, contact area of FIG. 1, in conjunction with the anti-stiction plug or cap, among other things, in accordance with certain aspects of the present invention;

FIGS. 16A-16F illustrate cross-sectional views of the fabrication of the portion of MEMS of FIG. 2, at various stages of the process, in accordance with another aspect of the present invention;

FIGS. 17A-17E illustrate cross-sectional views of the fabrication of the portion of MEMS of FIG. 2, at various stages of the process, in accordance with another aspect of the present invention;

FIGS. 18A-18C illustrate cross-sectional views of the fabrication of the portion of MEMS of FIG. 2, at various stages of the process, in accordance with another aspect of the present invention;

FIG. 19A illustrates a cross-sectional view of a portion of an interdigitated or comb-like finger electrode array, contact area and a trench isolated contact, in conjunction with an anti-stiction plug or cap, in accordance with certain aspects of the present invention;

FIG. 19B illustrates a cross-sectional view of a portion of an interdigitated or comb-like finger electrode array, contact area and a trench isolated contact, in conjunction with an anti-stiction plug or cap, in accordance with certain aspects of the present invention;

FIGS. 23A-23G illustrate cross-sectional views of the fabrication of the portion of MEMS of FIG. 22, including the anti-stiction plug or cap, at various stages of the process, according to certain aspects of the present invention;

FIGS. 26A-26B illustrate cross-sectional views of the fabrication of the portion of MEMS of FIG. 25, including the anti-stiction plug or cap, at various stages of the process, according to certain aspects of the present invention;

FIGS. 28A-28D illustrate cross-sectional views of the fabrication of the portion of MEMS of FIG. 27, including the anti-stiction plug or cap, at various stages of the process, according to certain aspects of the present invention;

FIGS. 30A-30F illustrate cross-sectional views of the fabrication of the portion of MEMS of FIG. 29, including the anti-stiction plug or cap, at various stages of the process, according to certain aspects of the present invention;

FIGS. 33A-33G illustrate cross-sectional views of the fabrication of the portion of MEMS of FIG. 32, including the anti-stiction plug or cap, at various stages of the process, according to certain aspects of the present invention;

FIGS. 35A-35E illustrate cross-sectional views of the fabrication of the portion of MEMS of FIG. 34, including the anti-stiction plug or cap, at various stages of the process, according to certain aspects of the present invention;

FIGS. 37A-37E illustrate cross-sectional views of the fabrication of the portion of MEMS of FIG. 36, including the anti-stiction plug or cap, at various stages of the process, according to certain aspects of the present invention;

FIGS. 39A-39E illustrate cross-sectional views of the fabrication of the portion of MEMS of FIG. 38, including the anti-stiction plug or cap, at various stages of the process, according to certain aspects of the present invention;

FIG. 40 illustrates a schematic view of a wafer supporting a plurality of anti-stiction plugs or caps in conjunction with a MEMS having a plurality of anti-stiction channels to be closed and/or sealed by the plugs or caps, according to certain aspects of the present invention;

FIGS. 42A-42F illustrate cross-sectional views of the fabrication of the portion of MEMS of FIG. 41, including the anti-stiction plug or cap, at various stages of the process, according to certain aspects of the present invention.

DETAILED DESCRIPTION

There are many inventions described and illustrated herein. One aspect of the present invention is directed to a thin film or wafer encapsulated MEMS, and technique of fabricating or manufacturing a thin film or wafer encapsulated MEMS employing anti-stiction techniques. In one embodiment, after encapsulation of the MEMS, an anti-stiction channel is formed in the encapsulation layer(s) and/or the substrate thereby providing "access" to the chamber containing some or all of the active members or electrodes of the mechanical structures of the MEMS. Thereafter, an anti-stiction fluid (for example, gas or gas-vapor) is introduced into the chamber via the anti-stiction channel. The anti-stiction fluid may deposit on one, some or all of the active members or electrodes of the mechanical structures thereby providing an anti-stiction layer (for example, a monolayer coating or self-assembled monolayer) and/or out-gassing molecules on such members or electrodes. In this way, the mechanical structures include suitable anti-stiction characteristics.

After introduction and/or application of the anti-stiction fluid, the anti-stiction channel may be sealed, capped, plugged and/or closed to define and control the mechanical damping environment within the chamber. In this regard, sealing, capping and/or closing the chamber establishes the environment within the chamber containing and/or housing the mechanical structures. This environment provides the predetermined, desired and/or selected mechanical damping of the mechanical structure as well as suitable hermeticity. The parameters (for example, pressure) of the final encapsulated fluid (for example, a gas or a gas vapor) in which the mechanical structures are to operate may be controlled, selected and/or designed to provide a desired and/or predetermined operating environment.

Figure 1:
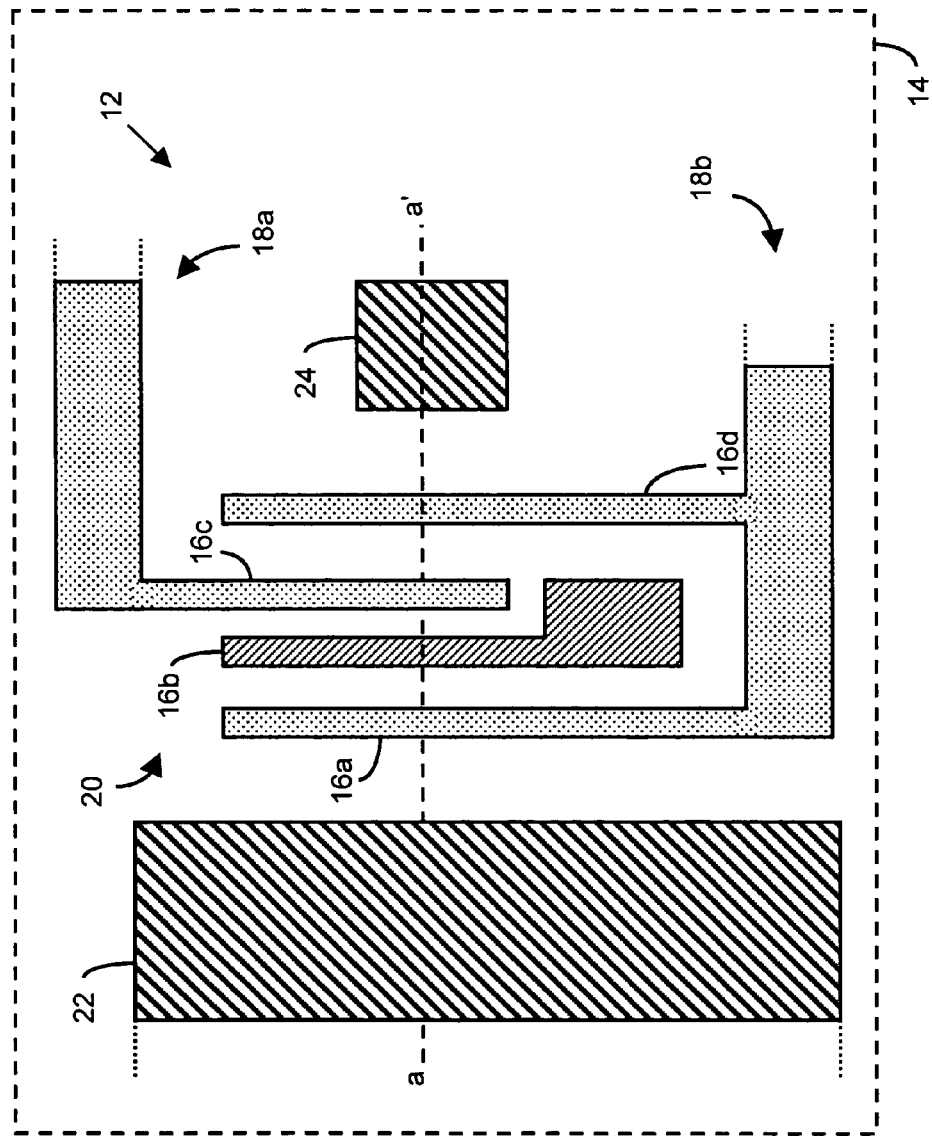
FIG. 1 illustrates a top view of a portion of a microelectromechanical structure (MEMS), for example, a portion of an interdigitated or comb-like finger electrode array, having "moveable" electrodes and "fixed" electrodes, of an accelerometer, in conjunction with, among other things, a contact area.

With reference to FIG. 1, in one exemplary embodiment, MEMS 10 includes micromachined mechanical structure 12 that is disposed on substrate 14, for example, an undoped semiconductor-like material, a glass-like material, or an insulator-like material. The micromachined mechanical structure 12 may be an accelerometer, gyroscope and/or other transducer (for example, pressure sensor, strain sensor, tactile sensor, magnetic sensor and/or temperature sensor), filter and/or resonator. The micromachined mechanical structure 12 may also include mechanical structures of a plurality of transducers or sensors including, for example, one or more accelerometers, gyroscopes, pressure sensors, tactile sensors and temperature sensors.

Figure 2:
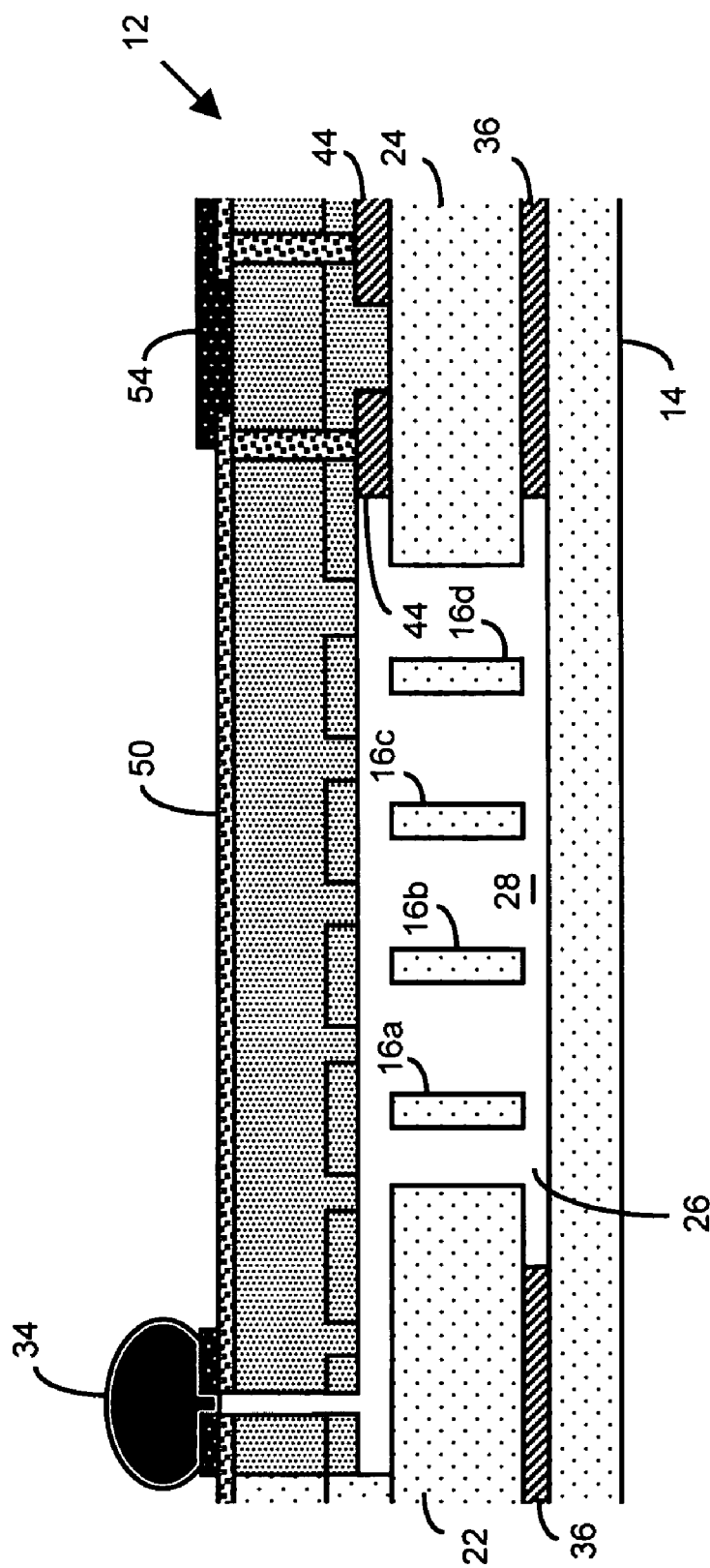
FIG. 2 illustrates a cross-sectional view (sectioned along dotted line a-a' of FIG. 1) of the portion of the interdigitated or comb-like finger electrode array, contact area of FIG. 1 and a trench isolated contact, in conjunction with an anti-stiction plug or cap, in accordance with certain aspects of the present invention.

With reference to FIG. 2, in one embodiment, micromachined mechanical structure 12 includes mechanical structures 16a-d disposed on, above and/or in substrate 14. In particular, mechanical structures 16a, 16c and 16d may be "moveable" electrodes of "moveable" mechanical members 18a and 18b. The mechanical structure 16b may be "fixed" electrodes of "fixed" mechanical member 20. Where micromachined mechanical structure 12 is an accelerometer, mechanical structures 16a-d may be a portion of the interdigitated or comb-like finger electrode arrays that comprise the sensing features of the accelerometer (see, for example, U.S. Pat. No. 6,122,964).

The mechanical structures 16a-d may be comprised of, for example, materials in column IV of the periodic table, for example silicon, germanium, carbon; also combinations of these, for example, silicon germanium, or silicon carbide; also of III-V compounds for example, gallium phosphide, aluminum gallium phosphide, or other III-V combinations; also combinations of III, IV, V, or VI materials, for example, silicon nitride, silicon oxide, aluminum carbide, or aluminum oxide; also metallic silicides, germanides, and carbides, for example, nickel silicide, cobalt silicide, tungsten carbide, or platinum germanium silicide; also doped variations including phosphorus, arsenic, antimony, boron, or aluminum doped silicon or germanium, carbon, or combinations like silicon germanium; also these materials with various crystal structures, including single crystalline, polycrystalline, nanocrystalline, or amorphous; also with combinations of crystal structures, for instance with regions of single crystalline and polycrystalline structure (whether doped or undoped).

With continued reference to FIG. 2, micromachined mechanical structure 12 may also include a field area 22 and contact area 24 disposed on or in substrate 14. The field region 22 may provide a substrate material for the electronic or electrical components or integrated circuits (for example, transistors, resistors, capacitors, inductors and other passive or active elements). The contact area 24 may provide an electrical path between micromachined mechanical structure 12 and integrated or external electronics, integrated interface circuitry, and/or an external device (not illustrated). The contact area 24 may be comprised of, for example, silicon, (whether doped or undoped), germanium, silicon/germanium, silicon carbide, and gallium arsenide, and combinations and/or permutations thereof.

The micromachined mechanical structure 12 further includes chamber 26 having an atmosphere 28 "contained" therein. The chamber 26 is formed, at least in part, by encapsulation layer(s) 30. In this regard, MEMS 10 may be sealed in chamber 26 using conventional thin film encapsulation techniques and structures. (See, for example, WO 01/77008 A1 and WO 01/77009 A1). Other thin film encapsulation techniques are suitable. Indeed, all thin film encapsulation techniques, whether now known or later developed, are intended to be within the scope of the present invention.

For example, the encapsulation techniques described and illustrated in non-provisional patent application entitled "Microelectromechanical Systems Having Trench Isolated Contacts, and Methods of Fabricating Same", which was filed on Jun. 4, 2003 and assigned Ser. No. 10/455,555 (hereinafter "Microelectromechanical Systems Having Trench Isolated Contacts Patent Application"), may be employed in conjunction with the anti-stiction techniques of the present invention. For the sake of brevity, the inventions described and illustrated in the Microelectromechanical Systems Having Trench Isolated Contacts Patent Application, implemented in conjunction with the inventions described and illustrated herein, will not be repeated but will only be summarized. It is expressly noted, however, that the entire contents of the Microelectromechanical Systems Having Trench Isolated Contacts Patent Application, including, for example, the features, attributes, alternatives, materials, techniques and advantages of all of the inventions, are incorporated by reference herein.

Insulation layer 50 and conductive layers 54 are disposed superjacent (i.e., on or above) encapsulation layers(s) 30. Conductive layer 54 forms part of the electrical connection to contact 24. Insulation layer 50 provides isolation between conductive layer 54 and other conductive and/or semiconductor layers (not shown).

A bond layer 55 is disposed superjacent insulation layer 50. Bond layer 55 may be, for example, a metal (e.g., aluminum, chromium, gold, silver, molybdenum, platinum, palladium, tungsten, titanium, copper, and/or an alloy of one or more thereof), a non-metal and/or an adhesive material. In some embodiments, bond layer 55 comprises a metal bond ring or pad that is sputtered and, if necessary patterned. Bond layer 55 may also comprise a spin-on polymer, spin-on glass ("SOG"). Further, one or more portions of bond layer 55 may be formed using/from silk screening of or dispensed sealglass, plastic and/or epoxy. In addition, a shadow mask technology may be employed to deposit and/or form bond layer 55.

The micromachined mechanical structure 12 also includes anti-stiction channel 32 formed through, for example, encapsulation layer(s) 30 and bond layer 55 to facilitate fluid communications with and/or provide an access or a pathway to mechanical structures 16a-d in chamber 26 after completion of the encapsulation process (i.e., deposition, formation and/or growth of encapsulation layer(s) 30). The anti-stiction channel 32 may be similar to the anti-stiction channel disclosed in non provisional patent application entitled "Anti-Stiction Technique for Thin Film and Wafer Bonded Encapsulated Microelectromechanical Systems", which was filed on Oct. 31, 2003 and assigned Ser. No. 10/698,258, the entire disclosure of which is incorporated by reference herein.

In this regard, after encapsulation of mechanical structures 16a-d and formation of chamber 26, anti-stiction channel 32 may be formed using, for example, anisotropic etching techniques (for example, deep reactive ion etching). In some embodiments, for example, anti-stiction channel 32 has a longitudinal axis that extends in a stackwise direction. In one embodiment, the "diameter" or "width" of anti-stiction channel 32 may be between 100 nm to 50 µm and preferably between 200 nm and 10 µm. Notably, the "diameter" or "width" of anti-stiction channel 32 may depend on the thickness of the encapsulation layer(s) 30.

Thereafter, an anti-stiction fluid (for example, flourooctatrichlorosilane ("FOTS"), dichlordimethylsilan ("DDMS"), octadecyltrichlorsilan ("OTS"), perfluoroctyltrichlorsilan ("PFOTCS"), perfluorodecanoic acid ("PFDA"), perfluorodecyl-trichlorosilane ("FDTS"), perfluoro polyether ("PFPE"), fluoroalkylsilane and/or other organosilanes) may be introduced into chamber 26 by, for example, vapor deposition (for example, APCVD, LPCVD, or PECVD). The anti-stiction fluid may deposit on one, some or all of mechanical structures 16a-d of MEMS 10 thereby providing an anti-stiction layer, for example, a monolayer coating and/or out-gassing molecules on the mechanical structures. In this way, mechanical structures 16a-d include suitable anti-adhesive properties. In some embodiments, anti-stiction layer comprises a coating on one, some or all of mechanical structures 16a-d of MEMS 10 to increase hydrophobicity and/or decrease friction and wear of moving MEMS structures.

The parameters of introducing the anti-stiction fluid may impact, for example, the characteristics of the anti-stiction layer (for example, the monolayer or self-assembled monolayer) on mechanical structures 16a-d. For example, introducing the anti-stiction fluid at higher temperatures may tend to enhance the diffusivity of the fluid whereas introducing the anti-stiction fluid at lower temperatures may tend to enhance the anti-stiction properties of the fluid. Thus, in one embodiment, the anti-stiction fluid is introduced between 20° C. to 600° C., and preferably between 100° C. and 300° C.

Moreover, introducing the anti-stiction fluid at higher pressures may tend to enhance the deposition rate of the anti-stiction layer (for example, the monolayer or self-assembled monolayer) on mechanical structures 16a-d. In contrast, lower pressures may increase the number of molecules that enter further down into chamber 26 due to the larger mean free path of the molecules via anti-stiction channel 32. Thus, in one embodiment, the anti-stiction fluid is introduced between 100 µTorr and 1 Torr.

It may be advantageous to employ deposition parameters of the anti-stiction layer that provides or forms the anti-stiction layer more conformally. In this way, anti-stiction channel 32 is less likely to close, as a result of "build-up" of the anti-stiction material within or above anti-stiction channel 32, before a sufficient anti-stiction layer forms on mechanical structures 16a-d. Notably, the anti-stiction fluid may be any material that enhances the non-reactive and/or non-adhesive nature of, for example, the surface of mechanical structures 16a-d.

The anti-stiction channel 32 may be "closed" and/or "sealed" via a channel plug or cap 34 (collectively referred to hereinafter as a cap) disposed over the anti-stiction channel, at least in part, and affixed to one or more portions of MEMS 10. In this regard, channel cap 34 may comprise, for example, a wire ball, a stud, a solder bump and/or any other member fabricated apart from MEMS 10 (e.g., as a preform) and thereafter affixed to MEMS 10. If a wire ball is to be used, the wire ball may be, for example, the same as and/or similar to wire balls employed in ball grid arrays (BGA).

If a solder bump is to be used, the solder bump may be, for example, formed using an evaporation and/or plating process. Evaporation may be, for example, performed by depositing barrier metals and/or lead-tin solder onto aluminum contacts. Plating may involve, for example, electroless plating or electroplating.

Notwithstanding the above, channel cap 34 may comprise any material or materials (collectively referred to herein as material), that seals, plugs and/or closes anti-stiction channel 32. For example, channel cap 34 may be a metal material, a spin-on polymer, spin-on glass ("SOG"), Further, in some embodiments, one or more portions of channel cap 34 may be formed using/from silk screening of or dispensed seal-glass, plastic and/or epoxy. In addition, a shadow mask technology may also be employed. Adhesive compounds may also be used.

Any method(s) and/or structure(s) may be used in fabricating the channel cap 34 and/or affixing the channel cap 34 to MEMS 10. In some embodiments, a metal placement and/or deposition tool, for example, a bonder, is used. The bonder may comprise, for example, a bonder, for example, a wire ball bonder or other type of wire bonder such as, for example, a wedge, is used to ultrasonically bond the channel cap 34 to the bond layer 55. The wire ball bonder may be, for example, a "bumper" type ball bonder designed for use in placement and/or bonding of balls without wires. The channel cap 34 may also be fabricated directly on, and/or integrally with, the bond layer 55 and/or one or more other portions of MEMS 10.

Moreover, any configuration may be employed. For example, channel cap 34 may be employed with or without the bond layer 55. In addition, in some embodiments, one or more portions of channel cap 34 extend into the anti-stiction channel 32. Indeed, any material (and corresponding fabrication technique) and configuration may be implemented that, in one embodiment, provides a barrier to maintain a suitable environment in chamber 26 and is formed, applied and/or grown using parameters (for example, a temperature) that will not (1) destroy and/or obliterate the anti-stiction affects provided by the anti-stiction fluid (for example, destruction of the monolayer coating on the mechanical structures) and/or (2) prevent the anti-stiction technique of the present invention from providing suitable anti-stiction characteristics. In this way, after sealing and/or closing anti-stiction channel 32, mechanical structures 16a-d retain suitable anti-stiction characteristics and/or properties.

As mentioned above, an exemplary method of fabricating or manufacturing a thin film encapsulated MEMS 10 is described and illustrated in the Microelectromechanical Systems Having Trench Isolated Contacts Patent Application. For the sake of brevity, those discussions and illustrations will not be repeated but will only be summarized. It is expressly noted, however, that the entire contents of the Microelectromechanical Systems Having Trench Isolated Contacts Patent Application, including, for example, the features, attributes, alternatives, materials, techniques and advantages of all of the inventions, are incorporated by reference herein.

With reference to FIG. 3A, fabrication of MEMS 10 may begin with an SOI substrate partially formed device including mechanical structures 16a-d and contact area 24 disposed on first sacrificial layer 36, for example, silicon dioxide or silicon nitride. The mechanical structures 16a-d and contact area 24 may be formed using well-known deposition, lithographic, etching and/or doping techniques as well as from well-known materials (for example, semiconductors such as silicon, germanium, silicon-germanium or gallium-arsenide). Moreover, field region 22 and first sacrificial layer 36 may be formed using well-known silicon-on-insulator fabrication techniques (FIG. 3A) or well-known formation, lithographic, etching and/or deposition techniques using a standard or over-sized ("thick") wafer (not illustrated).

With reference to FIG. 3B, following formation of mechanical structures 16a-d and contact area 24, second sacrificial layer 38, for example, silicon dioxide or silicon nitride, may be deposited and/or formed to secure, space and/or protect mechanical structures 16a-d during subsequent processing, including the encapsulation process. In addition, an opening 40 may be etched and/or formed in second sacrificial layer 38 to provide for subsequent formation of an electrical contact. The opening 40 may be provided using, for example, well known masking techniques (such as a nitride mask) prior to and during deposition and/or formation of second sacrificial layer 38, and/or well known lithographic and etching techniques after deposition and/or formation of second sacrificial layer 38.

With reference to FIGS. 3C, 3D and 3E, thereafter, first encapsulation layer 30a may be deposited, formed and/or grown on second sacrificial layer 38 (see, FIG. 3C). In one embodiment, the thickness of first encapsulation layer 30a in the region overlying second sacrificial layer 38 may be between 0.1 μm and 5.0 μm. The external environmental stress on, and internal stress of first encapsulation layer 30a after etching second sacrificial layer 38 may impact the thickness of first encapsulation layer 30a. Slightly tensile films may self-support better than compressive films which may buckle.

The first encapsulation layer 30a may be etched to form passages or vents 42 (see, FIG. 3D). In one exemplary embodiment, vents 42 have a diameter or aperture size of between 0.1 μm to 2 μm. In some embodiments, the vents have a diameter or aperture size of about 1 um and are spaced apart by about 10 um. The vents 42 permit etching and/or removal of at least selected portions of first and second sacrificial layers 36 and 38, respectively (see, FIG. 3E).

As mentioned in the Microelectromechanical Systems Having Trench Isolated Contacts Patent Application, contact 24 may remain partially, substantially or entirely surrounded by portions of first and second sacrificial layers 36 and/or 38. For example, with reference to FIG. 3E, while mechanical structures 16a-d are released from their respective underlying oxide columns, a portion 44 of sacrificial layer 38 (i.e., juxtaposed electrical contact area 24 may remain after etching or removing second sacrificial layer 38.

With reference to FIG. 3F, after releasing mechanical elements 16a-d, second encapsulation layer 30b may be deposited, formed and/or grown. The second encapsulation layer 30b may be, for example, a silicon-based material (for example, a polycrystalline silicon or silicon-germanium), which is deposited using, for example, an epitaxial, a sputtering or a CVD-based reactor (for example, APCVD, LPCVD, or PECVD). The deposition, formation and/or growth may be by a conformal process or non-conformal process. The material may be the same as or different from first encapsulation layer 30a.

Thereafter, contact area 24 of micromachined mechanical structure 12 is dielectrically isolated from the surrounding conductor and/or semiconductor layers. With reference to FIGS. 3G and 3H, trenches 46a and 46b may be etched. The trenches 46a and 46b may include a slight taper in order to facilitate the formation of dielectric isolation regions 48a and 48b. In this regard, an insulating material may be deposited in trenches 46a and 46b to form dielectric isolation regions 48a and 48b, respectively. The insulating material may be, for example, silicon dioxide, silicon nitride, BPSG, PSG, or SOG.

The insulating layer 50 may be deposited, formed and/or grown on the exposed surface of second encapsulating layer 30b to provide insulation between the various surrounding conductive and/or semiconductor layers and the subsequent conductive layer. Thus, during deposition, formation and/or growth of insulation layer 50, trenches may also be filled to form dielectric isolation regions 48a and 48b. (See, FIG. 3H). Thereafter, contact opening 52 and anti-stiction channel window 53 may be formed and/or etched in insulation layer 50, for example, using conventional etching techniques. Contact opening 52 facilitates electrical connection to contact area 24. As described below, anti-stiction channel window 53 defines the location of the anti-stiction channel 32, at least in part.

A conductive layer may then be deposited and/or formed. Conductive layer may be patterned to provide conductive layer 54, which provides the appropriate electrical connection to contact 24 and to form the bond layer 55 (See, FIG. 3I) superjacent insulation layer 50.

Patterning of conductive layer may begin, for example, by applying a layer of photoresist over the conductive layer. The photoresist may thereafter be patterned (e.g., portions of the photoresist are exposed and developed away) to expose the portions of the conductive layer that are to be removed. An etch may subsequently be performed wherein the photoresist covered portions of the conductive layer (i.e., the portions of the conductive layer defining the conductive layer 54 and the bond layer 55) are left intact and the other portions of the conductive layer are removed.

In this embodiment, bond layer 55 comprises any type of conductive material, for example, metal (e.g., aluminum, chromium, gold, silver, molybdenum, platinum, palladium, tungsten, titanium, copper, and/or an alloy of one or more thereof), non-metal and/or conductive adhesive material. In some other embodiments, bond layer 55 comprises a metal bond ring or pad that is sputtered and, if necessary patterned. Bond layer 55 may also comprise a spin-on polymer, spin-on glass ("SOG"). Further, one or more portions of bond layer 55 may be formed using/from silk screening of or dispensed seal-glass, plastic and/or epoxy. In addition, a shadow mask technology may be employed to deposit and/or form bond layer 55.

With reference to FIG. 3J, the bond layer 55 may thereafter be etched to define a through hole and to re-open at least a portion of the anti-stiction channel window 53. The reopened anti-stiction window 53 defines the location of the anti-stiction channel 32, at least in part.

Figure 3K:
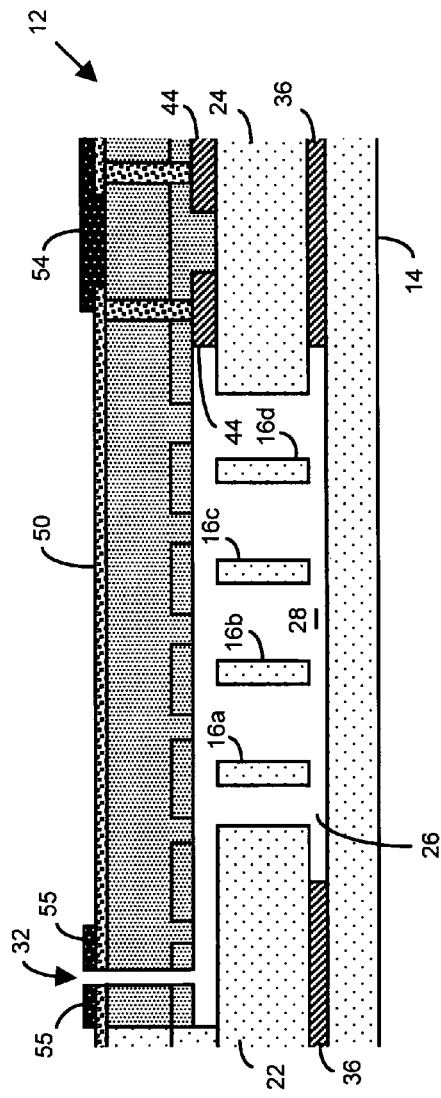
FIGS. 3A-3N illustrate cross-sectional views of the fabrication of the portion of MEMS of FIG. 2, including the anti-stiction plug or cap, at various stages of the process, according to certain aspects of the present invention.

Thereafter, with reference to FIG. 3K, anti-stiction channel 32 is formed through encapsulation layer(s) 30 to provide access to mechanical structures 16a-d. The anti-stiction channel 32 may be formed using, for example, well-known anisotropic etching techniques (for example, deep reactive ion etching and/or deep silicon trench etching).

After formation of anti-stiction channel 32, an anti-stiction fluid may be introduced into chamber 26. The anti-stiction fluid may be, for example, DDMS, OTS, PFOTCS, PFDA, FDTS, PFPE and/or FOTS. Indeed, any anti-stiction fluid may be employed provided that the subsequent processes do not destroy the anti-stiction characteristics and/or destroy or obliterate the anti-stiction deposition on mechanical structures 16a-d of MEMS 10. In this way, the anti-stiction layer 58 (see FIG. 4), for example, the monolayer coating formed on mechanical structures 16a-d, remains relatively intact and mechanical structures 16a-d include suitable anti-adhesive properties to overcome the adhesive forces of adjacent structures or elements in MEMS 10.

Figure 3L:
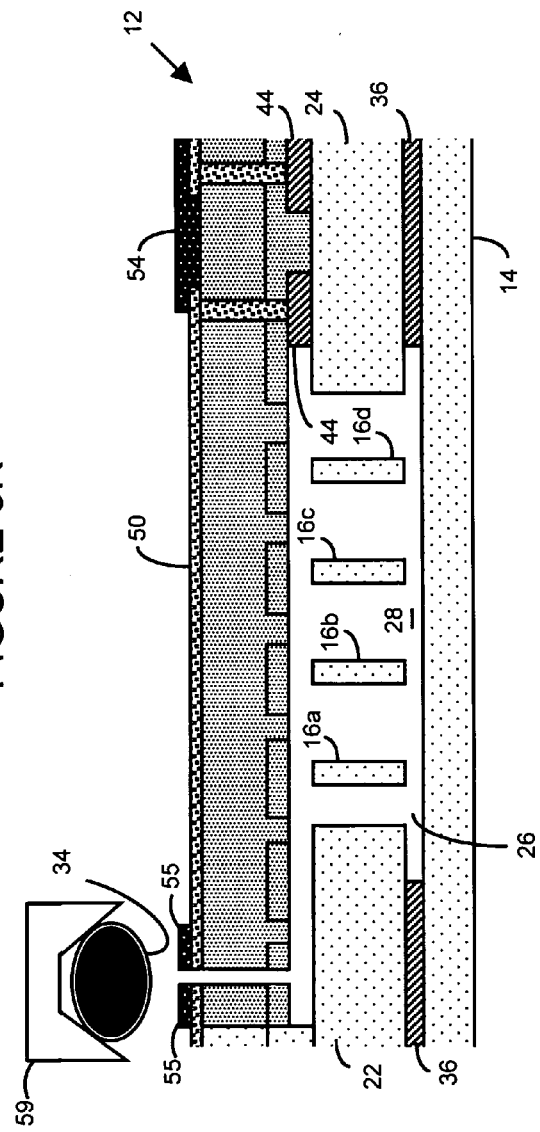

With reference to FIG. 3L-3N, anti-stiction channel 32 may be closed and/or sealed via channel cap 34 disposed over the anti-stiction channel, at least in part, and affixed to one or more portions of MEMS 10. In this regard, channel cap 34 may comprise, for example, a wire ball, a stud, a solder bump and/or any other member fabricated apart from MEMS 10 (e.g., as a preform) and thereafter affixed to MEMS 10.

Any method(s) may be used in affixing the channel cap 34 to MEMS 10. In some embodiments, a bonding mechanism (or bonder), for example, a wire ball bonder or other type of wire bonder such as, for example, a wedge, is used to ultrasonically bond the cap 34 to the bond layer 55 of the MEMS 10. The wire ball bonder may be, for example, a "bumper" type ball bonder designed for use in placement and/or bonding of balls without wires.

For example, with reference to FIG. 3L, channel cap 34 may be positioned on and/or formed on a bonder 59. The bonder 59 and/or MEMS 10 may thereafter be positioned such that the channel cap 34 is aligned with the anti-stiction channel.

With reference to FIG. 3M, the bonder 59 may thereafter provide a force to drive the channel cap 34 toward the anti-stiction channel and into contact with the MEMS 10, until a desired amount of contact between the channel cap 34 and MEMS 10 is achieved. Ultrasonic or other energy may then be provided to cause the channel cap 34 to bond to one or more portion(s) of MEMS 10.

In some embodiments, the force and/or energy is enough to drive one or more portions of the channel cap 34 into the anti-stiction channel, at least in part. It may also be desirable to provide heat before, during, and/or after bonding.

With reference to FIG. 3N, the bonder 59 may thereafter withdraw and/or separate from the channel cap 34, leaving the channel cap 34 behind.

The channel cap 34 may be formed of any material or combination of materials that seals, plugs and/or closes anti-stiction channel 32. For example, channel cap 34 may be a metal material, a spin-on polymer, spin-on glass ("SOG"), or combination(s) of one or more of the above. Further, in some embodiments, one or more portions of channel cap 34 may be formed using/from silk screening of or dispensed seal-glass, plastic and/or epoxy. In addition, a shadow mask technology may be employed to seal, plug and/or close anti-stiction channel 32. Indeed, any material (and corresponding fabrication technique) and configuration may be employed provided the process of forming channel cap 34 uses parameters (for example, a temperature) that will not (1) destroy and/or obliterate the anti-stiction affects provided by the anti-stiction fluid (for example, destruction of the monolayer coating on the mechanical structures) and/or (2) prevent the anti-stiction technique of the present invention from providing suitable anti-stiction or anti-adhesive characteristics.

Notably, the anti-stiction fluid may be a gas or gas vapor of a material used during the formation of channel cap 34. Indeed, the anti-stiction fluid may be a by-product of the reaction of the material of MEMS 10 and the gas or gas vapor of a material used during the formation of channel cap 34. For example, a mixture of solvents and/or a polymer which outgases appropriate molecules such as DDMS.

The state of the fluid within chamber 26 (for example, the pressure), after deposition and/or formation of channel cap 34 may be determined using conventional techniques and/or using those techniques described and illustrated in non-provisional patent application entitled "Electromechanical System having a Controlled Atmosphere, and Method of Fabricating Same", which was filed on Mar. 20, 2003 and assigned Ser. No. 10/392,528 (hereinafter "the Electromechanical System having a Controlled Atmosphere Patent Application"). For the sake of brevity, all of the inventions regarding controlling the atmosphere within chamber 26 which are described and illustrated in the Electromechanical System having a Controlled Atmosphere Patent Application will not be repeated here. It is expressly noted, however, that the entire contents of the Electromechanical System having a Controlled Atmosphere Patent Application, including, for example, the features, attributes, alternatives, materials, techniques and advantages of all of the inventions, are incorporated by reference herein.

Figure 4:
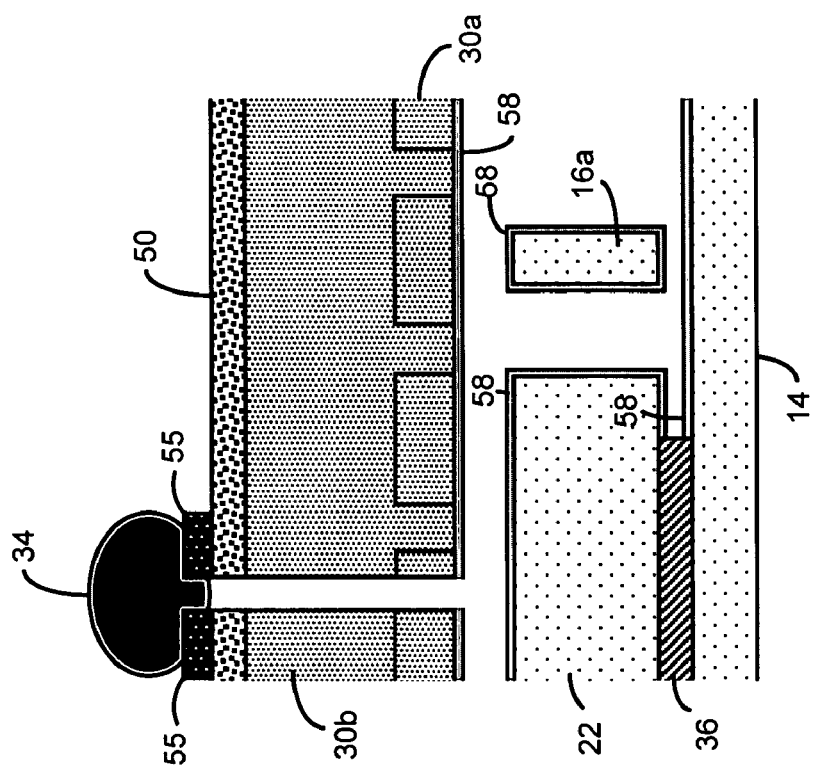
FIG. 4 illustrates a cross-sectional view of the anti-stiction layer deposited on the microstructure of FIG. 2, according to certain aspects of the present invention.

With reference to FIG. 4, in certain embodiments, anti-stiction layer 58, for example, a thin and/or monolayer coating is formed on mechanical structures 16a-d as a result of the introduction of the anti-stiction fluid and/or formation of channel cap 34. The thin and/or monolayer coating provides suitable anti-adhesive properties that overcome the adhesive forces of adjacent structures or elements in MEMS 10. Notably, anti-stiction layer 58, for example, the thin and/or monolayer coating does not detrimentally impact the operation of mechanical structures 12 of MEMS 10.

Figure 5:
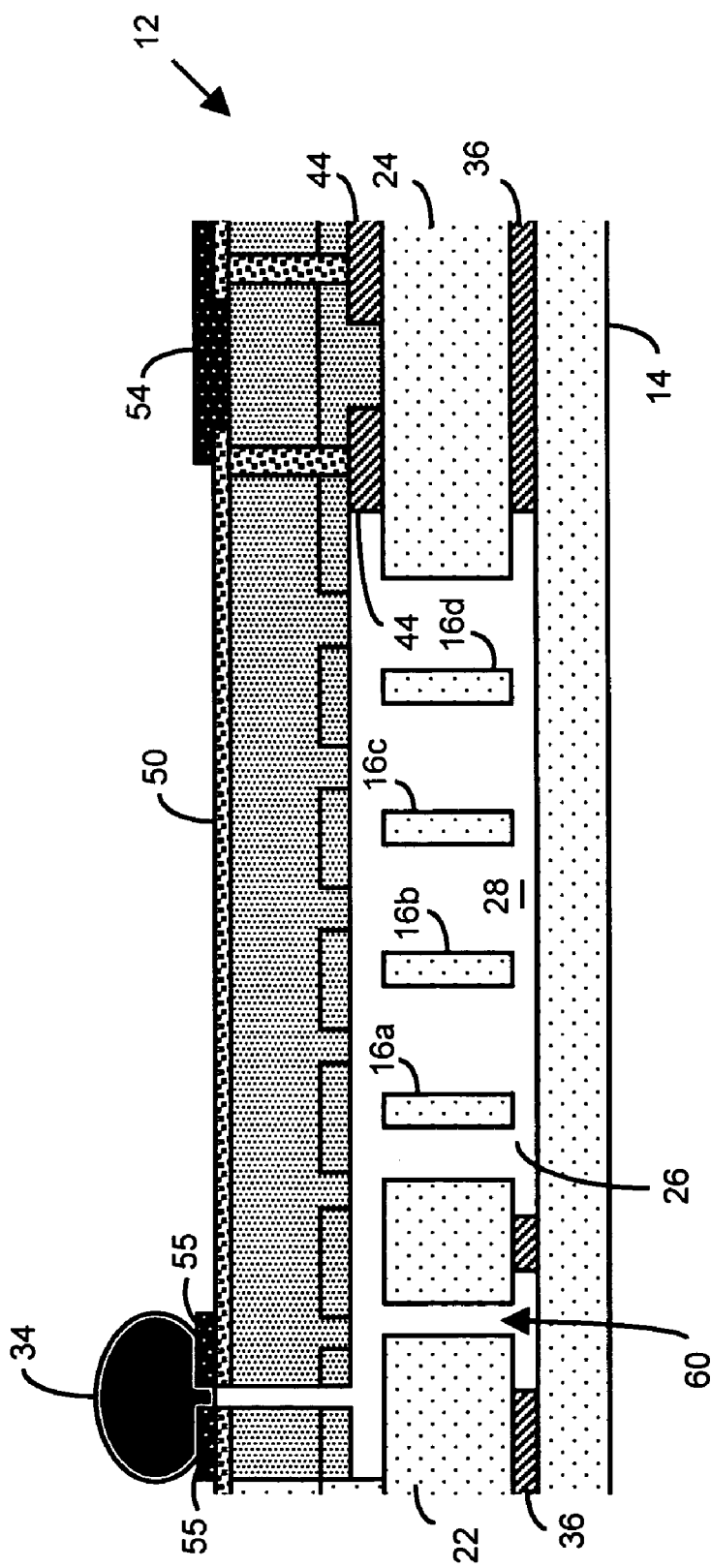
FIG. 5 illustrates a cross-sectional view of a portion of an interdigitated or comb-like finger electrode array, contact area and a trench isolated contact, in conjunction with a trap and an anti-stiction plug or cap, in accordance with certain aspects of the present invention.
Figure 9:
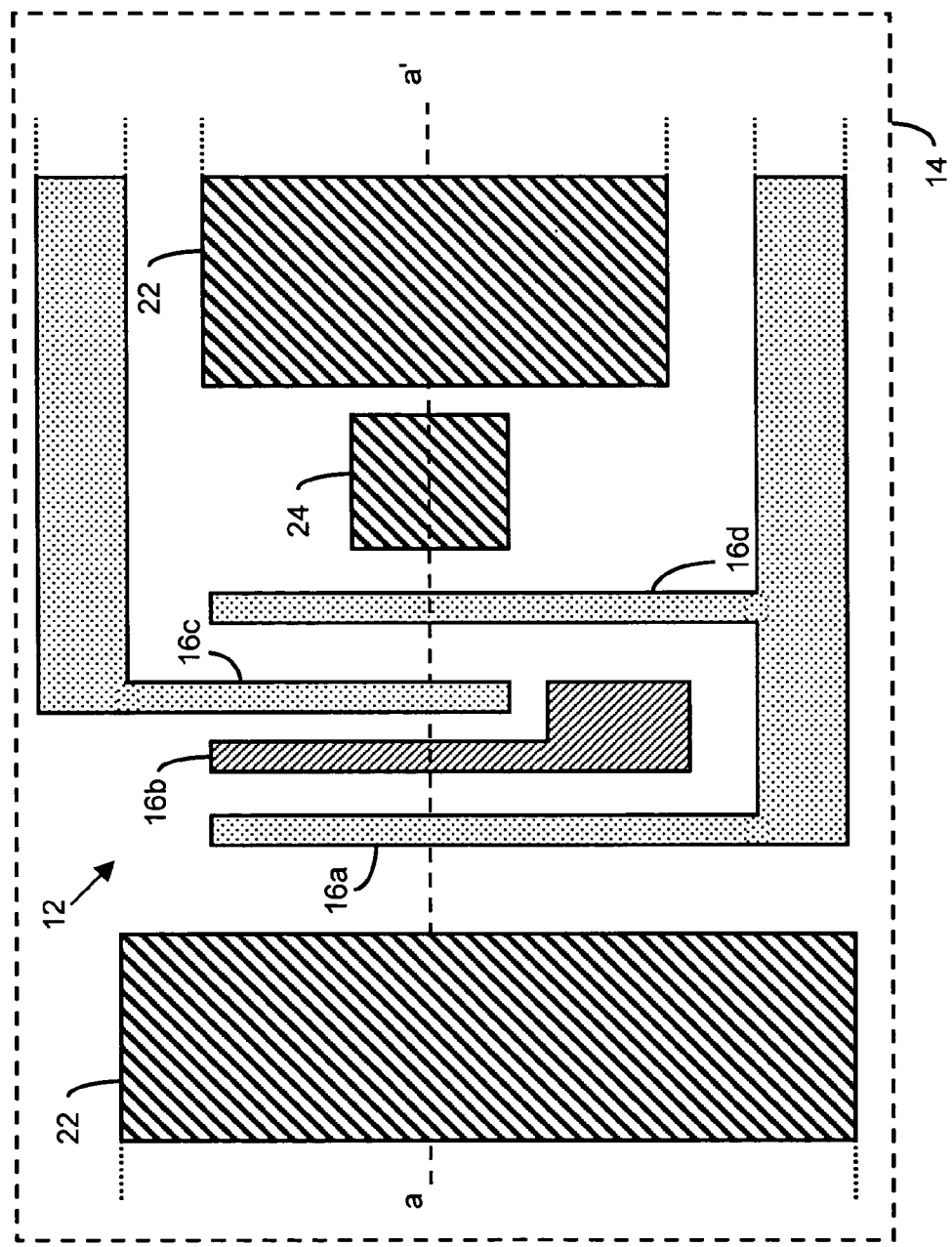
FIG. 9 illustrates a top view of a portion of another microelectromechanical structure (MEMS), for example, a portion of an interdigitated or comb-like finger electrode array, having "moveable" electrodes and "fixed" electrodes, of an accelerometer, in conjunction with, among other things, a plurality of contact areas.

With reference to FIG. 5, in another embodiment of the present invention, a vertical and/or horizontal trap is formed in the vicinity of anti-stiction channel 32. The trap 60 may be positioned between anti-stiction channel 32 and mechanical structures 16a-d. In this way, where material employed to create and/or seal, plug and/or close anti-stiction channel 32 (e.g., one or more of the materials used in forming anti-stiction channel and/or channel cap 34) may escape from anti-stiction channel 32, trap 60 "captures" or "catches" such material before the material enters that portion of chamber 26 where mechanical structures 16a-d reside. Under this circumstance, the material that enters chamber 26 is routed away from mechanical structures 16a-d and, as such, is "prevented" from contacting and/or impacting mechanical structures 16a-d and the operation thereof. For example, with reference to FIG. 5, trap 60 may be a substantially vertical trap, which is located between anti-stiction channel 32 and mechanical structures 16a-d.

With reference to FIG. 6A, an exemplary embodiment of MEMS 10 having trap 60 may begin with an SOI substrate partially formed device including mechanical structures 16a-d, contact area 24, and trap 60 disposed on first sacrificial layer 36, for example, silicon dioxide or silicon nitride. The mechanical structures 16a-d, contact area 24 and trap 60 may be formed using well-known deposition, lithographic, etching and/or doping techniques as well as from well-known materials (for example, semiconductors such as silicon, germanium, silicon-germanium or gallium-arsenide).

Thereafter, the processing of MEMS 10 having trap 60 may proceed in the same manner as described above with respect to FIGS. 3B-3L. In this regard, an exemplary fabrication process of MEM 10 including trap 60 is illustrated in FIGS. 6B-6L. Because the processes are substantially similar to the discussion above with respect to FIGS. 3B-3L, for the sake of brevity, that discussion will not be repeated.

As mentioned above, trap 60 of FIG. 5 is designed to prevent the material(s) that are deposited to seal, plug and/or close anti-stiction channel 32 from adversely impacting the operation of mechanical structures 16a-d. With reference to FIGS. 7A and 7B, in one embodiment, trap 60 is positioned and/or located to route material 62 (e.g., material that may leak and/or escape from anti-stiction channel 32 during formation of anti-stiction channel and/or deposition and/or formation of channel cap 34) away from mechanical structures 16a-d. In this regard, trap 60 "captures" material 62 before it enters that portion of chamber 26 where mechanical structures 16a-d reside. Under this circumstance, material 62 that enters chamber 26 is "prevented" from contacting and/or adversely impacting mechanical structures 16a-d and the operation thereof.

With reference to FIGS. 8A and 8B, in another embodiment, after fabrication of channel cap 34, diffusion barrier 64 may be deposited and/or formed over anti-stiction channel 32 and/or channel cap 34 in order to enhance the "seal" of anti-stiction channel 32 and thereby enhance the barrier to diffusion of fluid within (or external to) chamber 26 (for example, enhance the hermeticity of MEMS 10). Thus, diffusion barrier 64 alone, or in combination with channel cap 34, "traps" the fluid (having a selected, desired and/or predetermined state) in chamber 26.

The diffusion barrier 64 may be, for example, a semiconductor material (for example, a polysilicon, germanium, or silicon/germanium), an insulator material (for example, silicon dioxide, silicon nitride, BPSG, PSG, or SOG) or metal bearing material (for example, silicides). The diffusion barrier 64 may be, for example deposited, formed or grown using, for example, an epitaxial, a sputtering or a CVD-based reactor (for example, APCVD, LPCVD or PECVD). The deposition, formation and/or growth may be by a conformal process or non-conformal process. The material comprising diffusion barrier 64 may be the same as or different from channel cap 34. However, it may be advantageous to employ a low temperature deposition process (and a material that is amenable to such a deposition technique) in order to preserve and/or protect the anti-stiction barrier, layer and/or affects provided by the-anti-stiction fabrication processes of the present invention.

The diffusion barrier 64 may be formed and/or deposited before formation and/or deposition of conductive layer 54, during formation and/or deposition of conductive layer 54 (see, for example, FIG. 8A), or after formation and/or deposition of conductive layer 54 (see, for example, FIG. 8B).

Notably, diffusion barrier 64 may be implemented in any of the embodiments described herein, for example, the embodiments illustrated in FIGS. 3A-3N. For the sake of brevity, that discussion will not be repeated or restated.

As mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10A-10C, and 11A-11C). For the sake of brevity, the inventions described and illustrated in the Microelectromechanical Systems and Method of Encapsulating Patent Application, implemented in conjunction with the anti-stiction inventions described and illustrated herein, will not be repeated. It is expressly noted, however, that the entire contents of the Microelectromechanical Systems and Method of Encapsulating Patent Application, including, for example, the features, attributes, alternatives, materials, techniques and advantages of all of the embodiments and/or inventions, are incorporated by reference herein.

Figure 12:
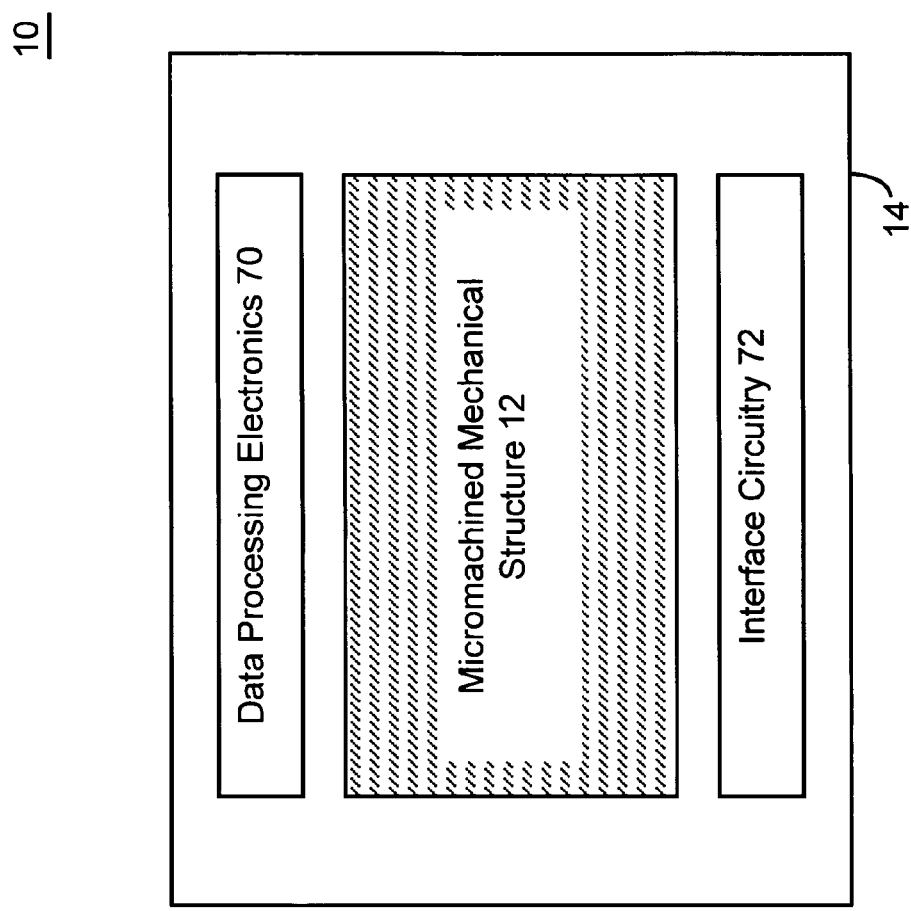
FIG. 12 is a block diagram of a microelectromechanical system (MEMS) disposed on a substrate, in conjunction with interface circuitry and data processing electronics.

It should be noted that the present invention may be implemented in a MEMS 10 including micromachined mechanical structure as well as data processing electronics and/or interface circuitry. With reference to FIG. 12, in one exemplary embodiment, MEMS 10 includes micromachined mechanical structure 12 that is disposed on substrate 14, for example, an undoped semiconductor-like material, a glass-like material, or an insulator-like material. The MEMS 10 may also include data processing electronics 70 to process and analyze information generated by, and/or control or monitor the operation of micromachined mechanical structure 12. In addition, MEMS 10 may also include interface circuitry 72 to provide information from micromachined mechanical structure 12 and/or data processing electronics 16 to an external device (not illustrated), for example, a computer, indicator/display and/or sensor.

The data processing electronics 70 and/or interface circuitry 72 may be integrated in or on substrate 14. In this regard, MEMS 10 may be a monolithic structure including mechanical structure 12, data processing electronics 70 and interface circuitry 72. The data processing electronics 70 and/or interface circuitry 72 may also reside on a separate, discrete substrate that, after fabrication, is bonded to or on substrate 14.

Figure 13A:
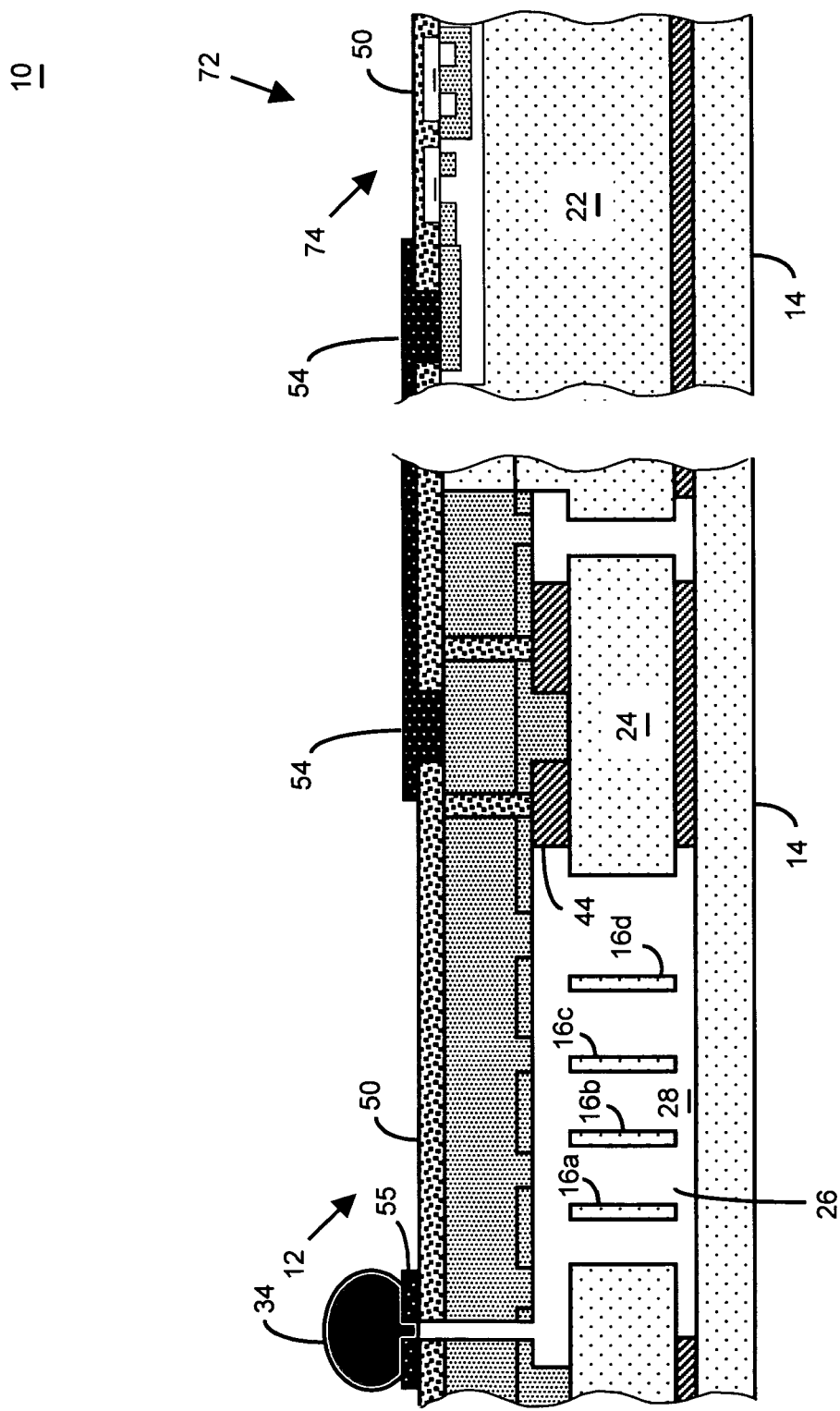
FIGS. 13A and 13B illustrate cross-sectional views of a MEMS according to certain aspects of the present inventions, including a micromachined mechanical structure portion and an integrated circuit portion, both portions of which are disposed or integrated on or in a common substrate.
Figure 13B:
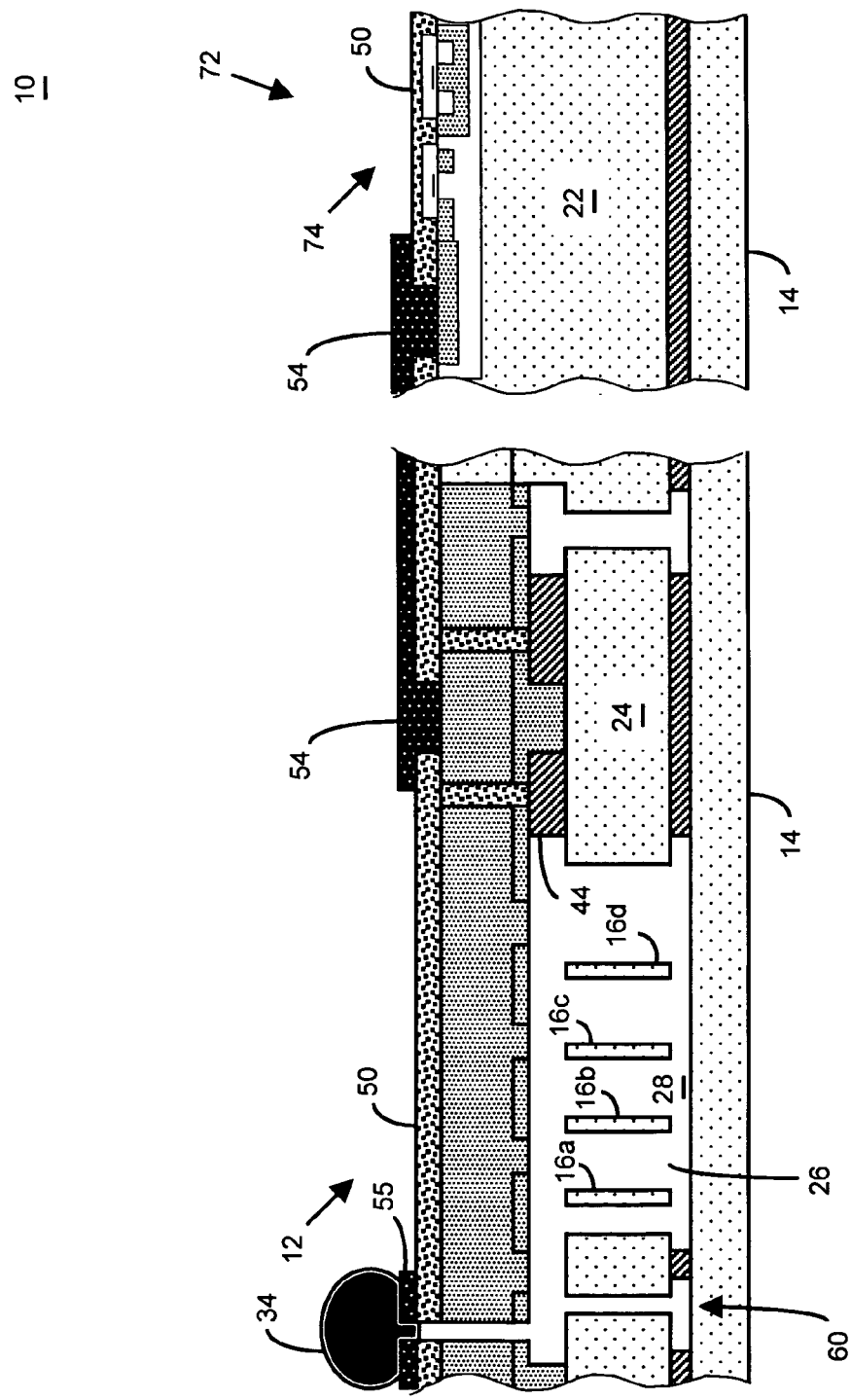
Figure 14:
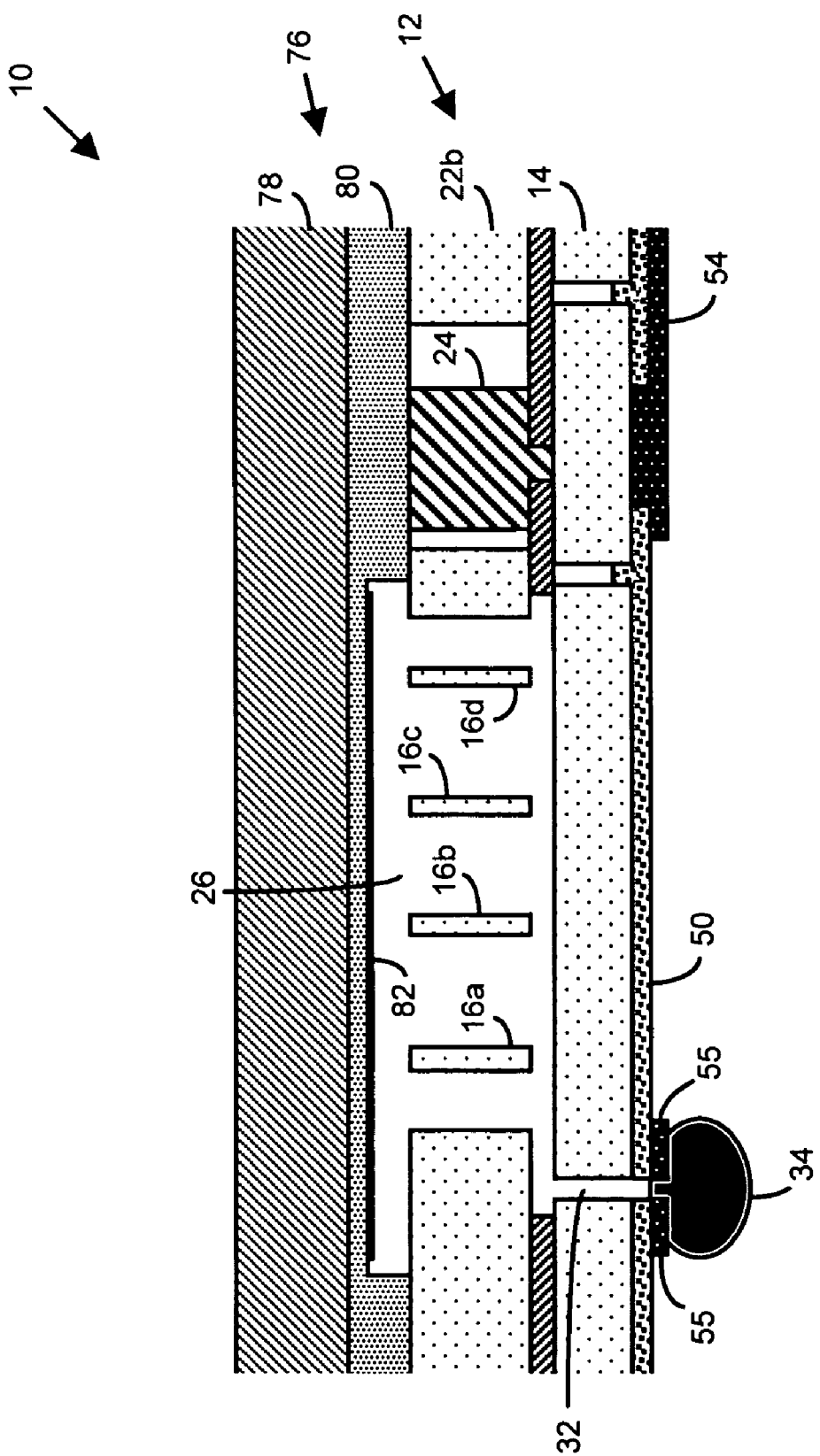
FIG. 14 illustrates a cross-sectional view (sectioned along dotted line a-a' of FIG. 1) of the portion of the interdigitated or comb-like finger electrode array and contact area of FIG. 1, in conjunction with the anti-stiction plug or cap and wafer bonded encapsulation structure, in accordance with certain aspects of the present invention.

For example, with reference to FIGS. 13A and 13B, integrated circuits 74 may be fabricated using conventional techniques after definition of mechanical structure 12 using, for example, the techniques described and illustrated in Microelectromechanical Systems and Method of Encapsulating Patent Application and/or Microelectromechanical Systems Having Trench Isolated Contacts Patent Application (see, for example, FIG. 13B). In this regard, after fabrication and encapsulation of mechanical structure 12, integrated circuits 74 may be fabricated using conventional techniques and interconnected to contact area 24 by way of conductive layer 54. In particular, as illustrated and described in Microelectromechanical Systems and Method of Encapsulating Patent Application (for example, FIGS. 12A-C thereof and/or Microelectromechanical Systems Having Trench Isolated Contacts Patent Application (for example, FIGS. 14A-E thereof, the contact area is accessed directly by integrated circuitry 74 via a low resistance electrical path (i.e., conductive layer 54) that facilitates a good electrical connection. The insulation layer 50 may be deposited, formed and/or grown and patterned and, thereafter, conductive layer 54 (for example, a heavily doped polysilicon or metal such as aluminum, chromium, gold, silver, molybdenum, platinum, palladium, tungsten, titanium, and/or copper) is formed.

With continued reference to FIGS. 13A and 13B, thereafter, the anti-stiction techniques of the present invention(s) may be implemented. That is, anti-stiction channel window 53 may be etched and/or formed in insulation layer 50 and anti-stiction channel 32 may be etched and/or formed in encapsulation layer(s) 30. The anti-stiction fluid may be introduced into chamber 26 via anti-stiction channel 32 thereby forming, for example, an anti-stiction layer 58 (FIG. 4) on mechanical structures 16. Thereafter or concurrently therewith, anti-stiction channel 32 may be closed and/or sealed by channel cap 34 and/or diffusion barrier 64.

Notably, while the anti-stiction processes were described as being implemented after deposition and/or formation of insulation layer 50 and conductive layer 54, the anti-stiction processes of the MEMS 10 illustrated in FIGS. 13A and 13B may be performed in another order. That is, contact opening 52 and anti-stiction channel window 53 may be fabricated either consecutively or simultaneously. Moreover, the anti-stiction fabrication/processes may be performed after deposition of conductive layer 54 or before fabrication of deposition of conductive layer 54. In addition, channel cap 34 may be formed and/or deposited simultaneously with the formation and/or deposition of conductive layer 54.

In another aspect, the present invention employs wafer-bonding encapsulation techniques, in conjunction with the anti-stiction techniques described above. In this regard, with reference to FIG. 14, in one embodiment, MEMS 10 includes micromachined mechanical structure 12 and wafer bonded encapsulation structure 76. The micromachined mechanical structure 12 may be fabricated using any of the techniques described and illustrated herein or using conventional techniques.

The wafer bonded encapsulation structure 76 may be bonded and/or "attached", using, for example, anodic bonding. In one embodiment, wafer bonded encapsulation structure 76 includes cap wafer 78 (for example, silicon), insulation layer 80 (for example, SOG or Pyrex) and anodic shield 82 (for example, a metal). Notably, wafer bonded encapsulation structure 76 may be bonded and/or "attached" using conventional techniques.

In one embodiment, the anti-stiction techniques described and illustrated above are "applied" to the exposed surface of substrate 14. In this regard, anti-stiction channel 32 is formed in substrate 14 and, thereafter an anti-stiction fluid is introduced into chamber 26, as described above. The anti-stiction cap 34 may then be deposited and/or formed to "re-seal" chamber 26.

Figure 15A:
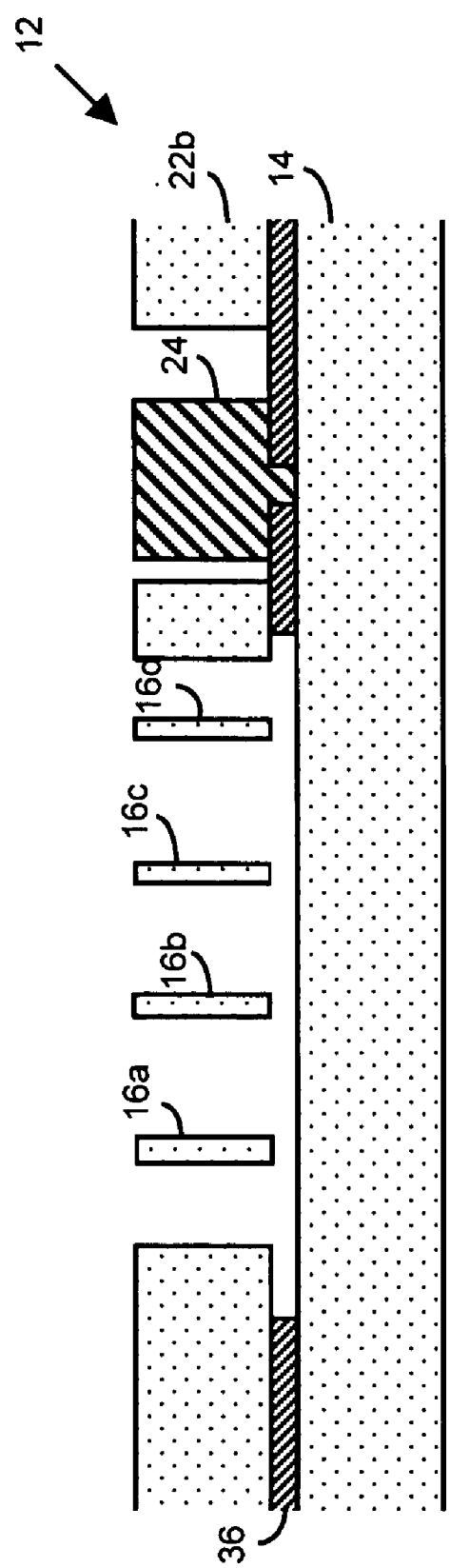
FIGS. 15A-15F illustrate cross-sectional views of the fabrication of the MEMS of FIG. 14, including anti-stiction plug or cap, at various stages of the process, according to certain aspects of the present invention.

For example, with reference to FIG. 15A, MEMS 10 may begin with an SOI substrate partially formed device including "released" mechanical structures 16a-d and contact area 24 partially disposed on first sacrificial layer 36, for example, silicon dioxide or silicon nitride. The fabrication and/or formation of the structures of micromachined mechanical structure 12 may be accomplished using the techniques described and illustrated herein or any conventional technique. Indeed, all techniques and materials used to fabricate and/or form mechanical structure 12, whether now known or later developed, are intended to be within the scope of the present invention.

Figure 15B:
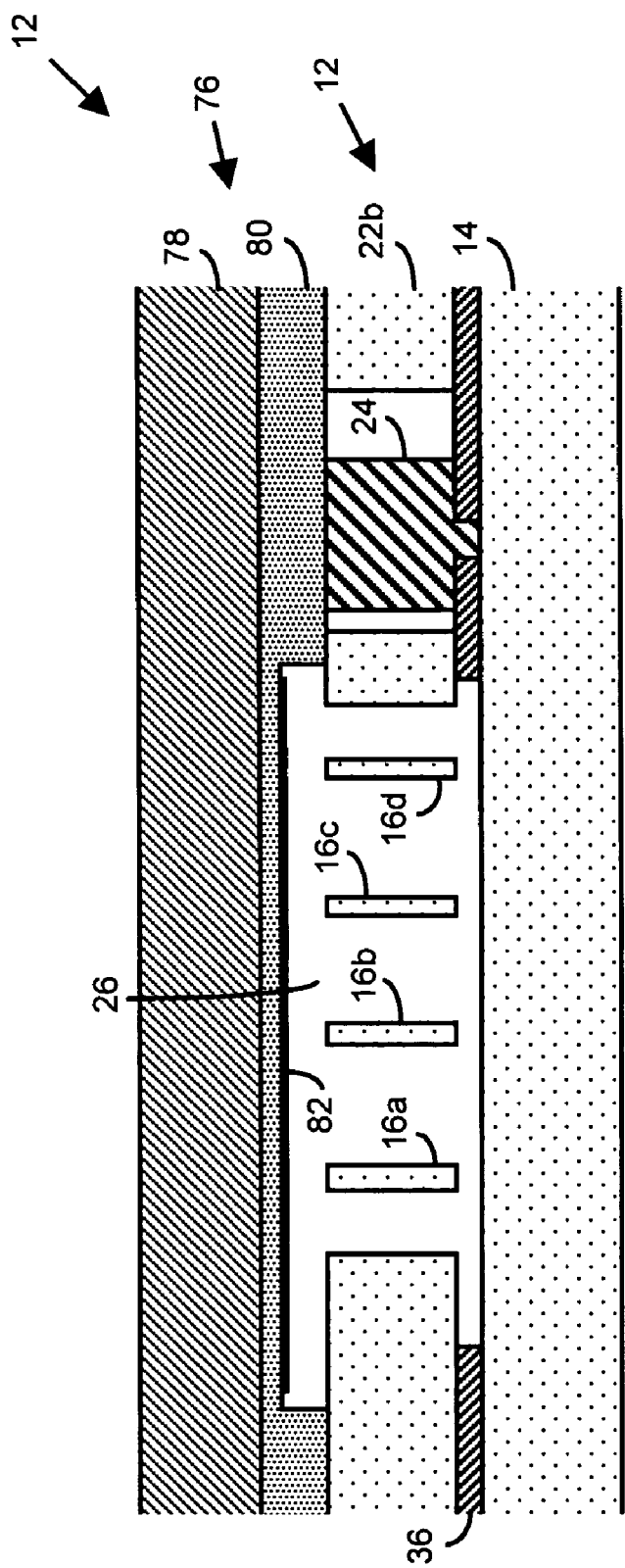

With reference to FIG. 15B, thereafter, wafer bonded encapsulation structure 76 may be "applied" and/or bonded to micromachined mechanical structure 12. For example, in one embodiment, wafer bonded encapsulation structure 76 is bonded using anodic techniques. Notably, wafer bonded encapsulation structure 76 may be "bonded" to micromachined mechanical structure 12 using conventional techniques. In addition, all techniques and materials used to fabricate and/or form wafer bonded encapsulation structure 76, whether now known or later developed, are intended to be within the scope of the present invention.

Figure 15C:
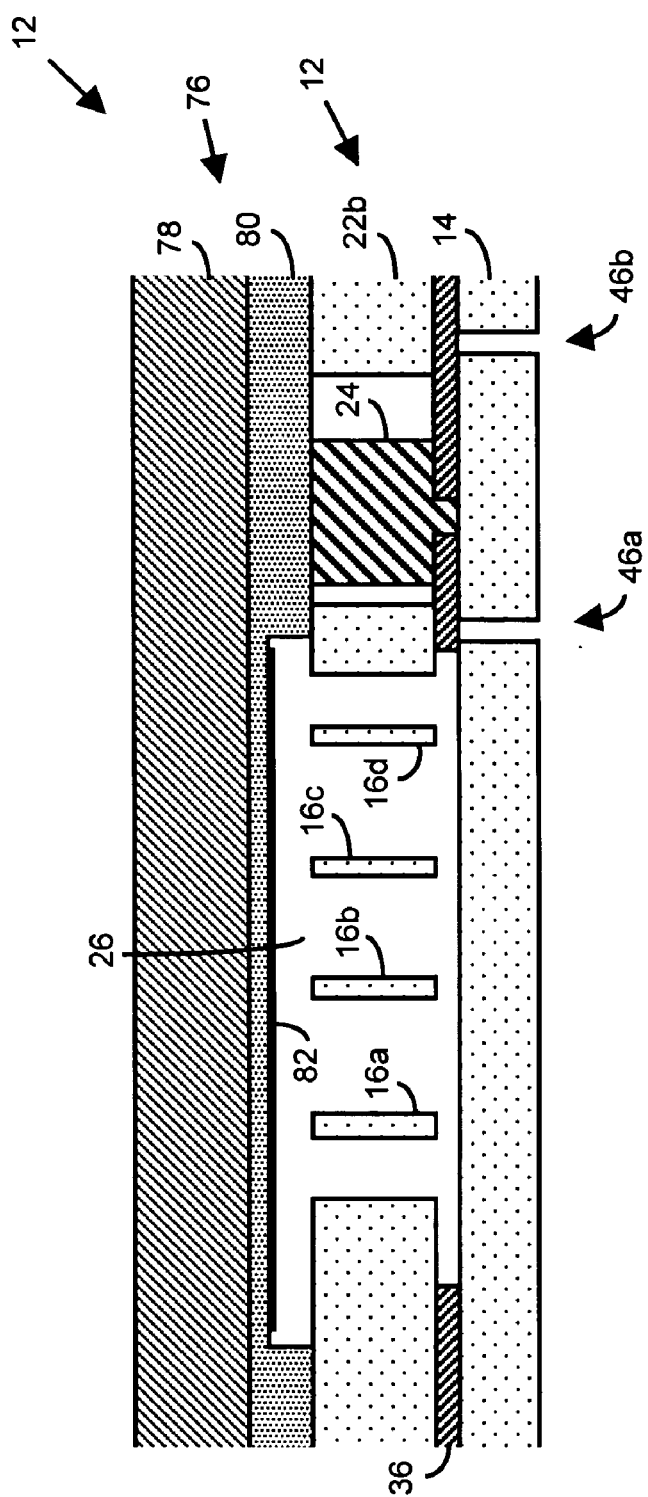
Figure 15D:
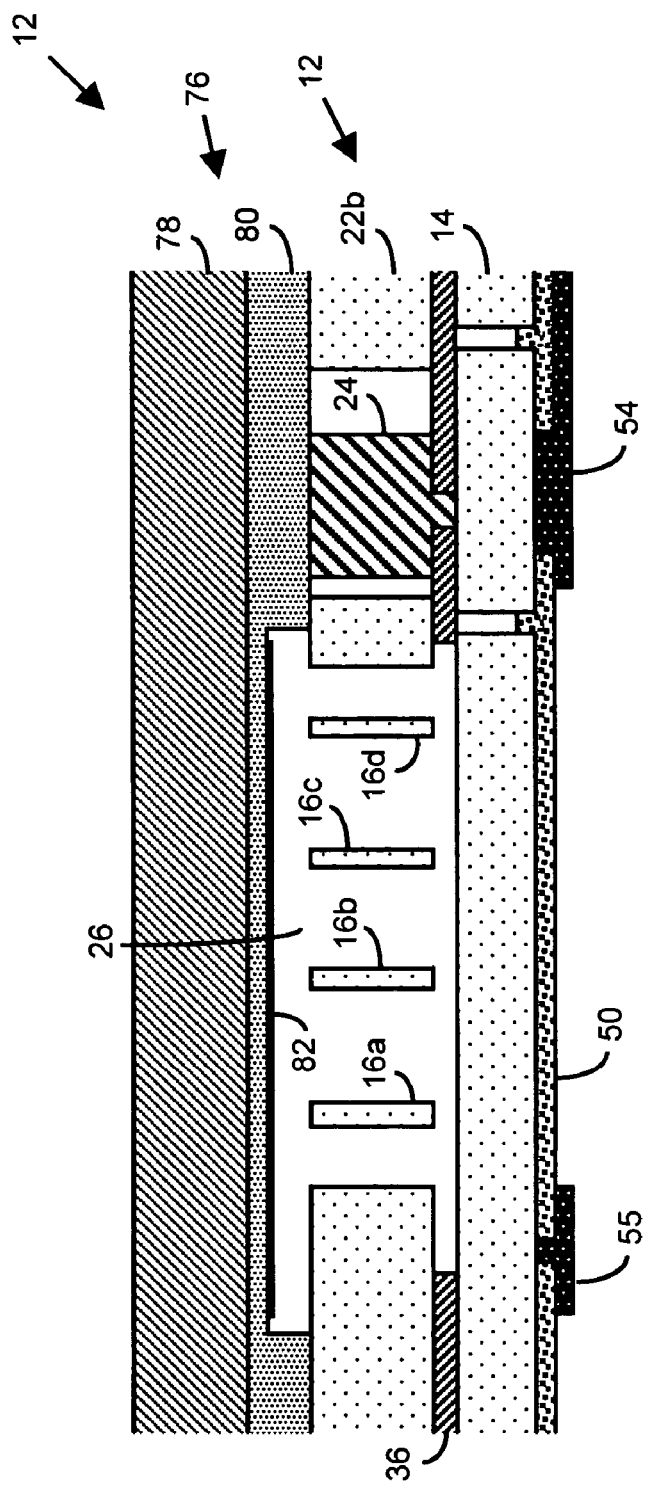

With reference to FIGS. 15C and 15D, substrate 14 may be thinned (for example, to a thickness of between 20 µm to 200 µm, to facilitate contact or interconnection to contact area 24. In this regard, contact area 24 may be isolated via trenches 46a and 46b using an anisotropic etching technique (see, FIG. 15C) as described in detail above. Thereafter, an electrical path may be deposited and/or formed to interconnect contact area 24 with, for example, integrated or external electronics and/or circuitry. In this regard, conductive layer 54 may be deposited and/or formed after deposition of insulation layer 50. (See, FIG. 15D). The anti-stiction channel window 53 may also be formed and/or etched after deposition of insulation layer 50. Thereafter, the bond layer 55 may be deposited and/or formed.

Bond layer 55 may comprise any type of material, for example, metal (e.g., aluminum, chromium, gold, silver, molybdenum, platinum, palladium, tungsten, titanium, copper, and/or an alloy of one or more thereof), non-metal and/or adhesive material. In some embodiments, bond layer 55 comprises a metal bond ring or pad that is sputtered and, if necessary patterned. Bond layer 55 may also comprise a spin-on polymer, spin-on glass ("SOG"). Further, one or more portions of bond layer 55 may be formed using/from silk screening of or dispensed seal-glass, plastic and/or epoxy. In addition, a shadow mask technology may be employed to deposit and/or form bond layer 55.

Figure 15E:
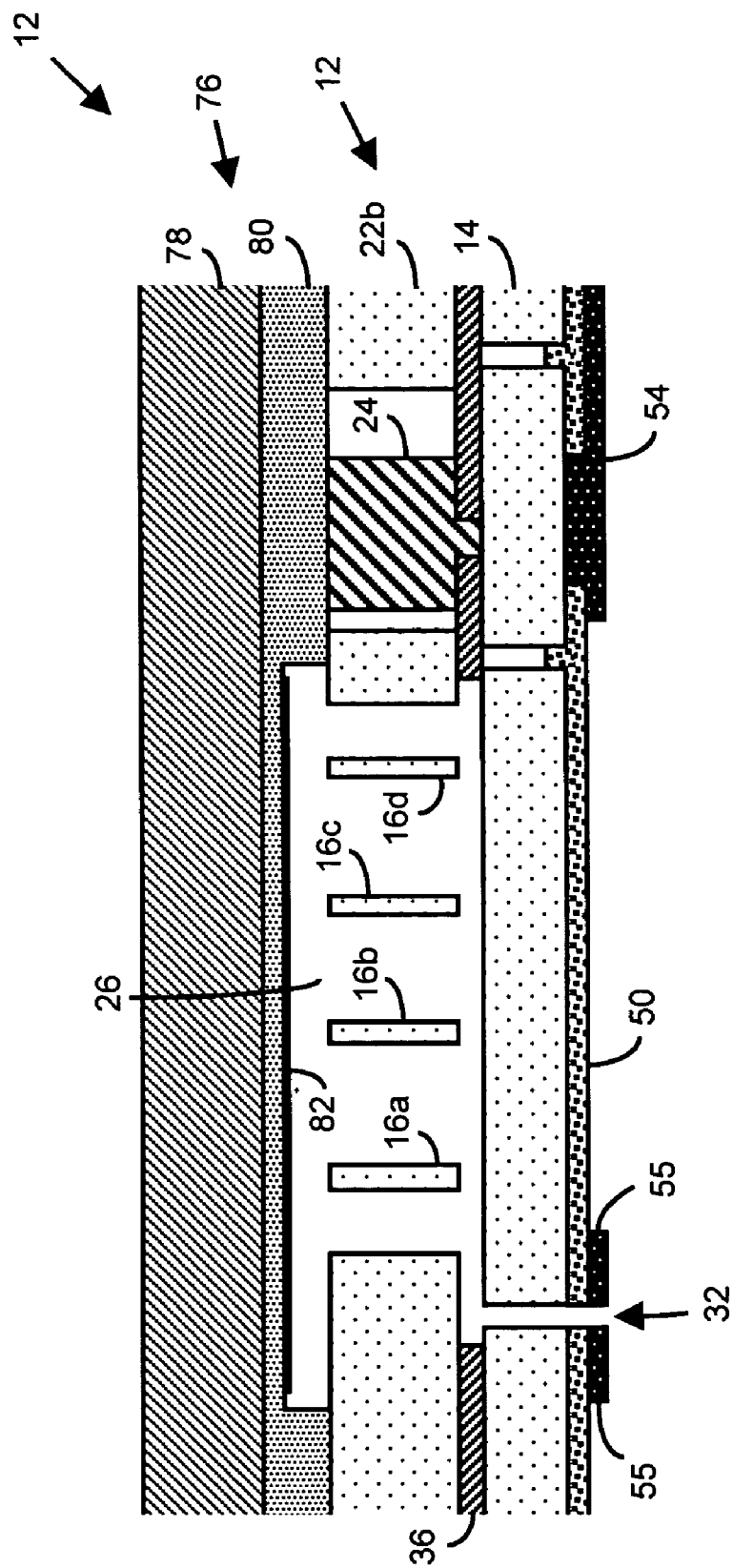
Figure 15F:
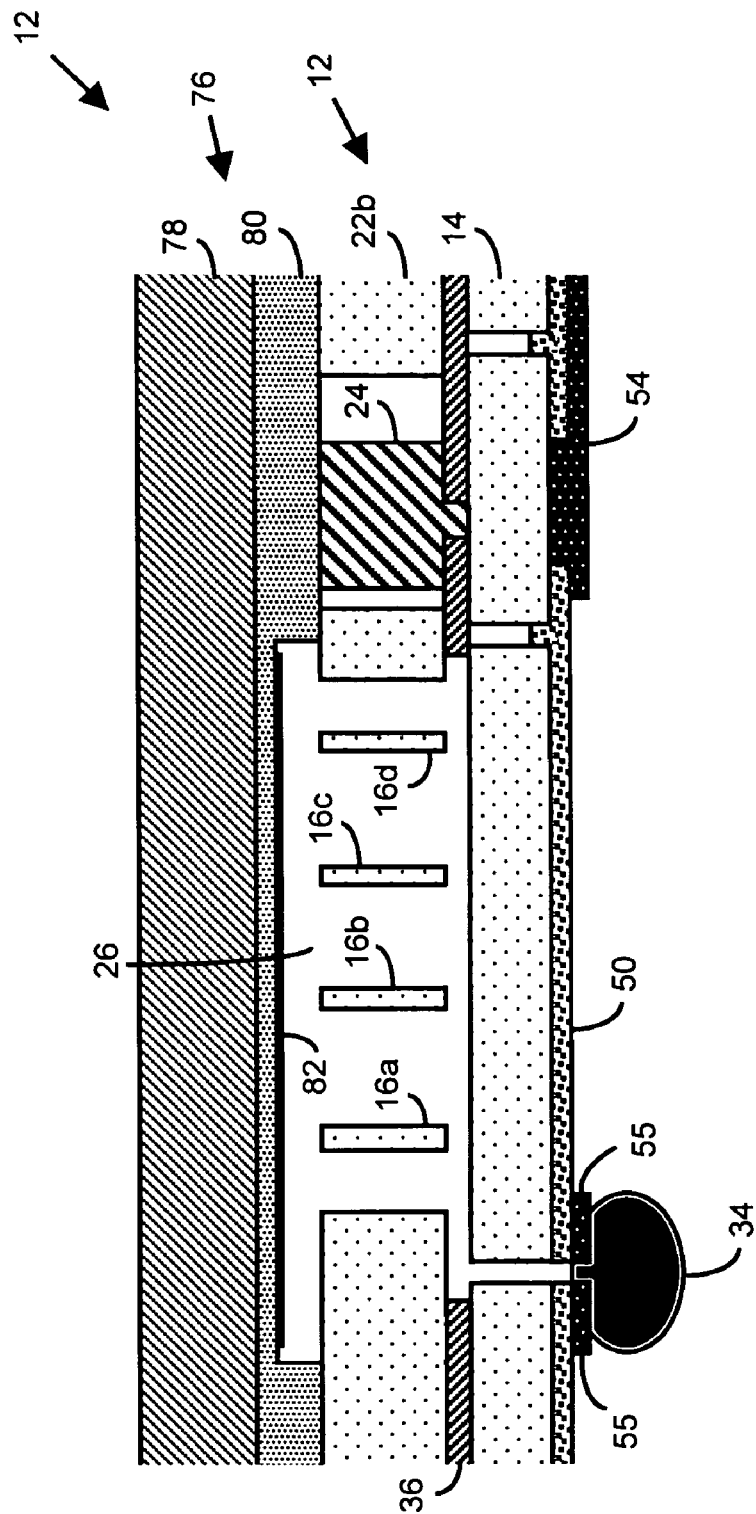
Figure 17E:
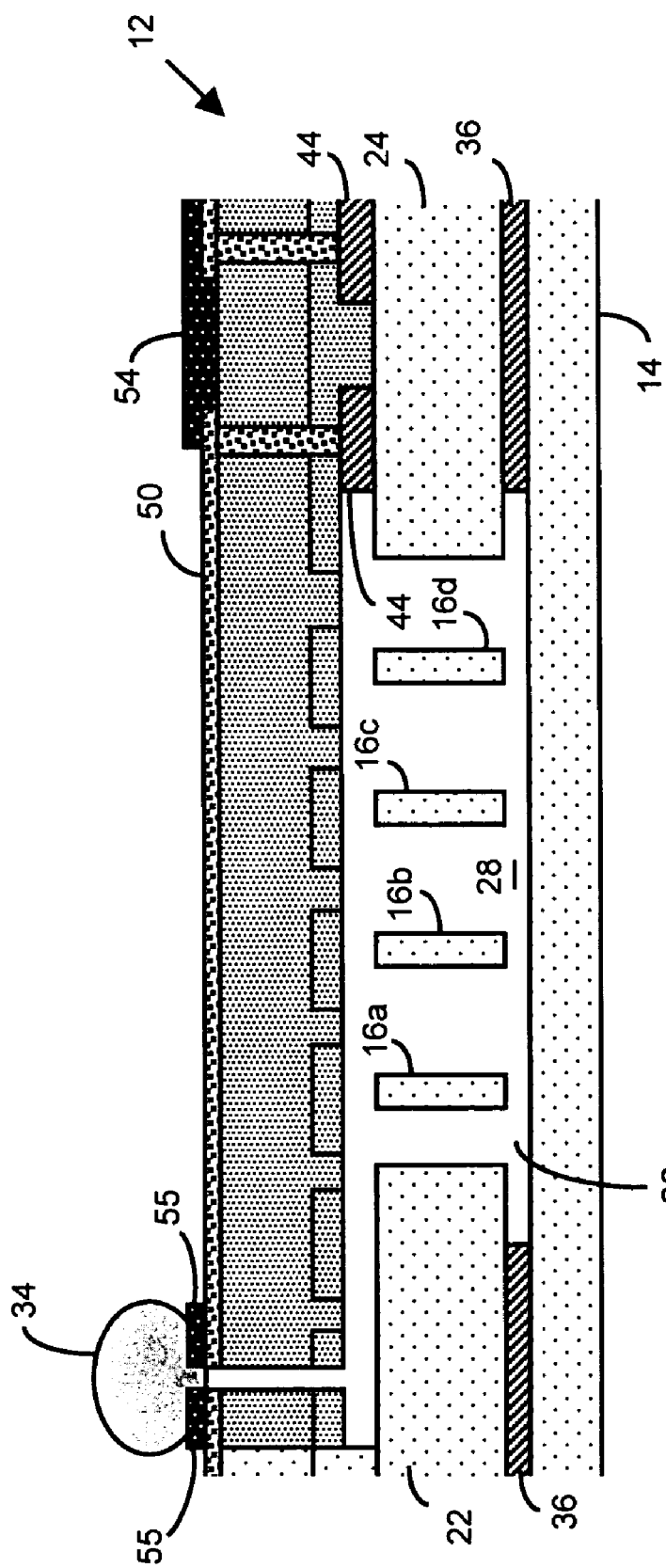

With reference to FIGS. 15E and 15F, the bond layer 55 may be etched to define an opening or through hole and to re-open the anti-stiction channel window 53. Thereafter, anti-stiction channel 32 may be formed (see, FIG. 15E), and an anti-stiction fluid may be introduced into chamber 26. The techniques described and illustrated above may be applied here.

After (or concurrently with) introduction of the anti-stiction fluid, the channel cap 34 may be provided to "seal" anti-stiction channel 32. As mentioned above, channel cap 34 may comprise, for example, a wire ball, a stud, a solder bump and/or any other member fabricated apart from MEMS 10 (e.g., as a preform) and thereafter affixed to MEMS 10. Any method(s) and/or structure(s) may be used in fabricating the channel cap 34 and/or affixing the channel cap 34 to MEMS 10. In some embodiments, a bonder, for example, a wire ball bonder or other type of wire bonder such as, for example, a wedge, is used to ultrasonically bond the cap 34 to the bond layer 55. The wire ball bonder may be, for example, a "bumper" type ball bonder designed for use in placement and/or bonding of balls without wires. The channel cap 34 may also be fabricated directly on, and/or integrally with, the bond layer 55 and/or one or more other portions of MEMS 10.

The channel cap 34 may be formed of any material or combination of materials that seals, plugs and/or closes anti-stiction channel 32. For example, channel cap 34 may be a metal material, a spin-on polymer, spin-on glass (SOG), or combination(s) of one or more of the above. Moreover, channel cap 34 may be formed using/from silk screening of or dispensed seal-glass, plastic and/or epoxy. Further, in some embodiments, the channel cap 34 may be employed without the bond layer 55. Indeed, any material (and corresponding fabrication technique) and configuration may be implemented that, in one embodiment, provides a barrier to maintain a suitable environment in chamber 26 and is formed, applied and/or grown using parameters (for example, a temperature) that will not (1) destroy and/or obliterate the anti-stiction affects provided by the anti-stiction fluid (for example, destruction of the monolayer coating on the mechanical structures) and/or (2) prevent the anti-stiction technique of the present invention from providing suitable anti-stiction characteristics.

Notably, as described above, a diffusion barrier may be incorporated to enhance the "seal" of chamber 26. The diffusion barrier alone, or in combination with channel cap 34, "traps" the fluid (having a selected, desired and/or predetermined state) in chamber 26. Thus, after sealing and/or closing anti-stiction channel 32, mechanical structures 16a-d retain suitable anti-stiction characteristics and/or properties.

It should be further noted that all of the anti-stiction techniques described and illustrated in connection with the thin film wafer fabrication (for example, FIGS. 2, 5, 8A and 8B) may be applied to the wafer bonded encapsulation embodiment. For the sake of brevity, those discussions will not be repeated.

There are many inventions described and illustrated herein. While certain embodiments, features, materials, configurations, attributes and advantages of the inventions have been described and illustrated, it should be understood that many other different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present inventions.

For example, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E) or simultaneously (see, for example, FIGS. 3H). Moreover, the anti-stiction fabrication/processes may be performed after deposition of conductive layer 54 (see, for example, FIGS. 3I-3N, FIGS. 17A-17E) or before fabrication or deposition of conductive layer 54 (see, for example, FIGS. 16B-16F).

Indeed, anti-stiction channel 32 may be comprised of a plurality of channels etched in substrate 14, encapsulation layer(s) 30 and/or wafer bonded encapsulation structure 76. The channels may be located at selected sites to more efficiently, fully and/or evenly provide the anti-stiction fluid within chamber and thereby more efficiently, fully and/or evenly/conformally provide an anti-stiction layer (for example, a monolayer coating or self-assembled monolayer) on micromachined mechanical structure 12. In this regard, the anti-stiction channels 32 may be, for example, evenly situated or placed around substrate 14, encapsulation layer(s) 30 and/or wafer bonded encapsulation structure 76, or distributed according to the relative concentration of structures 16 (for example, more channels 32 concentrated in regions or areas of dense mechanical structures and/or less channels 32 concentrated in regions or areas of less "populated" by mechanical structures).

In addition, it may be advantageous to locate the anti-stiction channels 32 in accordance with regions or areas where the mechanical structures are more likely to contact other structures or elements of micromachined mechanical structure 12 and/or are more susceptible to the debilitating effects of stiction. In this way, the anti-stiction fluid is more likely to efficiently, fully and/or evenly/conformally provide an anti-stiction layer (for example, a monolayer coating or self-assembled monolayer) on such mechanical structures of micromachined mechanical structure 12.

Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, FIGS. 20A and 20B).

Figure 18A:
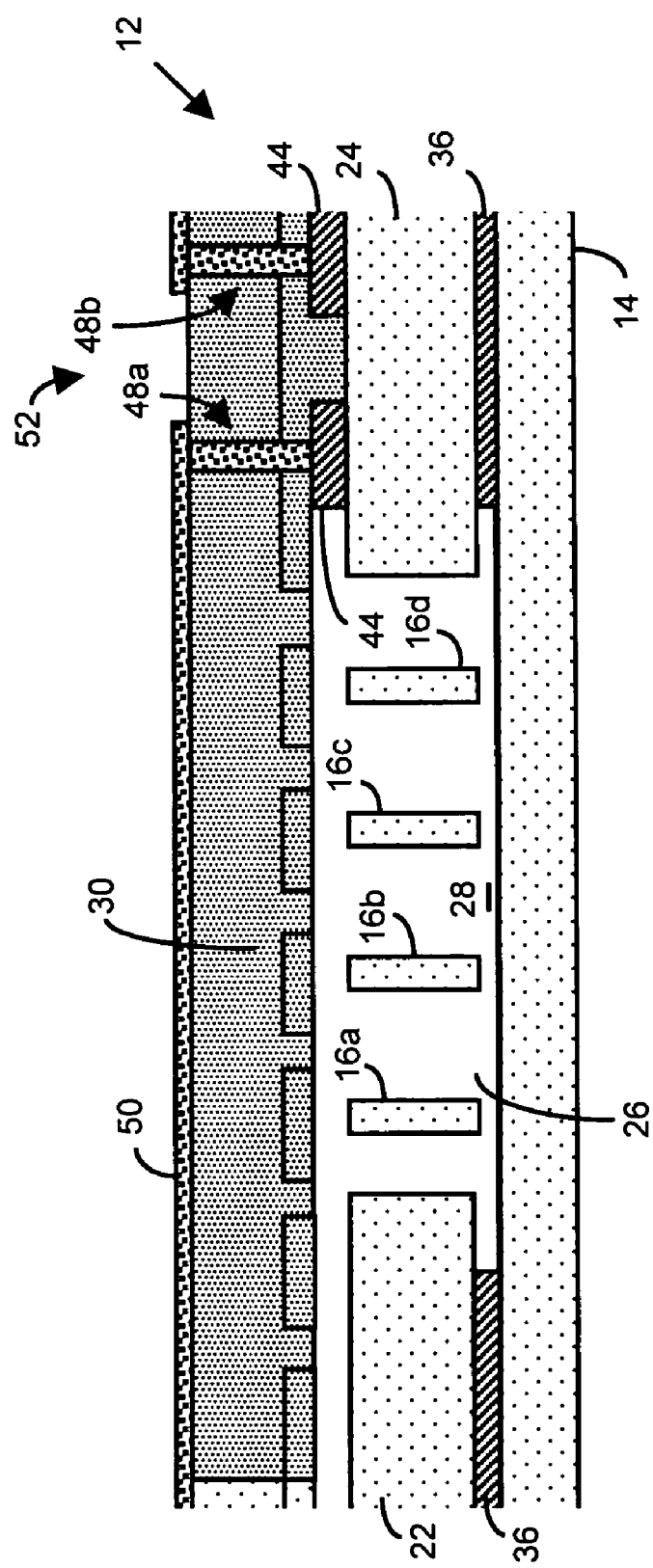

In one embodiment, anti-stiction window 53 is formed after deposition and/or formation of the bond layer 55. For example, with reference to FIG. 18A, after fabrication of structure 12 in accordance with FIGS. 3A-3G, the insulation layer 50 may be formed and thereafter etched to form contact opening 52 without formation of anti-stiction window.

With reference to FIG. 18B, conductive layer may thereafter be deposited and/or formed. Conductive layer may be patterned to form conductive layer 54, which provides electrical connection to contact 24, and to form the bond layer 55 and define opening or through hole in bond layer 55.

With reference to FIG. 18C, the anti-stiction window may then be formed in the insulation layer 50. The fabrication of structure 12 and employment of anti-stiction techniques may thereafter proceed, for example, in accordance with FIGS. 3K-3N. Notably, the bond layer 55 may be used as a hard mask during etching of the anti-stiction channel, which may be advantageous to help align the anti-stiction channel with the base portion of the channel cap 34 (i.e., to help align the edge of the anti-stiction channel with the edge of the base).

Figure 21A:
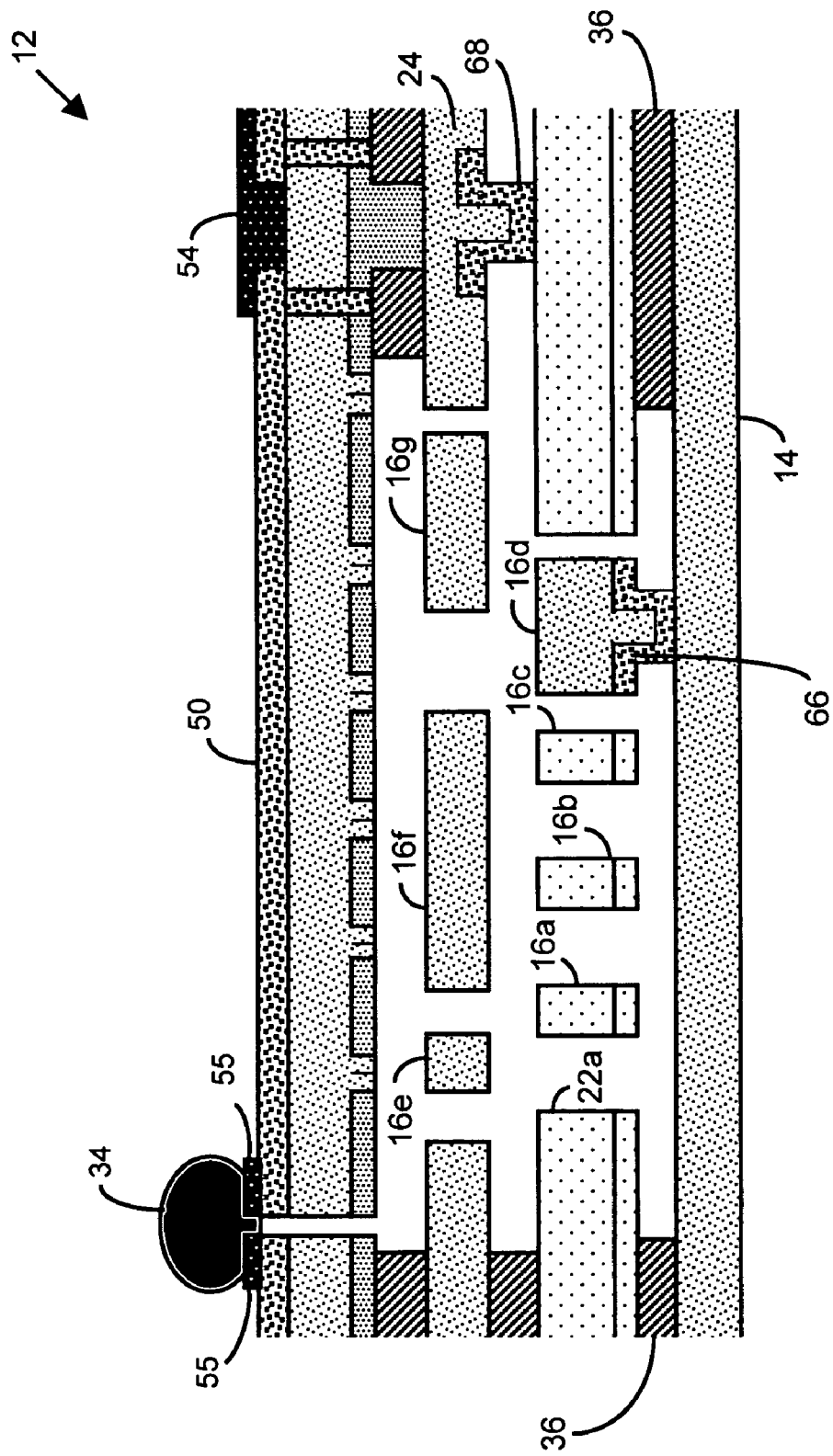
FIGS. 21A and 21B illustrate cross-sectional views of a micromechanical structure, having a plurality of microstructures and a contact, which are monolithically integrated on or within the substrate of a MEMS, in accordance with certain aspect of the present invention.
Figure 21B:
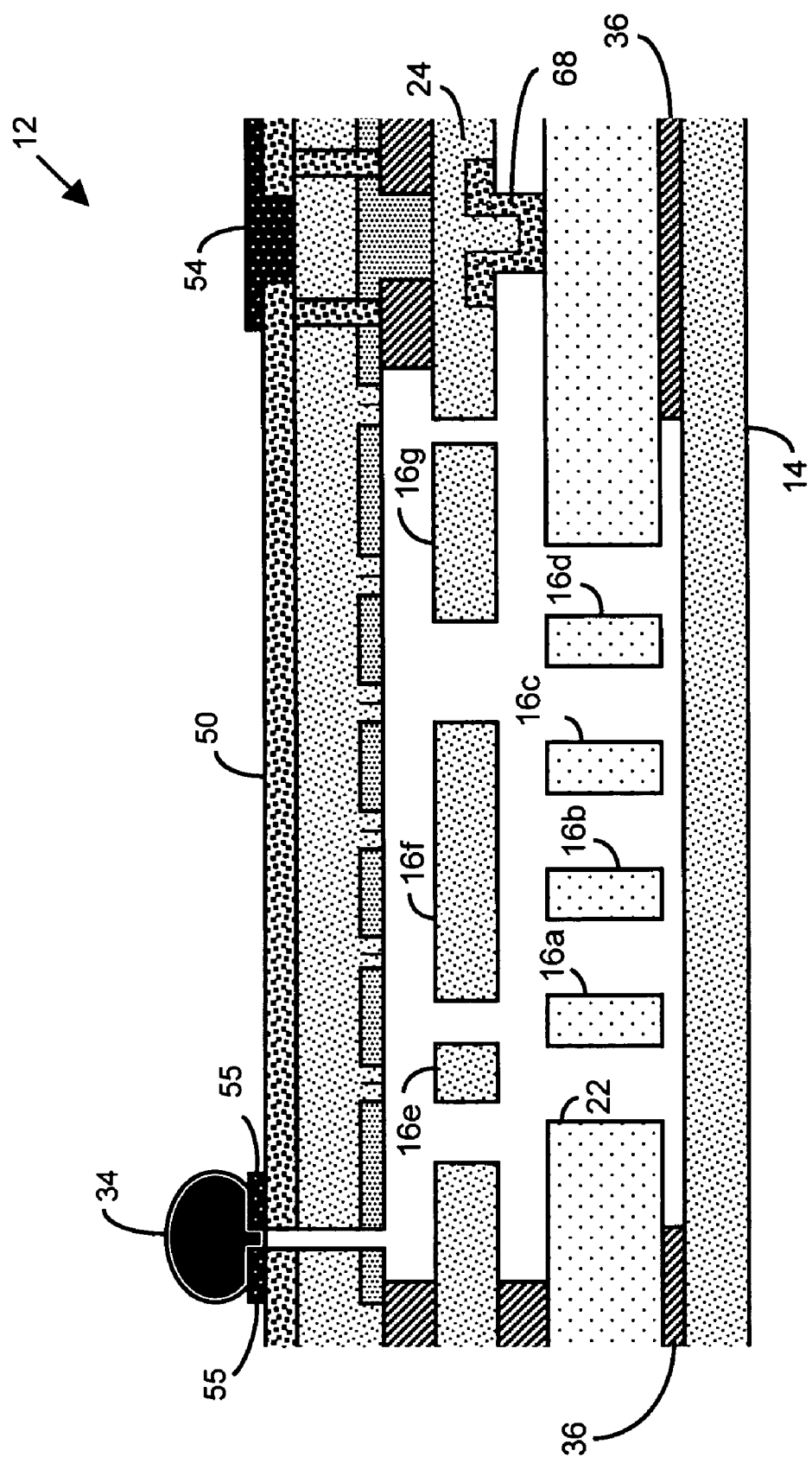

In addition, as mentioned above, the anti-stiction techniques described herein may be implemented in conjunction with micromachined mechanical structures 12 having one or more transducers or sensors which may themselves include multiple layers that are vertically and/or laterally stacked or interconnected as illustrated in Microelectromechanical Systems and Method of Encapsulating Patent Application and/or Microelectromechanical Systems Having Trench Isolated Contacts Patent Application. Accordingly, any and all of the anti-stiction inventions and/or embodiments illustrated and described herein may be implemented in the embodiments of Microelectromechanical Systems and Method of Encapsulating Patent Application and/or Microelectromechanical Systems Having Trench Isolated Contacts Patent Application that include multiple layers of mechanical structures, contacts areas and buried contacts that are vertically and/or laterally stacked or interconnected (see, for example, micromachined mechanical structure 12 of FIGS. 11B, 11C and 11D of Microelectromechanical Systems and Method of Encapsulating Patent Application and/or micromachined mechanical structure 12 of FIGS. 13B, 13C and 13D of Microelectromechanical Systems Having Trench Isolated Contacts Patent Application). Under this circumstance, the MEMS 10 may be fabricated using the anti-stiction techniques described in this application wherein the mechanical structures include one or more processing steps to provide the vertically and/or laterally stacked and/or interconnected multiple layers (see, for example, FIGS. 21A and 21B).

Thus, any of the techniques, materials and/or embodiments of fabricating and/or encapsulating micromachined mechanical structure 12 that are described in the Microelectromechanical Systems and Method of Encapsulating Patent Application and/or in the Microelectromechanical Systems Having Trench Isolated Contacts Patent Application may be employed with the embodiments and/or the inventions described herein.

Moreover, the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, with reference to FIGS. 21A and 21B, in one embodiment, anchors 66 and/or 68 may be comprised of a material that is relatively unaffected by the release processes of the mechanical structures. In this regard, the etch release process are selective or preferential to the material(s) securing mechanical structures 16 in relation to the material comprising anchors 66. Moreover, anchors 66 and/or 68 may be secured to substrate 14 in such a manner that removal of insulation layer 50 has little to no affect on the anchoring of mechanical structures 16 to substrate 14.

It should be noted that the embodiments described herein may be incorporated into MEMS 10 described and illustrated in Anchors for Microelectromechanical Systems Patent Application. For the sake of brevity, the inventions and/or embodiments described and illustrated in the Anchors for Microelectromechanical Systems Patent Application, implemented in conjunction with the anti-stiction inventions described and illustrated herein, will not be repeated. It is expressly noted, however, that the entire contents of the Anchors for Microelectromechanical Systems Patent Application, including, for example, the features, attributes, alternatives, materials, techniques and advantages of all of the embodiments and/or inventions, are incorporated by reference herein.

Figure 22:
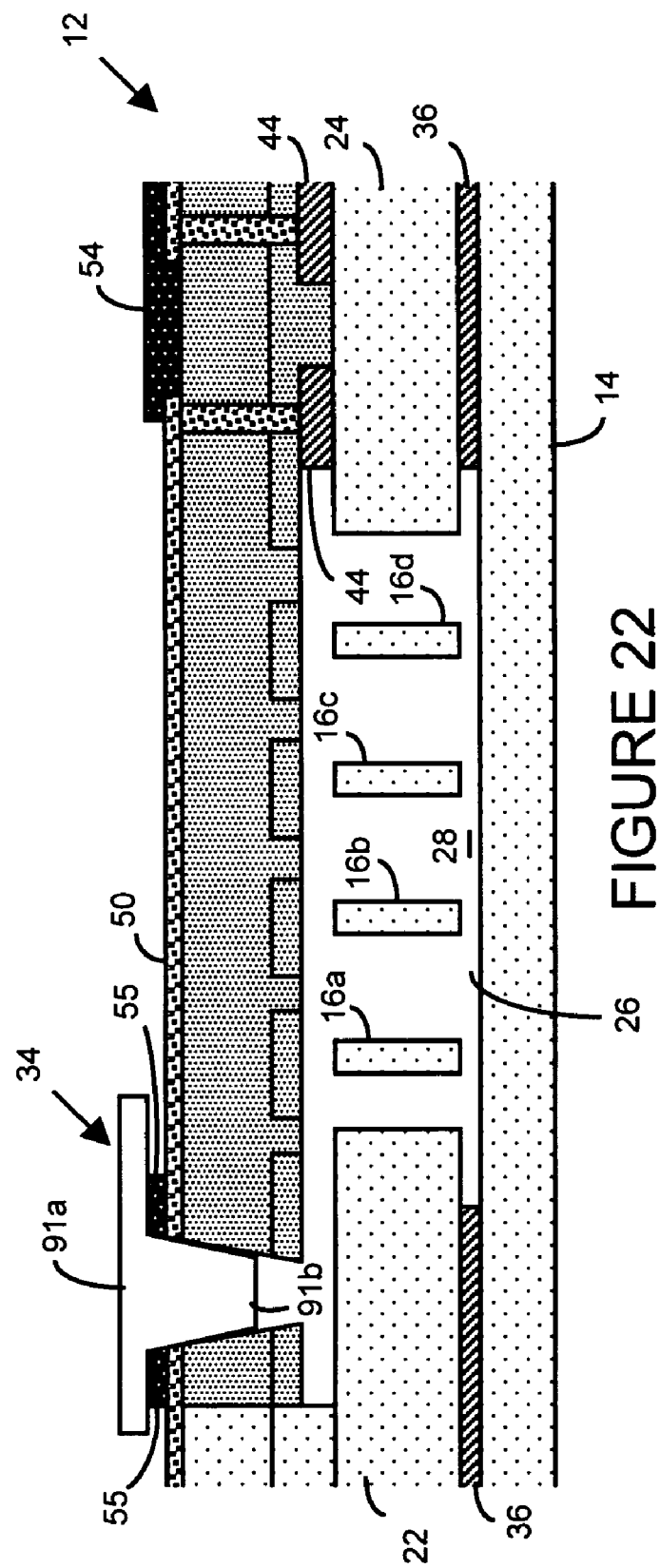
FIG. 22 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.

In another aspect, a channel cap 34 may be inserted into the anti-stiction channel 32 to "close" and/or "seal" the anti-stiction channel 32. In this regard, with reference to FIG. 22, MEMS 10 includes micromachined mechanical structure 12, an anti-stiction channel and a channel cap 34. Micromachined mechanical structure 12 may be fabricated using one or more of the methods disclosed herein and/or any other suitable technique. Anti-stiction channel 32 may thereafter be formed and an anti-stiction fluid may be introduced into the chamber. Channel cap 34 may thereafter be inserted into anti-stiction channel 32 to "close" and/or "seal" the channel 32.

Figure 23A:
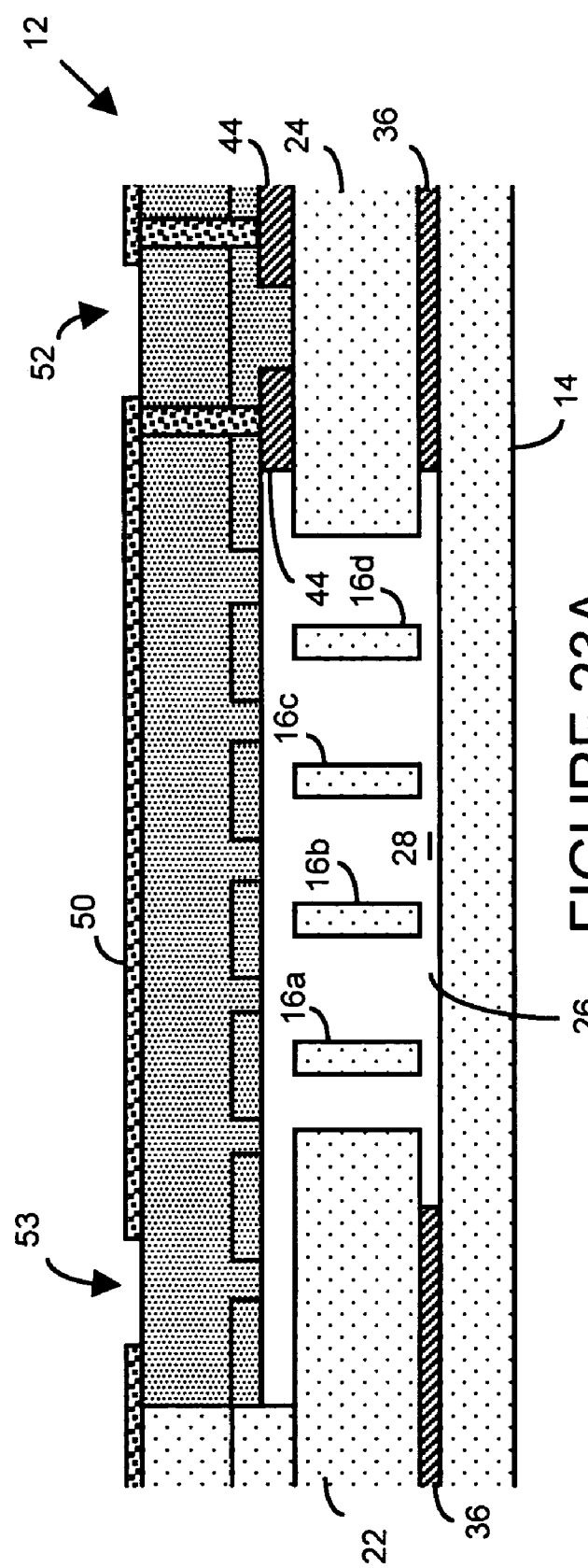

The anti-stiction channel may be tapered (e.g., a conical) to define a "diameter" or "width" 90 (FIG. 23D) that decreases along one or more portions of the channel. Notably, the "diameter" or "width" of anti-stiction channel 32 may depend on the thickness of the encapsulation layer(s) 30. In one embodiment, the "diameter" or "width" may be between 100 nm to 50 µm and preferably between 200 nm and 10 µm.

Channel cap 34 may have first and second portions 91*a*, 91*b*. The first portion 91*a* may be disposed outside the anti-stiction channel 32 and may have dimensions that prevent such portion from being inserted into the anti-stiction channel 32. The second portion 91*b* may be received within the anti-stiction channel and may have a contour that corresponds, at least in part, to the contour of the anti-stiction channel 32. One or more portions of the first portion 91*a* may contact and/or seal with the bond layer 55 and/or other portion(s) of MEMS 10. One or more portions of the second portion 91*b* may contact and/or seal against the surface(s) 92 (FIG. 23D) that define the anti-stiction channel 32. In that regard, the second portion of the channel cap 91b may be "oversized" for corresponding portions of the anti-stiction channel 32 (i.e., one or more portions of the second portion 91*b* may have dimension(s) that are greater than the dimension(s) of corresponding portions of the anti-stiction channel 32) so that force is needed to insert the second portion 91*b* into the anti-stiction channel 32. In one embodiment, for example, the second portion 91*b* of channel cap has a "diameter" or "width" 94 that is greater than the "diameter" or "width" of corresponding portions of anti-stiction channel 32. Oversizing may help facilitate a seal between the surface(s) of the second portion 91*b* and the surface(s) (e.g., surfaces 92 FIG. 23D) that define the anti-stiction channel 32.

Notably, some embodiments may employ the second portion 91*b* of the cap 34 without the first portion 91*a*, while other embodiments may employ the first portion 91*a* of the cap 34 without the second portion 91*b*. The channel cap 34 may also be fabricated directly on, and/or integrally with, the bond layer 55 and/or one or more other portions of MEMS 10.

In one embodiment, fabrication of MEMS 10 begins as set forth above with respect to MEMS 10 (see FIGS. 3A-3G). Thereafter, with reference to FIG. 23A, contact opening 52 and anti-stiction channel window 53 are formed and/or etched in insulation layer 50, for example, using conventional etching techniques. Contact opening 52 facilitates electrical connection to contact area 24. Anti-stiction channel window 53 defines, at least in part, the location where the anti-stiction channel 32 is to be formed.

With reference to FIG. 23B, a conductive layer is then deposited and/or formed. Thereafter, the conductive layer is patterned to define a conductive layer 54 and to define a bond layer 55 over the location where the anti-stiction window is to be formed.

With reference to FIG. 23C, the bond layer 55 is etched to define a through hole and re-open at least a portion of the anti-stiction channel window 53.

With reference to FIG. 23D, anti-stiction channel 32 is thereafter formed through encapsulation layer(s) 30 to provide access to mechanical structures 16*a-d*. The anti-stiction channel 32 may be formed using, for example, well-known anisotropic etching techniques (for example, deep reactive ion etching and/or deep silicon trench etching).

After formation of anti-stiction channel 32, an anti-stiction fluid may be introduced into chamber 26. The anti-stiction fluid may be, for example, DDMS, OTS, PFOTCS, PFDA, FDTS, PFPE and/or FOTS. Indeed, any anti-stiction fluid may be employed provided that the subsequent processes do not destroy the anti-stiction characteristics and/or destroy or obliterate the anti-stiction deposition on mechanical structures 16*a-d* of MEMS 10. In this way, the anti-stiction layer 58, for example, the monolayer coating formed on mechanical structures 16*a-d*, remains relatively intact and mechanical structures 16*a-d* include suitable anti-adhesive properties to overcome the adhesive forces of adjacent structures or elements in MEMS 10.

With reference to FIG. 23E-23G, anti-stiction channel 32 may be "closed" and/or "sealed" via channel cap 34. Any method(s) and/or structure(s) may be used in fabricating and/or employing the channel cap 34.

For example, with reference to FIG. 23E, channel cap 34 may be positioned and/or formed on a wafer 96 (e.g., by electroplating the channel cap 34 (or portion thereof) onto a wafer 96 and/or by stamping the cap 34 (or portion thereof) onto a wafer 96). The wafer 96 and/or MEMS 10 may thereafter be positioned such that the channel cap 34 is aligned with the anti-stiction channel. In some embodiments, channel cap 34 yield may be increased and alignment may be made easier by increasing the diameter of the channel cap 34.

With reference to FIG. 23F, a pressure and temperature cycle may thereafter be employed to insert the channel cap 34 into the anti-stiction channel. For example, pressure may be used to drive the wafer 96 toward the anti-stiction channel 32 until the second portion 34*b* of the cap 34 is received within the anti-stiction channel 32 and a desired amount of contact between the channel cap 34 and MEMS 10 is achieved. Heat may be provided before, during, and/or after the application of pressure so as to assist in this process of inserting the cap 34 and/or to assist otherwise in the "closing" and/or "sealing" of the channel 32.

With reference to FIG. 23G, after the pressure and temperature cycle, the wafer 96 may be separated from the cap 34 (e.g., the wafer may be sheared off from the cap 34 and/or the cap 34 may be sheared from the wafer) leaving the cap 34 in the anti-stiction channel to seal and/or close the channel.

The channel cap 34 may be formed of any material or combination of materials that seals, plugs and/or closes anti-stiction channel 32. For example, channel cap 34 may be a metal material, a spin-on polymer, spin-on glass (SOG), or combination(s) of one or more of the above. Moreover, channel cap 34 may be formed using/from silk screening of or dispensed seal-glass, plastic and/or epoxy. Further, in some embodiments, the channel cap 34 may be employed without the bond layer 55. Indeed, any material (and corresponding fabrication technique) and configuration may be implemented that, in one embodiment, provides a barrier to maintain a suitable environment in chamber 26 and is formed, applied and/or grown using parameters (for example, a temperature) that will not (1) destroy and/or obliterate the anti-stiction affects provided by the anti-stiction fluid (for example, destruction of the monolayer coating on the mechanical structures) and/or (2) prevent the anti-stiction technique of the present invention from providing suitable anti-stiction characteristics.

As stated above, anti-stiction channel 32 may be comprised of a plurality of channels 32 etched in substrate 14, encapsulation layer(s) 30 and/or wafer bonded encapsulation structure 76. The channels 32 may be located at selected sites to more efficiently, fully and/or evenly provide the anti-stiction fluid within chamber and thereby more efficiently, fully and/or evenly/conformally provide an anti-stiction layer (for example, a monolayer coating or self-assembled monolayer) on micromachined mechanical structure 12. In this regard, the anti-stiction channels 32 may be, for example, evenly situated or placed around substrate 14, encapsulation layer(s) 30 and/or wafer bonded encapsulation structure 76, or distributed according to the relative concentration of structures 16 (for example, more channels 32 concentrated in regions or areas of dense mechanical structures and/or less channels 32 concentrated in regions or areas of less "populated" by one or more mechanical structures).

Figure 24:
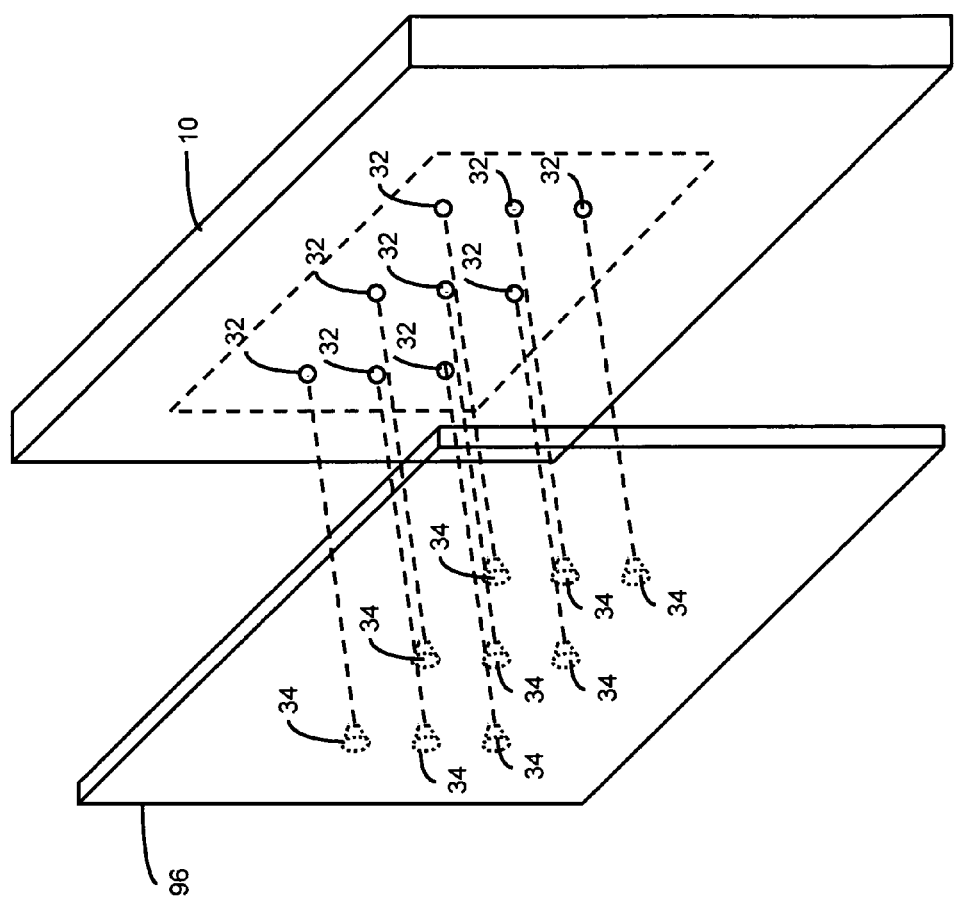
FIG. 24 illustrates a schematic view of a wafer supporting a plurality of anti-stiction plugs or caps in conjunction with a MEMS having a plurality of anti-stiction channels to be closed and/or sealed by the plugs or caps, according to certain aspects of the present invention.

With reference to FIG. 24, in some embodiments, a plurality of channel caps 34 are provided on a single wafer 96 so that a plurality of anti-stiction channels 32 may be "closed" and/or "sealed" using a single wafer and/or one pressure/temperature cycle. The plurality of caps 34 may be fabricated sequentially, simultaneously or a combination thereof. The channel caps 34 may be arranged in a pattern that corresponds to the pattern of the anti-stiction channels 32 to be sealed thereby. For example, if the anti-stiction channels 32 are arranged in a grid pattern, the caps 34 are preferably arranged in a grid pattern that corresponds thereto. In preparation for closing and/or sealing the channels 32, the wafer 96 may be positioned such that each cap 34 is aligned with a respective one of the anti-stiction channels 32. A pressure and temperature cycle may be employed to insert the channel cap 34 into the anti-stiction channel 32. After the pressure and temperature cycle, the wafer 96 is sheared off from the caps 34 (and/or the caps 34 are sheared from the wafer) leaving the caps 34 in the anti-stiction channels 32 to seal and/or close the channels 32.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order is merely exemplary and should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

Figure 25:
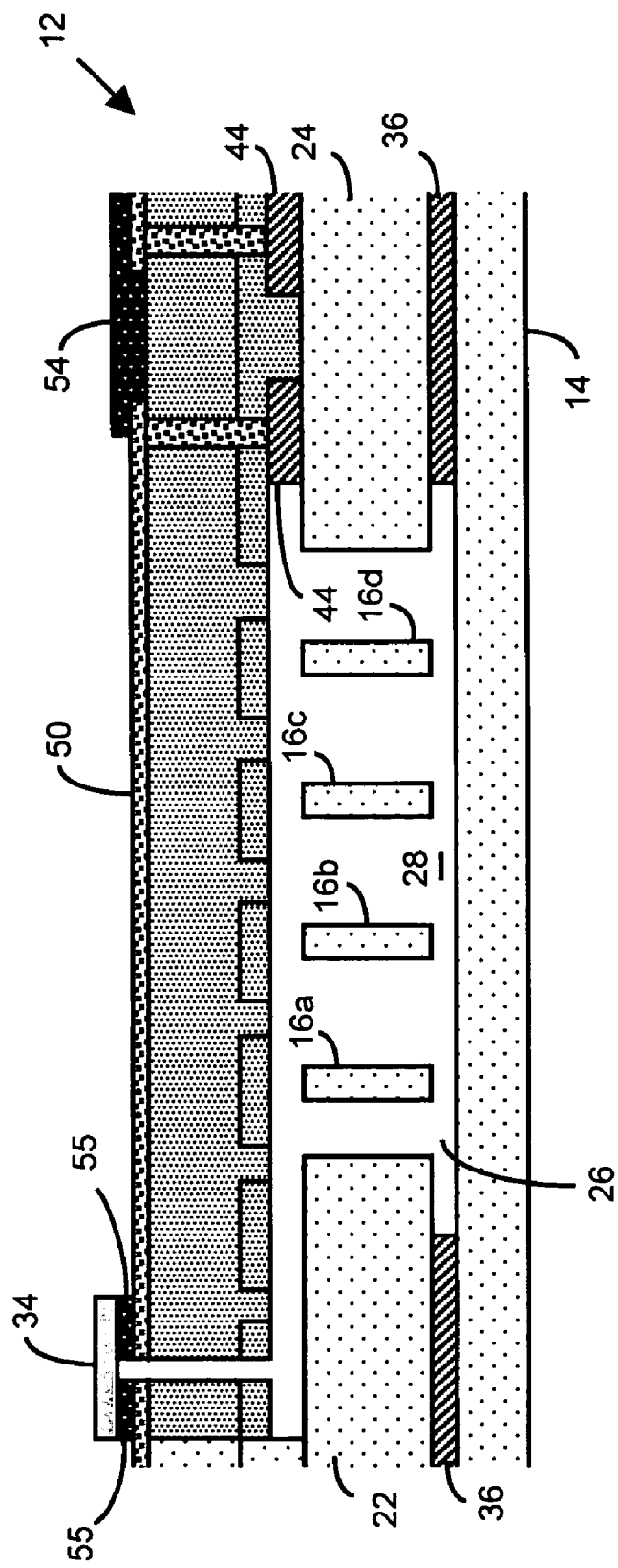
FIG. 25 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.

In another aspect, a channel cap 34 comprising a metal foil is used to "close" and/or "seal" the channel 32. In this regard, with reference to FIG. 25, MEMS 10 includes micromachined mechanical structure 12, an anti-stiction channel and a channel cap 34. Micromachined mechanical structure 12 may be fabricated using one or more of the methods disclosed herein and/or any other suitable technique. Anti-stiction channel 32 may thereafter be formed and an anti-stiction fluid may be introduced into the chamber. The channel cap 34 may thereafter be provided over the anti-stiction channel, at least in part, to "close" and/or "seal" the channel 32.

In one embodiment, fabrication of MEMS 10 begins as set forth above with respect to MEMS 10 (see FIGS. 3A-3K). With reference to FIG. 26A, an anti-stiction fluid may thereafter be introduced into chamber 26. The anti-stiction fluid may be, for example, DDMS, OTS, PFOTCS, PFDA, FDTS, PFPE and/or FOTS. Indeed, any anti-stiction fluid may be employed provided that the subsequent processes do not destroy the anti-stiction characteristics and/or destroy or obliterate the anti-stiction deposition on mechanical structures 16*a-d* of MEMS 10. In this way, the anti-stiction layer 58, for example, the monolayer coating formed on mechanical structures 16*a-d*, remains relatively intact and mechanical structures 16*a-d* include suitable anti-adhesive properties to overcome the adhesive forces of adjacent structures or elements in MEMS 10.

With reference to FIG. 26B, the anti-stiction channel 32 is thereafter "closed" and/or "sealed" via the channel cap 34. The channel cap 34 may comprise any type of metal foil comprising any type of metal, for example, aluminum, chromium, gold, silver, molybdenum, platinum, palladium, tungsten, titanium, copper, and/or an alloy of one or more thereof. In some embodiments, the metal foil is formed using an extrusion process.

In some embodiments, channel cap 34 is fabricated as a preform apart from MEMS 10 and thereafter affixed (for example by bonding, welding, adhesive) to the bond layer 55 and/or other portion(s) of MEMS 10. For example, in some embodiments, channel cap 34 is positioned over the anti-stiction channel and ultrasonically bonded to the bond layer 55. In another embodiment, electric current is passed through the metal foil (and/or other member) and the bond layer 55 to cause a weld between the metal foil and the bond layer 55. In yet another embodiment, heat is provided to cause one or more portions of the metal foil to melt and flow into the anti-stiction channel and thereby "close" and/or "seal" the channel. The heat may be in any form, for example, but not limited to localized laser heating and/or microwave heating.

In some other embodiments, the channel cap 34 may be fabricated directly on, and/or integrally with, one or more portions of MEMS 10.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10A-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

Figure 27:
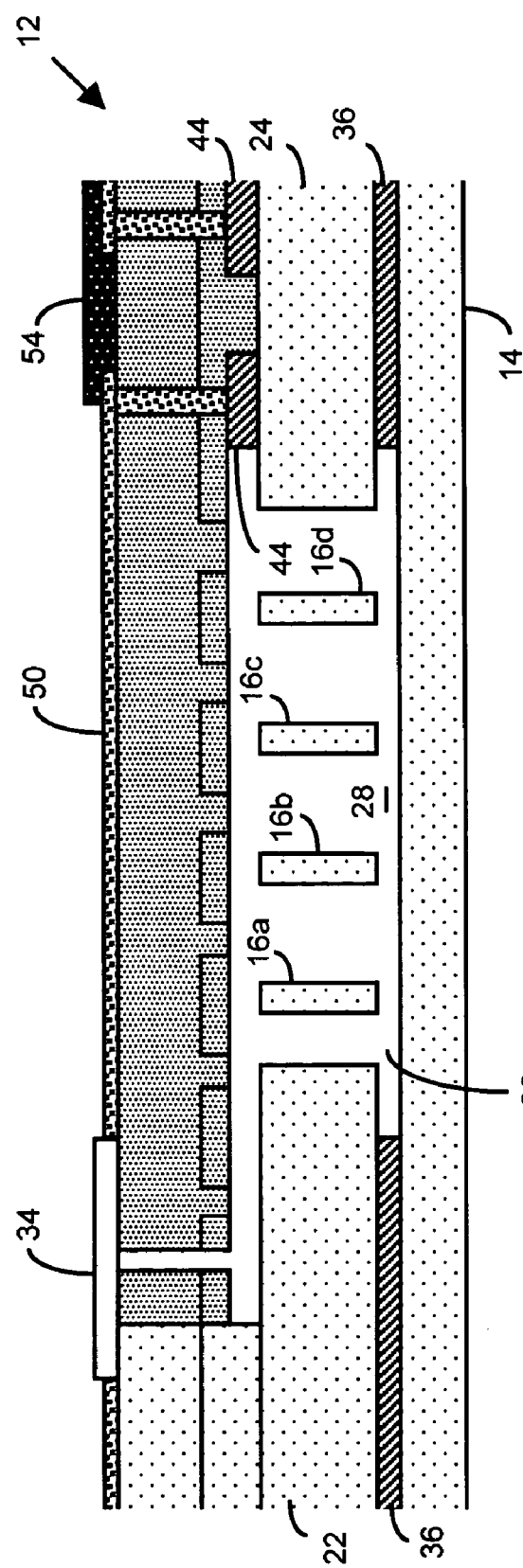
FIG. 27 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.
Figure 29:
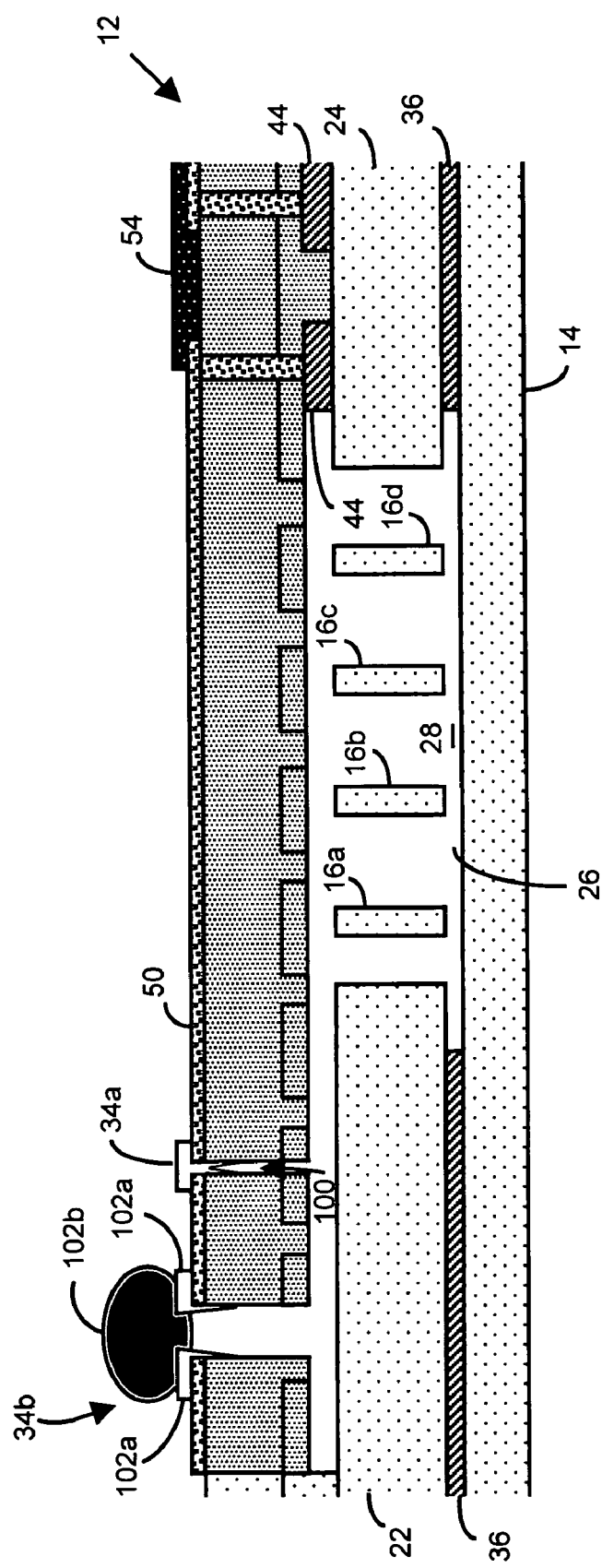
FIG. 29 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.

In another aspect, a channel cap 34 comprising a metal silicide is employed to "close" and/or "seal" the channel 32. In this regard, with reference to FIG. 27, MEMS 10 includes micromachined mechanical structure 12, an anti-stiction channel and a channel cap 34. Micromachined mechanical structure 12 may be fabricated using one or more of the methods disclosed herein and/or any other suitable technique. Anti-stiction channel 32 may thereafter be formed and an anti-stiction fluid may be introduced into the chamber. A channel cap 34 comprising a metal silicide is thereafter employed to "close" and/or "seal" the channel 32.

In one embodiment, fabrication of MEMS 10 begins as set forth above with respect to MEMS 10 (see FIGS. 3A-3G). Thereafter, with reference to FIG. 28A, contact opening 52 and anti-stiction channel window are formed and/or etched in insulation layer 50, for example, using conventional etching techniques.

With reference to FIG. 28B, a conductive layer is then deposited and/or formed. Conductive layer is patterned to define a conductive layer 54, which facilitates electrical connection to contact 24.

Thereafter, with reference to FIG. 28C, anti-stiction channel 32 is formed through encapsulation layer(s) 30 to provide access to mechanical structures 16a-d. The anti-stiction channel 32 may be formed using, for example, well-known anisotropic etching techniques (for example, deep reactive ion etching and/or deep silicon trench etching).

After formation of anti-stiction channel 32, an anti-stiction fluid may be introduced into chamber 26. The anti-stiction fluid may be, for example, DDMS, OTS, PFOTCS, PFDA, FDTS, PFPE and/or FOTS. Indeed, any anti-stiction fluid may be employed provided that the subsequent processes do not destroy the anti-stiction characteristics and/or destroy or obliterate the anti-stiction deposition on mechanical structures 16a-d of MEMS 10. In this way, the anti-stiction layer 58, for example, the monolayer coating formed on mechanical structures 16a-d, remains relatively intact and mechanical structures 16a-d include suitable anti-adhesive properties to overcome the adhesive forces of adjacent structures or elements in MEMS 10.

With reference to FIG. 28D, anti-stiction channel 32 may be "closed" and/or "sealed" via channel cap 34. Any method (s) and/or structure(s) may be used to fabricate and/or utilize the channel cap 34. In some embodiments, for example, the channel cap 34 is formed by providing metal foil over the anti-stiction channel and the exposed portions of the encapsulation layer(s). The metal foil may be fabricated as a preform, apart from MEMS 10, and/or directly on, and/or integrally with, one or more portions of MEMS 10. Heat may be provided to cause metal silicide to form at the interface between the metal foil and the encapsulation layer(s), and to thereby "close" and/or "seal" the anti-stiction channel. In some embodiments, it is desirable to keep the temperature of the wafer below 450 degrees centigrade during such heating. The heat may be in any form, for example, but not limited to, localized laser heating and/or microwave heating.

The metal foil may be any type of metal foil comprising any type of metal, for example, aluminum, chromium, gold, silver, molybdenum, platinum, palladium, tungsten, titanium, copper, and/or an alloy of one or more thereof. In addition, it may be desirable to form the metal foil of a metal that is that is able to form a metal silicide at a temperature below 450 degrees centigrade and results in a barrier to maintain a suitable environment in the chamber.

In some embodiments, the cap is disposed partially on single crystal silicon and partially on polysilicon. In some other embodiments, the channel cap is disposed solely on single crystal silicon or solely on polysilicon.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10A-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

Figure 34:
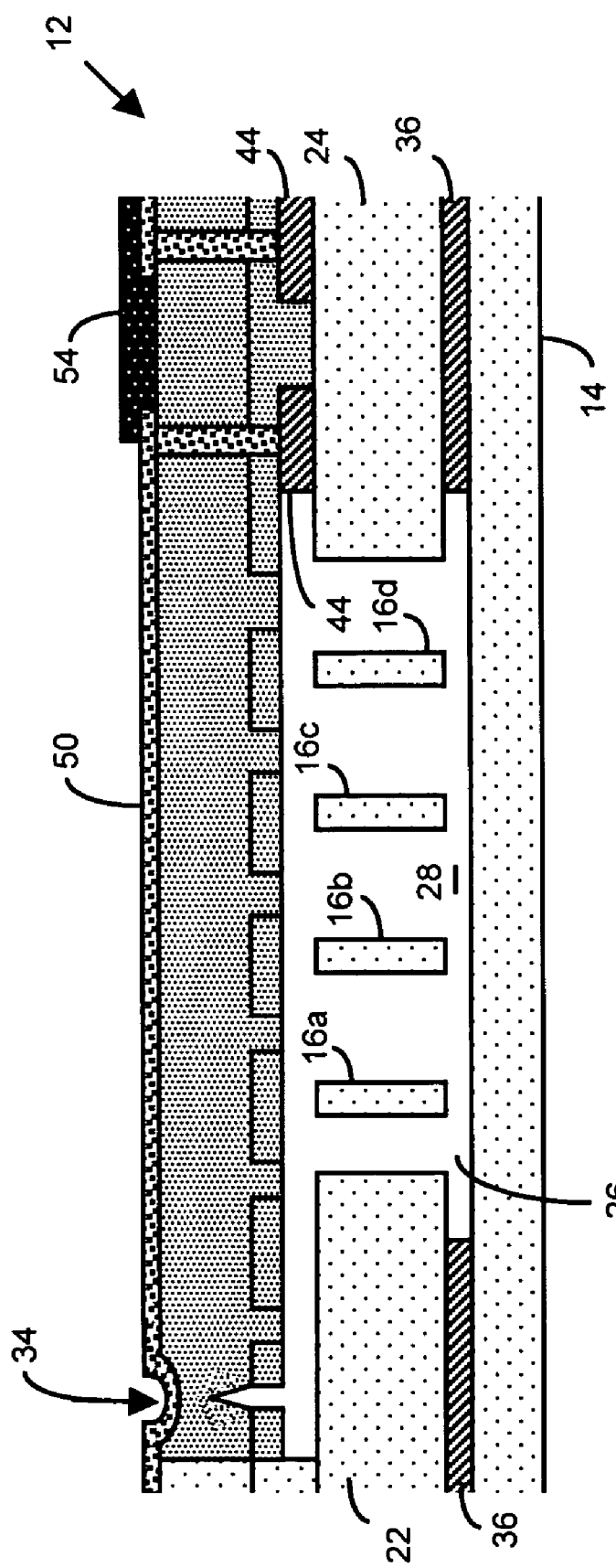
FIG. 34 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.

In another aspect, a plurality of anti-stiction channel configurations and/or channel cap configurations may be employed. In this regard, with reference to FIG. 34, MEMS 10 includes micromachined mechanical structure 12, first and second anti-stiction channels 32a, 32b, and first and second anti-stiction channel caps 34a, 34b. Micromachined mechanical structure 12 may be fabricated using one or more of the methods disclosed herein and/or any other suitable technique. First and second anti-stiction channels 32a, 32b may then be formed and anti-stiction fluid may be introduced into the chamber. Thereafter, first and second channel caps 34a, 34b may be employed over the first and second anti-stiction channels, at least in part, to "close" and/or "seal" the anti-stiction channels 32.

The second anti-stiction channel 32b may be similar to the first anti-stiction channel 32a except that the second anti-stiction channel 32b has a "width" or a "diameter" 90b (FIG. 30C) greater than a "width" or "diameter" 90a (FIG. 30C) of the first anti-stiction channel 32a (preferably, at least two times as large as a "width" or a "diameter" 90a of the first anti-stiction channel 32a).

The first channel cap 34a may comprise any material(s) that provide(s) a barrier to maintain a suitable environment in chamber 26. As described below, in one embodiment, the channel cap 34a is formed by evaporating or sputtering material from a plurality of angles relative to the anti-stiction channel 32a. In such embodiment, the first channel cap 34a may include a portion disposed within the first anti-stiction channel 32a. The end of such portion may define a cavity 100 with a tapered (e.g., conical) contour. The thickness of the evaporated or sputtered material is preferably greater than the radius or one half of the width 90a (FIG. 30C) of the first anti-stiction channel 32a. One or more portions of the first channel cap 34a may seal against the surface of the encapsulation layer(s) and/or the one or more surface(s) that define the first anti-stiction channel 32a to seal the first anti-stiction channel 32a.

The second channel cap 34b may have first and second portions 102a, 102b. The first portion 102a may be disposed circumferentially about the second anti-stiction channel 32b. The second portion 102b may be disposed over or in the second anti-stiction channel 32b, at least in part, and may be affixed to the first portion 102a. The second channel cap 34b may comprise any material(s) that provide(s) a barrier to maintain a suitable environment in chamber 26. As described below, in one embodiment, the first portion 102a is formed by evaporating or sputtering material from a plurality of angles relative to the anti-stiction channel. In such embodiment, the thickness of the evaporated or sputtered material is preferably less than the radius or one half of the width 90b (FIG. 30C) of the second anti-stiction channel 32b. The second portion 102b comprises a wire ball, a stud, a solder bump and/or other member. The wire ball, stud, solder bump and/or other member may be fabricated separately (i.e., apart) from the first portion and thereafter positioned on the first portion and/or affixed thereto (for example by bonding). In some embodiments, a wire ball bonder, or other type of wire bonder such as, for example, a wedge, may be used to ultrasonically bond the wire ball or stud, solder bump, or other member to the surface of the base portion such that the channel cap 34b seals the anti-stiction channel 32b. The wire ball bonder may be, for example, a "bumper" type ball bonder, which is designed for use in placement and/or bonding of balls without wires. In an alternative embodiment, the wire ball, stud, solder bump and/or other member may be fabricated directly on the bond layer 55 and/or fabricated integrally with the bond layer 55. Adhesive and/or conductive adhesive compounds may also be used.

In one embodiment, fabrication of MEMS 10 begins as set forth above with respect to MEMS 10 (see FIGS. 3A-3G). Thereafter, with reference to FIG. 30A, contact opening 52 and anti-stiction channel windows 53a, 53b, may be formed using, for example, conventional etching techniques, to expose portions of the encapsulation layer(s). Contact opening 52 facilitates electrical connection to contact area 24. First anti-stiction channel window 53a defines the location, at least in part, of the first anti-stiction channel 32a. Second anti-stiction channel window 53b defines the location, at least in part, of the second anti-stiction channel 32b.

With reference to FIG. 30B, a conductive layer 54 may thereafter be deposited (and/or formed) and patterned.

Figure 30C:
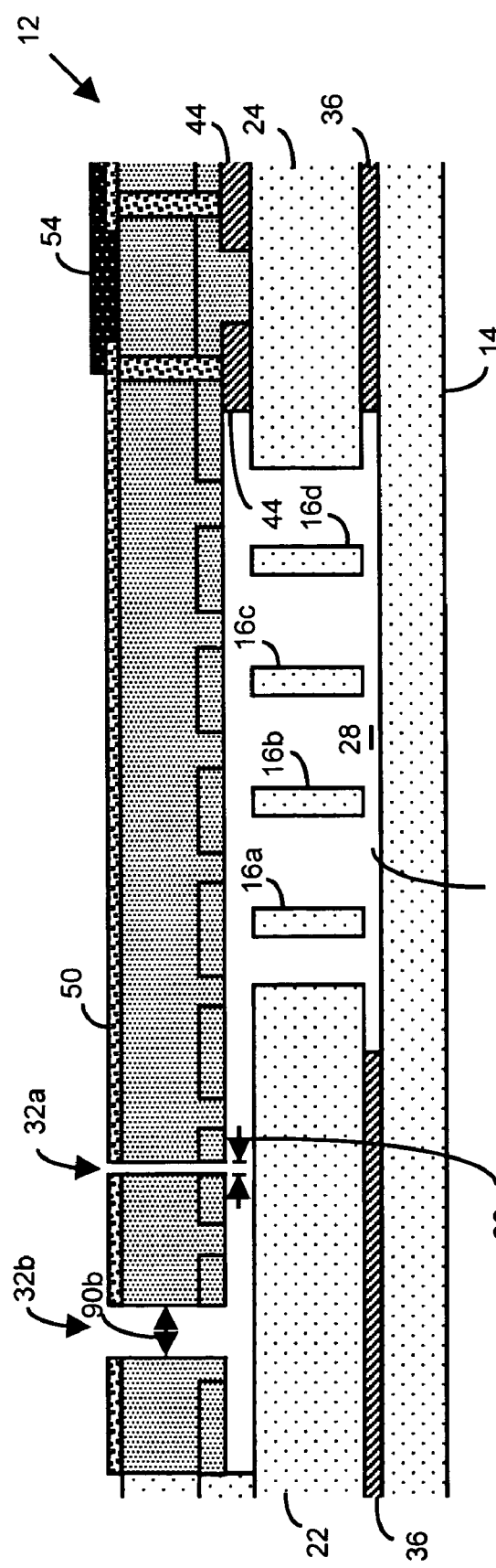

With reference to FIG. 30C, a first anti-stiction channel 32a and a second anti-stiction channel 32b may thereafter be formed through encapsulation layer(s) 30 to provide access to mechanical structures 16a-d. The first and second anti-stiction channels 32a, 32b may be formed using, for example, well-known anisotropic etching techniques (for example, deep reactive ion etching and/or deep silicon trench etching).

An anti-stiction fluid may be introduced into chamber 26 through the first anti-stiction channel 32a and/or the second anti-stiction channel 32b. The anti-stiction fluid may be, for example, DDMS, OTS, PFOTCS, PFDA, FDTS, PFPE and/or FOTS. Indeed, any anti-stiction fluid may be employed provided that the subsequent processes do not destroy the anti-stiction characteristics and/or destroy or obliterate the anti-stiction deposition on mechanical structures 16a-d of MEMS 10. In this way, the anti-stiction layer 58, for example, the monolayer coating formed on mechanical structures 16a-d, remains relatively intact and mechanical structures 16a-d include suitable anti-adhesive properties to overcome the adhesive forces of adjacent structures or elements in MEMS 10.

Figure 30F:
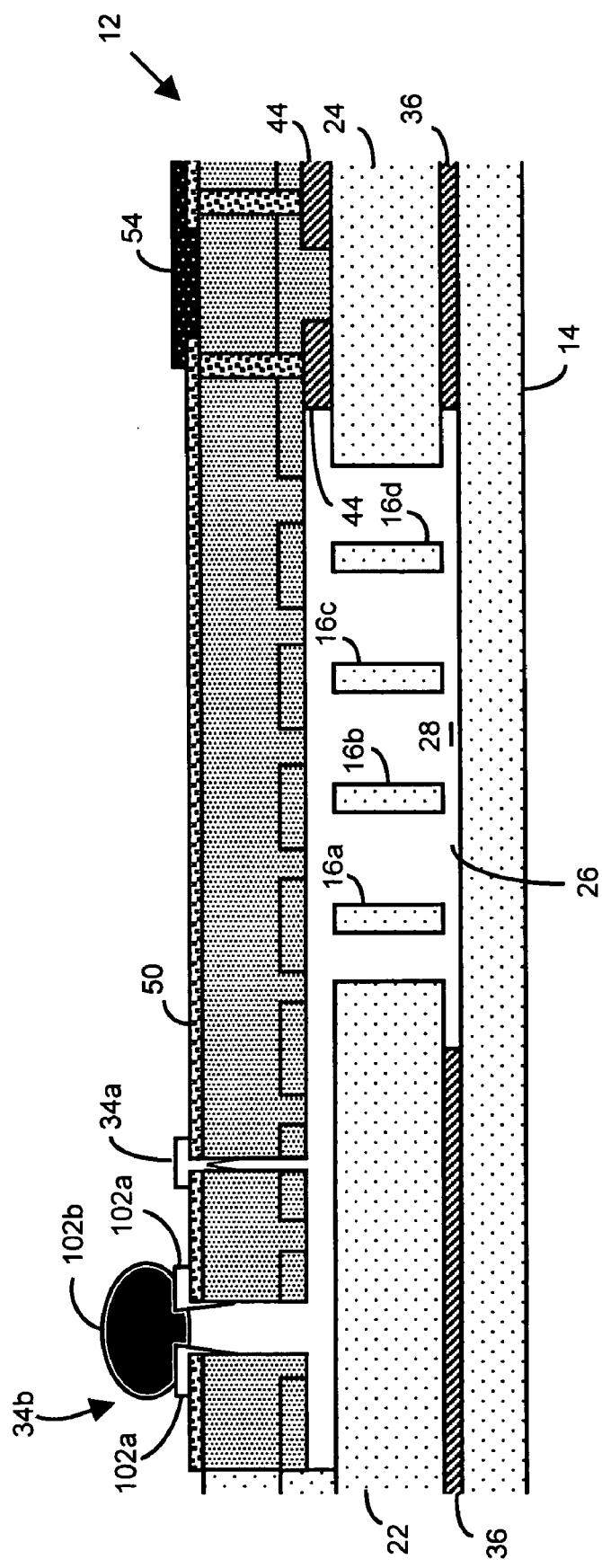

With reference to FIG. 30D-30F, the first anti-stiction channel 32a may be "closed" and/or "sealed" via first channel cap 34a. Any methods and/or structures may be used to deposit and/or form the first channel cap 34a.

Figure 31:
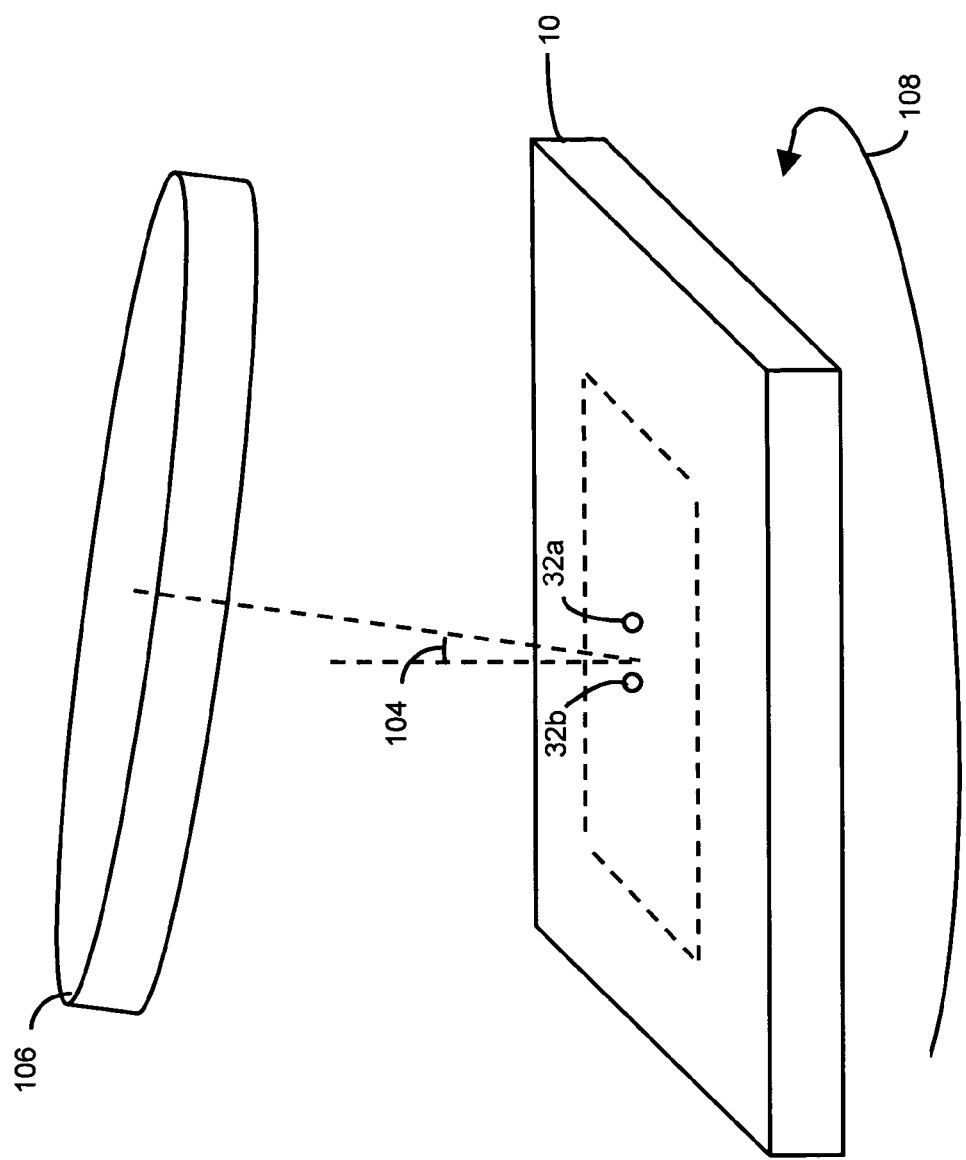
FIG. 31 illustrates a schematic view of an evaporation and/or sputter source in conjunction with a MEMS having two anti-stiction channels to be closed and/or sealed, according to certain aspects of the present invention.

With reference to FIG. 30D-30E, MEMS 10, in some embodiments, evaporation and/or sputtering are employed to deposit and/or form the first channel cap 34a. In such embodiments, MEMS 10 may be positioned at an angle 104 (see FIG. 31) relative to an evaporation and/or sputtering source 106 (see FIG. 31) and may be rotated 108 (see FIG. 31) relative to the source, to help prevent the evaporated and/or sputtered material 110 from going deeper than desired (e.g., exceeding a predetermined depth) in the anti-stiction channels. Notably, the evaporation and/or sputtering source 106 could be rotated instead of rotating the MEMS 10. In some embodiments, evaporation and/or sputtering may continue until the thickness of the evaporated and/or sputter deposited material reaches a predetermined depth such as, for example, a depth that is greater than the radius or one half of the width of the first anti-stiction channel 32a.

In this embodiment, the first portion of the second channel cap 34b may be deposited and/or formed at the same time as the first channel cap 34a. However, because the second anti-stiction channel 32b has a greater width and/or radius than the first anti-stiction channel 32a, the first anti-stiction channel 32a can be closed and/or sealed using the evaporation and/or sputtering process, described above, without sealing and/or closing the second anti-stiction channel 32b. Thus, the second anti-stiction channel 32b may remain open after the first of anti-stiction channel 32a is closed and/or sealed, and as a result, the second anti-stiction channel 32b may be used to control and/or adjust one or more environmental characteristic (e.g., pressure, temperature, humidity) within the chamber, after the first anti-stiction channel is closed and/or sealed. In that regard, the environmental characteristics within the chamber are not limited to the environmental characteristics used and/or produced during the evaporation and/or sputtering process. Indeed, the second anti-stiction channel may be used to provide any environment within the chamber, after the first anti-stiction channel 32a is closed and/or sealed, provided that the environment does not destroy the anti-stiction characteristics and/or destroy or obliterate the anti-stiction deposition on mechanical structures 16a-d of MEMS 10. For example, the monolayer coating formed on mechanical structures 16a-d, remains relatively intact and/or mechanical structures 16a-d include suitable anti-adhesive properties to overcome the adhesive forces of adjacent structures or elements in MEMS 10.

With reference to FIG. 30F, second anti-stiction channel 32b may be "closed" and/or "sealed" via completion of the second channel cap 34b. The second portion may comprise, for example, a wire ball, a stud, a solder bump and/or other member. The wire ball, stud, solder bump and/or other member may be fabricated separately (i.e., apart) from the first portion and thereafter positioned on the first portion and/or affixed thereto (for example by bonding). In some embodiments, a metal deposition tool, for example, a bonder, may be used. The bonder may be a wire ball bonder, or other type of wire bonder such as, for example, a wedge, that may be used to ultrasonically bond the wire ball or stud, solder bump, or other member to the surface of the base portion such that the second channel cap 34b seals the second anti-stiction channel 32. The wire ball bonder may be, for example, a "bumper" type ball bonder, which is designed for use in placement and/or bonding of balls without wires. In an alternative embodiment, the wire ball, stud, solder bump and/or other member may be fabricated directly on the bond layer 55 and/or fabricated integrally with the bond layer 55.

Notwithstanding the above, it should be recognized that the first and second channel caps 34a, 34b may comprise any material or materials (collectively referred to herein as material), that seals, plugs and/or closes anti-stiction channel 32b. For example, channel caps 34a, 34b may be a metal material, a spin-on polymer, spin-on glass ("SOG"), Further, in some embodiments, one or more portions of channel caps 34a, 34b may be formed using/from silk screening of or dispensed seal-glass, plastic and/or epoxy. In addition, a shadow mask technology may also be employed. Adhesive compounds may also be used.

In some embodiments, a plurality of anti-stiction channels similar to the first and/or second anti-stiction channels 32a, 32b may be provided. MEMS 10 may comprise a plurality of anti-stiction channels etched in substrate 14, encapsulation layer(s) 30 and/or wafer bonded encapsulation structure 76.

Notably, it may be advantageous to use more anti-stiction channels that are similar to the first anti-stiction channel 32a (the smaller of the anti-stiction channels) than the second anti-stiction channel 32b (the larger of the anti-stiction channels), because fewer processing steps may be needed to deposit and/or form the first channel cap 34a for the first anti-stiction channel. It may also be advantageous to distribute the smaller anti-stiction channels according to the relative concentration of MEMS 10 structures and/or in accordance with regions or areas where the mechanical structures are more likely to contact other structures or elements of micromachined mechanical structure 12 and/or are more susceptible to the debilitating effects of stiction. In this way, the anti-stiction fluid is more likely to efficiently, fully and/or evenly/conformally provide an anti-stiction layer (for example, a monolayer coating or self-assembled monolayer) on such mechanical structures of micromachined mechanical structure 12.

In some embodiments, it may be advantageous to utilize the fluid paths provided by the larger anti-stiction channels to control and/or adjust the environment (e.g., pressure, temperature) within the chamber after the smaller anti-stiction channels are "closed" and/or "sealed". In this way, the environment within the chamber is not limited to the conditions that occur during deposition and/or formation of the channel caps for the smaller anti-stiction channels.

If the smaller anti-stiction channels are sufficient to provide the anti-stiction layer, it may also be advantageous to minimize the number of large anti-stiction channels because additional processing steps may be needed to deposit and/or form the channel caps for the large anti-stiction channels. In addition, if the smaller anti-stiction channels are sufficient to provide the anti-stiction layer and the larger anti-stiction channels are solely to control and/or adjust the environment. It may also be advantageous to place the larger anti-stiction channels away from where the mechanical structures are more likely to contact other structures or elements of micromachined mechanical structure 12 and/or are more susceptible to the debilitating effects of stiction, so as to leave more room for the smaller anti-stiction channels.

It should be understood that any methods and/or structures may be employed to "close" and/or "seal" the anti-stiction channels 32a, 32b. Thus, the methods and/or structures are not limited to those disclosed above. In addition, it should also be understood that the first anti-stiction channels 32a could be employed without the second anti-stiction channel 32b. The second anti-stiction channel 32b could be employed without the first anti-stiction channel 32a.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10A-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

Figure 32:
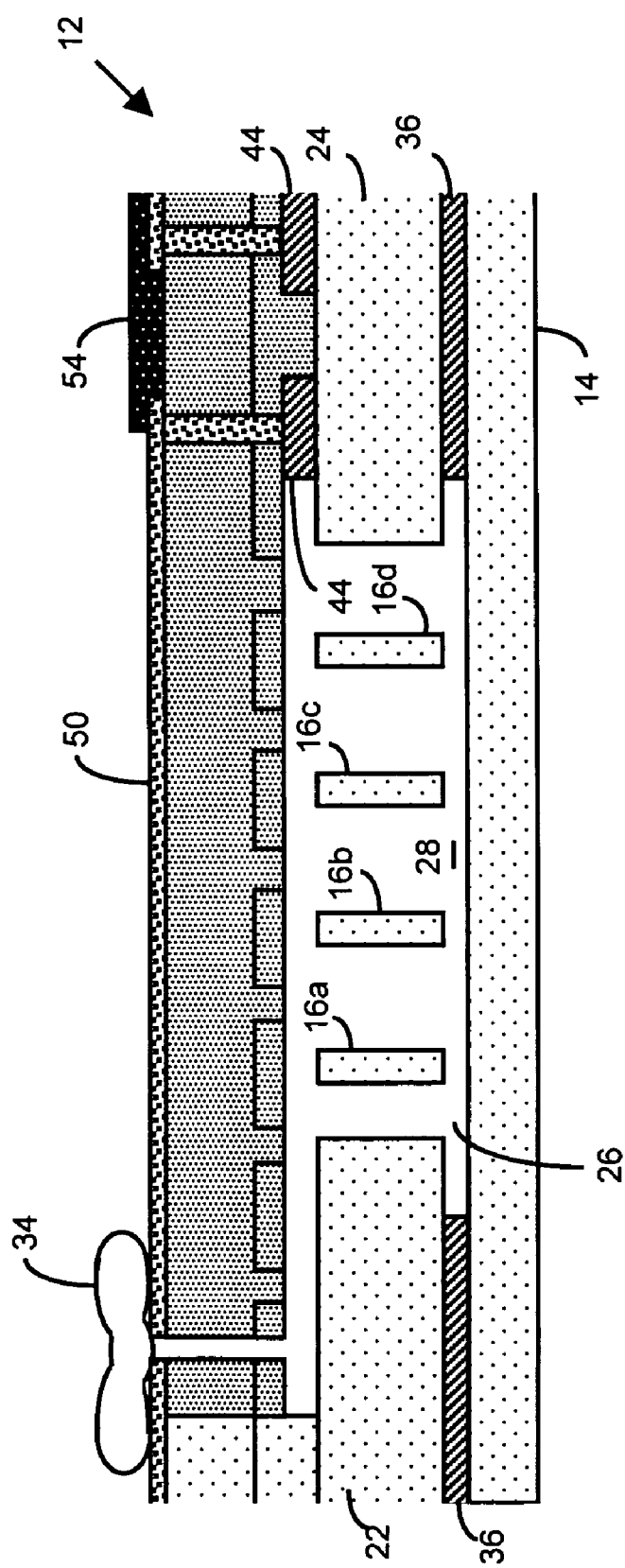
FIG. 32 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.

In another aspect, one or more portions of a channel cap 34 may be melted and/or reflowed to "close" and/or "seal" an anti-stiction channel 32. In this regard, with reference to FIG. 32, MEMS 10 includes micromachined mechanical structure 12, an anti-stiction channel and a channel cap 34. Micromachined mechanical structure 12 may be fabricated using one or more of the methods disclosed herein and/or any other suitable technique. Anti-stiction channel 32 may thereafter be formed and an anti-stiction fluid may be introduced into the chamber. Thereafter, one or more portions of channel cap 34 may be melted and/or reflowed to "close" and/or "seal" the anti-stiction channel 32.

In that regard, the channel cap 34 is preferably formed of material having a melting temperature that is low enough to allow one or more portions of the channel cap 34 to be melted and/or reflowed to close and/or seal the anti-stiction channel without destroying and/or obliterating the anti-stiction deposition on mechanical structures 16a-d of MEMS 10.

In one embodiment, fabrication of MEMS 10 begins as set forth above with respect to MEMS 10 (see FIGS. 3A-3G). Thereafter, with reference to FIG. 33A, the insulating layer 50 may be deposited, formed and/or grown on the exposed surface of the second encapsulating layer 30b. During deposition, formation and/or growth of insulation layer 50, trenches may also be filled to form dielectric isolation regions 48a and 48b. Contact opening 52 may be formed and/or etched in insulation layer 50, for example, using conventional etching techniques, to expose a portion of encapsulation layers.

With reference to FIG. 33B, a conductive layer 54 may then be deposited and/or formed. Conductive layer 54 forms part of the electrical connection to contact 24. Insulation layer 50 provides isolation between conductive layer 54 and other conductive and/or semiconductor layers (not shown).

With reference to FIG. 33C, a channel cap 34 may thereafter be deposited and/or formed. In some embodiments, the channel cap 34 is formed directly on MEMS 10. In some other embodiments, the channel cap 34 is formed apart from MEMS 10 (e.g., as a preform) and thereafter applied and/or affixed to or on the MEMS 10. The channel cap 34 may comprise any material(s) that provide(s) a barrier to maintain a suitable environment in chamber 26. In some embodiments, for example, the channel cap 34 may comprise metal, glass (e.g., a frit glass and/or spin-on glass), polymer (e.g., a spin on polymer), plastic, epoxy and/or any combination thereof.

Any suitable methods may be employed to deposit and/or form the channel cap 34. In some embodiments, a metal placement and/or deposition tool, for example, a bonder, may be employed. The bonder may comprise a wire ball bonder (for example, a "bumper" type ball bonder) or other type of wire bonder such as, for example, a wedge, may be used to ultrasonically bond the channel cap 34 to the surface of the MEMS 10.

With reference to FIG. 33D, an opening may be formed in the channel cap 34 material, for example using patterning, etching and/or some other technique.

Figure 33E:
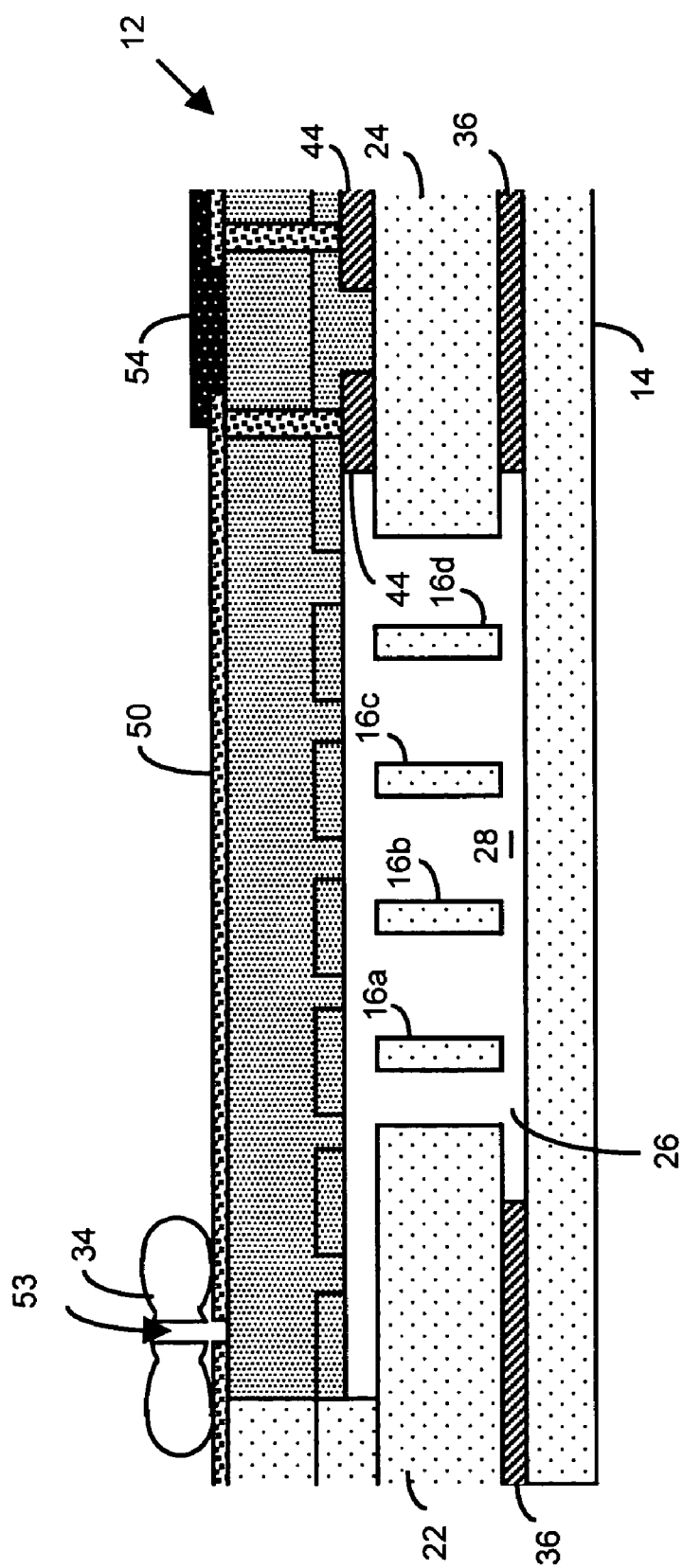

With reference to FIG. 33E, an anti-stiction channel window 53 may thereafter be formed and/or etched in insulation layer 50, for example, using conventional etching techniques, to expose a portion of encapsulation layers. The anti-stiction channel window 53 defines the location, at least in part, of the anti-stiction channel window 32 described below.

Figure 33F:
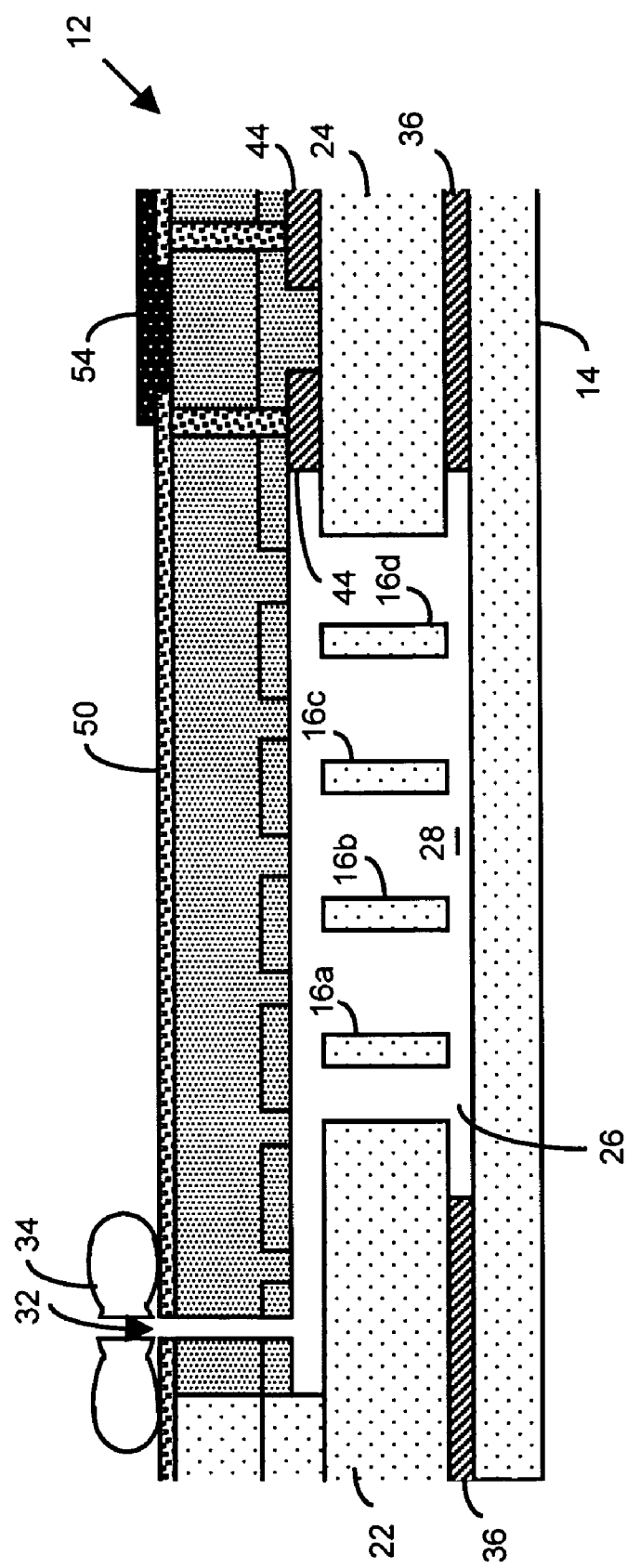

With reference to FIG. 33F, anti-stiction channel 32 may then be formed through encapsulation layer(s) 30 to provide access to mechanical structures 16a-d. The anti-stiction channel 32 may be formed using, for example, anisotropic etching techniques (for example, deep reactive ion etching and/or deep silicon trench etching).

Figure 33G:
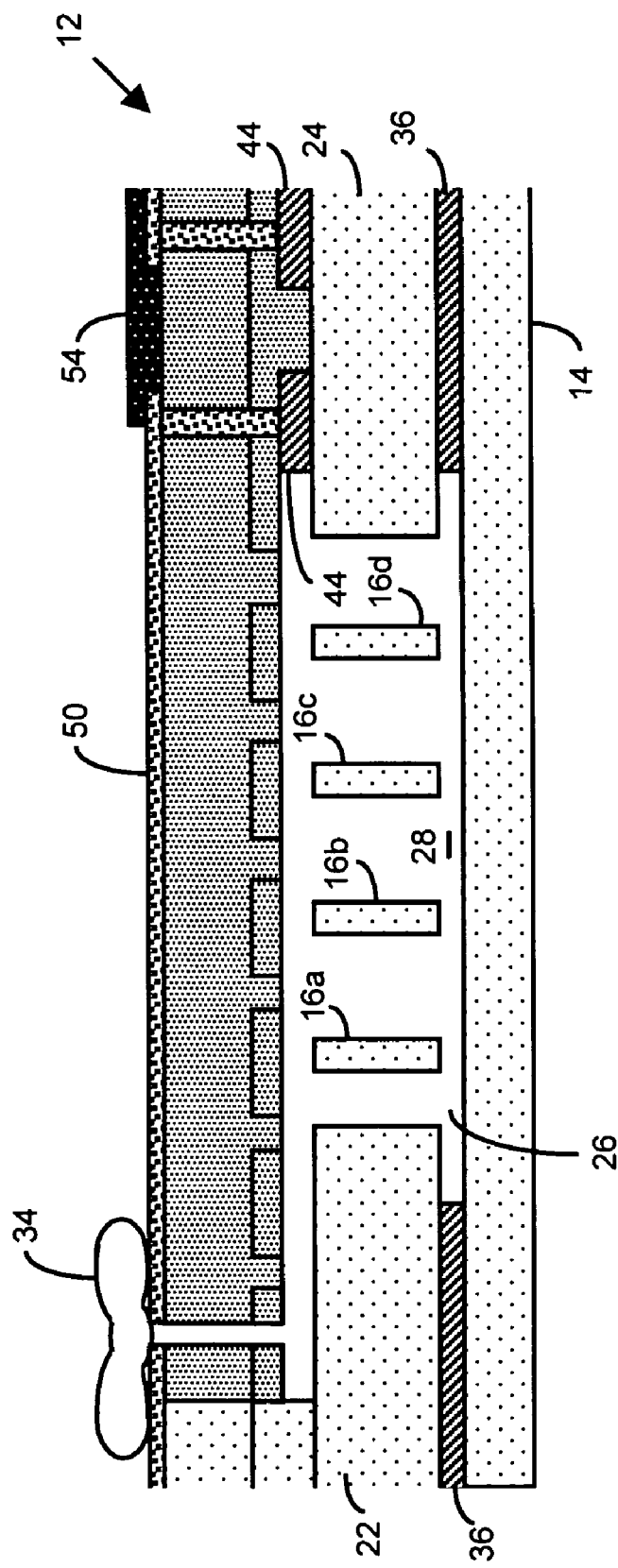

With reference to FIG. 33G, after formation of anti-stiction channel 32, heat may thereafter be applied to cause one or more portions of the channel cap 34 to melt and/or reflow to close and/or seal the anti-stiction channel. In that regard, the channel cap 34 is preferably formed of material having a melting temperature low enough to enable such melting and/or reflowing to be carried out under conditions that do not destroy and/or obliterate the anti-stiction deposition on mechanical structures 16a-d of MEMS 10. For example, in some embodiments, it is desirable to select a material that can be melted and/or reflowed without causing the temperature of the wafer to exceed 450 degrees Centigrade. It may also be desirable to form the channel cap 34 of a material (e.g., a metal material) that stays clean in the presence of oxide and/or other materials employed in the fabrication of the MEMS 10 to ensure that the channel cap 34 melts and/or reflows as desired. Furthermore, in some embodiments (e.g., if the channel cap 34 is formed of a glass material) it may be desirable to clean the channel cap 34 by melting and/or reflowing portions of the channel cap 34 prior to forming the opening in the cap 34.

The heat may be in any form, for example, but not limited to, localized laser heating and/or microwave heating. In some embodiments, the channel cap 34 is formed of low-melt glass, for example, a frit glass and/or a seal-glass material.

It may be desirable to employ the channel cap 34 as a hard mask for forming and/or etching of the anti-stiction channel window and/or the anti-stiction channel so that the anti-stiction channel window and/or the anti-stiction channel are formed in register with the opening defined by the channel cap 34 and the channel cap 34 extends to the edge of the anti-stiction channel window and/or anti-stiction channel. Such a configuration may help to minimize the width and/or diameter of the anti-stiction channel and may help to make it easier for the channel cap 34 to "close" and/or "seal" the anti-stiction channel in response to surface tension, upon melting and/or reflowing of the channel cap 34. That is, it may be advantageous for the width and/or diameter of the anti-stiction cavity to be small enough that the surface tension is able to cause the melted portions to reflow to close and/or seal the anti-stiction channel.

In some embodiments, the cap is disposed partially on single crystal silicon and partially on polysilicon. In some other embodiments, the channel cap is disposed solely on single crystal silicon or solely on polysilicon.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application").

In this regard, any and all of the embodiments described herein may be incorporated into the MEMS 10 of the Microelectromechanical Systems and Method of Encapsulating Patent Application (see, for example FIGS. 9, 10A-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

In another aspect, one or more portions of the encapsulation layer(s) are melted and/or reflowed to "close" and/or "seal" an anti-stiction channel 32. In this regard, with reference to FIG. 34, MEMS 10 includes micromachined mechanical structure 12 and encapsulation layer(s). Micromachined mechanical structure 12 may be fabricated using one or more of the methods disclosed herein and/or any other suitable technique. Anti-stiction channel 32 is formed through the encapsulation layer(s) and an anti-stiction fluid is introduced into the chamber as set forth above. Thereafter, one or more portions of the encapsulation layer(s) is melted and/or reflowed to "close" and/or "seal" the anti-stiction channel 32.

In one embodiment, fabrication of MEMS 10 begins as set forth above in FIGS. 3A-3F. Thereafter, with reference to FIG. 35A, anti-stiction channel 32 is formed through encapsulation layer(s) 30 to provide access to mechanical structures 16a-d. Anti-stiction channel 32 may be formed using, for example, anisotropic etching techniques (for example, deep reactive ion etching and/or deep silicon trench etching). It may be desirable to minimize the width and/or diameter of the anti-stiction channel 32, to make the anti-stiction channel easier to close and/or seal, as described below.

Thereafter, anti-stiction fluid is introduced into the chamber 26 through the anti-stiction channel. The anti-stiction fluid may be, for example, DDMS, OTS, PFOTCS, PFDA, FDTS, PFPE and/or FOTS. Indeed, any anti-stiction fluid may be employed provided that the subsequent processes do not destroy the anti-stiction characteristics and/or destroy or obliterate the anti-stiction deposition on mechanical structures 16a-d of MEMS 10. In this way, the anti-stiction layer 58, for example, the monolayer coating formed on mechanical structures 16a-d, remains relatively intact and mechanical structures 16a-d include suitable anti-adhesive properties to overcome the adhesive forces of adjacent structures or elements in MEMS 10.

With reference to FIG. 35B, heat is thereafter provided to cause one or more portions of the encapsulation layer(s) to melt and/or reflow to close and/or seal the anti-stiction channel. The heat may be supplied in any form, for example, but not limited to, laser heating (localized and/or global) and/or microwave heating. In some embodiments, a raster scan laser is used to heat the entire surface of the MEMS 10. Some other embodiments employ a raster scan laser in combination with a laser shadow mask to one or more portions of the encapsulation layer to melt and/or reflow to close and/or seal the anti-stiction channel. The heat is preferable great enough to facilitate melting and/or reflowing of portion(s) of the encapsulation layer yet small enough to not destroy and/or obliterate the anti-stiction deposition on mechanical structures 16a-d of MEMS 10. In that regard, in some embodiments, it is desirable to keep the temperature of the wafer below 450 degrees Centigrade during the melting and/or reflowing of the portion(s) of the encapsulation. The melted and/or reflowed portions may crystallize (or recrystallize) upon cooling.

Figure 35E:
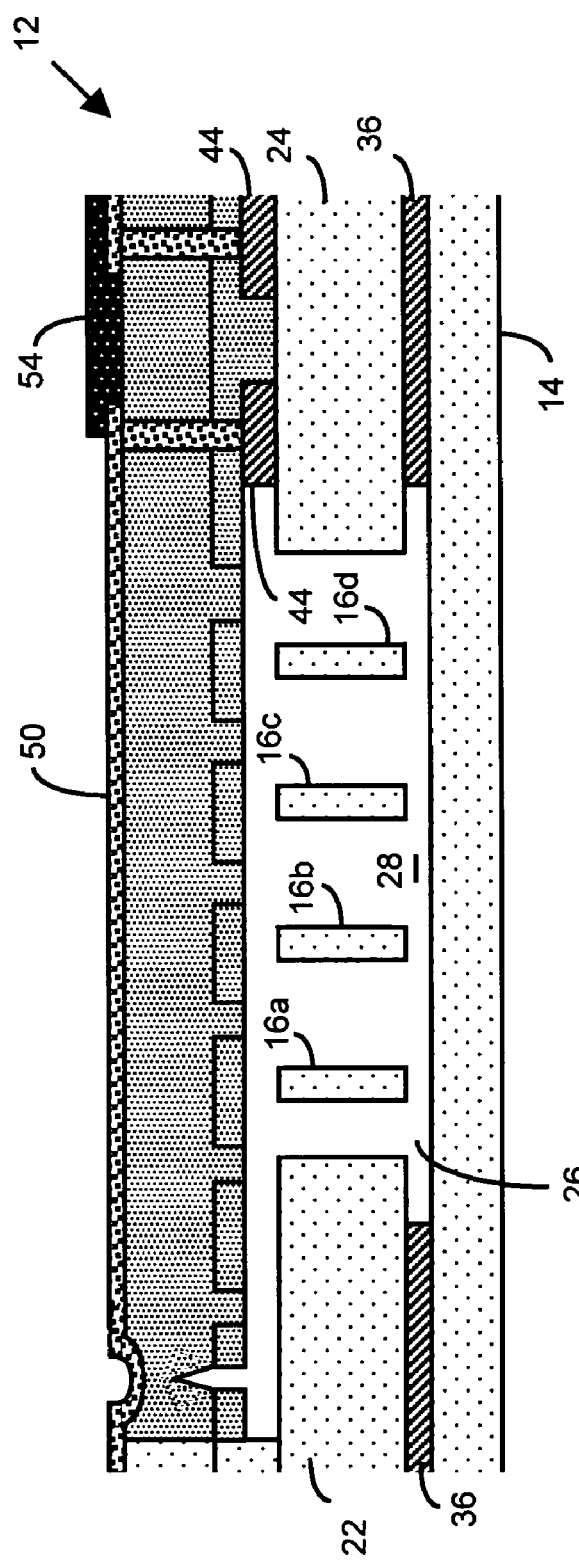
Figure 36:
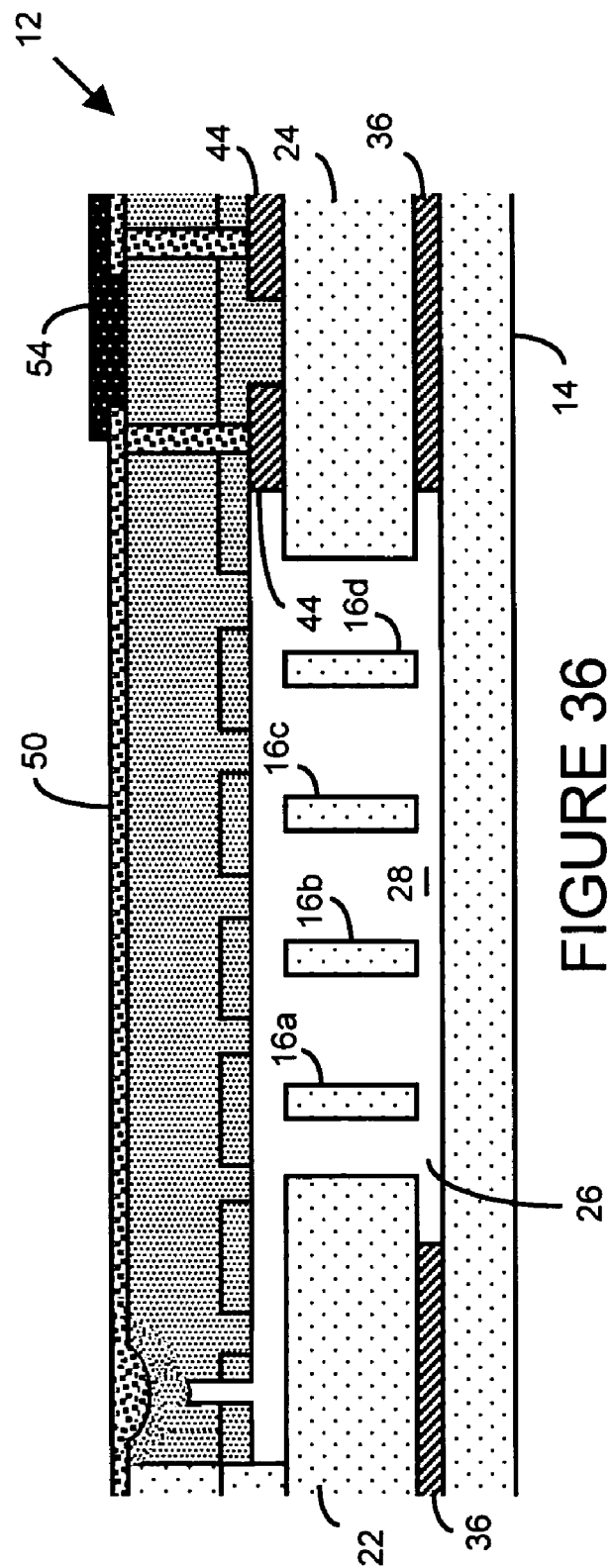
FIG. 36 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.
Figure 37E:
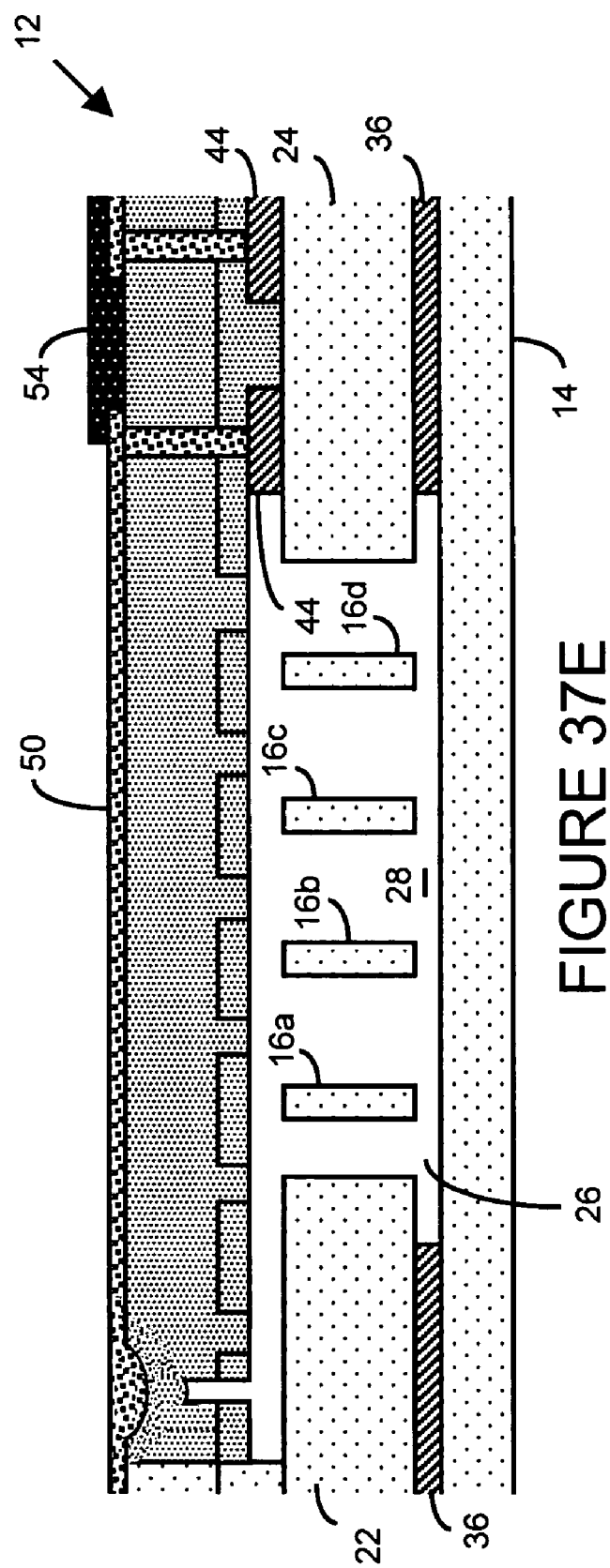

With reference to FIG. 35C-35D, trenches 46a and 46b may be etched in encapsulation layer(s). The insulating layer 50 may thereafter be deposited, formed and/or grown on the exposed surface of the second encapsulating layer 30b. During deposition, formation and/or growth of insulation layer 50, trenches may be filled to form dielectric isolation regions 48a and 48b. The insulating material may be, for example, silicon dioxide, silicon nitride, BPSG, PSG, or SOG. The trenches 46a and 46b may include a slight taper in order to facilitate the formation of the dielectric isolation regions 48a and 48b. Contact opening 52 may be formed and/or etched in insulation layer 50, for example, using conventional etching techniques. Contact opening 52 facilitates electrical connection to contact area 24. With reference to FIG. 35E, a conductive layer 54 may thereafter be deposited and/or formed and patterned to provide the appropriate electrical connection to contact 24.

FIGS. 36 and 37A-37E show an alternative embodiment in which one or more portions of the encapsulation layer(s) are melted and/or reflowed to "close" and/or "seal" an anti-stiction channel 32.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10A-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

Figure 38:
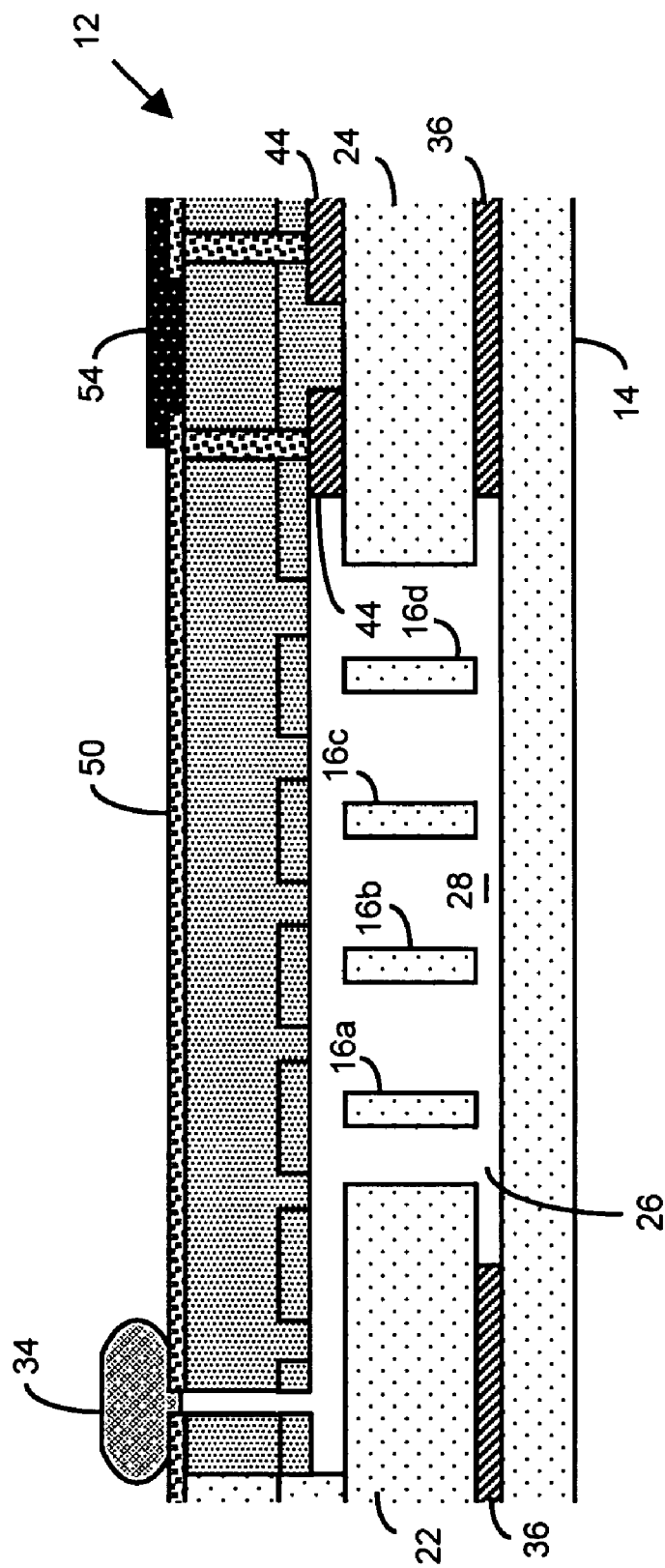
FIG. 38 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.

In another aspect, one or more portions of a channel cap 34 are stamp transferred onto MEMS 10 and "close" and/or "seal" the anti-stiction channel. In this regard, with reference to FIG. 38, MEMS 10 includes micromachined mechanical structure 12, anti-stiction channel and channel cap 34. Micromachined mechanical structure 12 may be fabricated using one or more of the methods disclosed herein and/or any other suitable technique. Anti-stiction fluid is introduced into the chamber via the anti-stiction channel. One or more portions of a channel cap 34 are thereafter stamp transferred onto MEMS 10 and "close" and/or "seal" an anti-stiction channel 32.

In one embodiment, fabrication of MEMS 10 begins as set forth above with respect to FIGS. 3A-3H. Thereafter, with reference to FIG. 39A, a conductive layer 54 may be deposited and/or formed. Conductive layer 54 forms part of the electrical connection to contact 24.

With reference to FIG. 39B, anti-stiction channel 32 is thereafter formed through encapsulation layer(s) 30 to provide access to mechanical structures 16*a-d*. The anti-stiction channel 32 may be formed using, for example, well-known anisotropic etching techniques (for example, deep reactive ion etching and/or deep silicon trench etching).

After formation of anti-stiction channel 32, an anti-stiction fluid (for example, flourooctatrichlorosilane ("FOTS"), dichlordimethylsilan ("DDMS"), octadecyltrichlorsilan ("OTS"), perfluoroctyltrichlorsilan ("PFOTCS"), perfluorodecanoic acid ("PFDA"), perfluorodecyl-trichlorosilane ("FDTS"), perfluoro polyether ("PFPE"), fluoroalkylsilane and/or other organosilanes) may be introduced into chamber 26 by, for example, vapor deposition (for example, APCVD, LPCVD, or PECVD). The anti-stiction fluid may deposit on one, some or all of mechanical structures 16*a-d* of MEMS 10 thereby providing an anti-stiction layer, for example, a monolayer coating and/or out-gassing molecules on the mechanical structures. In this way, mechanical structures 16*a-d* may include suitable anti-adhesive properties. In some embodiments, anti-stiction layer comprises a coating on one, some or all of mechanical structures 16*a-d* of MEMS 10 to increase hydrophobicity and/or decrease friction and wear of moving MEMS structures.

Figure 39C:
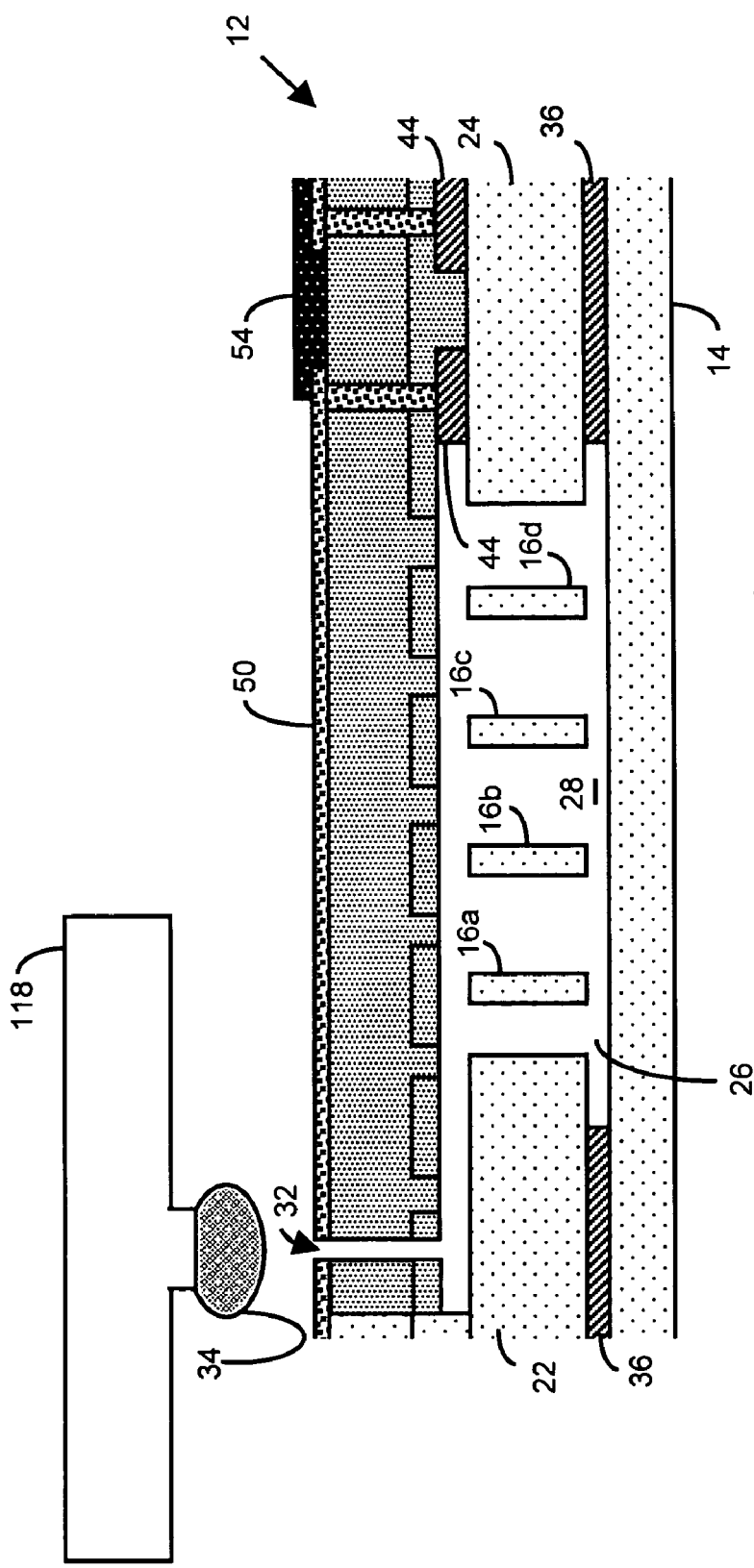

With reference to FIG. 39C, a channel cap 34 may thereafter be stamp transferred onto the MEMS 10 to close and/or seal the anti-stiction channel 32. For example, material for a channel cap 34 may be positioned on and/or formed on a stamping mechanism (or stamp) 118. The stamp mechanism 118 and the MEMS 10 may then be positioned relative to one another such that the channel cap 34 is aligned with the anti-stiction channel 32.

With reference to FIG. 39D, the stamp mechanism 118 may thereafter provide a force to drive the channel cap 34 toward the anti-stiction channel 32 and into contact with the MEMS 10, until a desired amount of contact between the channel cap 34 and the MEMS 10 is achieved. The stamp mechanism 118 and/or metal preform may thereafter be separated from the channel cap 34, leaving the channel cap 34 behind.

With reference to FIG. 39E, in some embodiments, the force provided by the stamp mechanism 118 is enough to drive one or more portions of the channel cap 34 into the anti-stiction channel 32. In some embodiments, heat may be required before, during, and/or after the stamp cycle to ensure that the channel cap 34 closes and/or seals the anti-stiction channel 32. In such one or more portions of the channel cap 34 may melt and/or flow into the anti-stiction channel 32 as a result of such heat.

In some embodiments, the channel cap 34 comprises any material (or materials) that provides a barrier to maintain a suitable environment in chamber 26, for example, but not limited to plastic, epoxy, metal paste, solder, gold, frit glass and/or any other hermetic sealing material.

In some embodiments, material for a channel cap 34 is applied directly to the stamp mechanism. In some other embodiments, material for a channel cap 34 is stamped onto a metal preform that is adapted to be attached to the stamp mechanism 118 and/or forms a part of the stamp mechanism 118.

In some embodiments, the channel cap 34 is pre-baked on the stamp 118 or on the metal perform and the channel cap 34 material may be cured, at least in part, prior to and/or during the transfer to the MEMS 10, so as to help prevent the channel cap 34 from out-gassing into the anti-stiction channel after being stamped onto MEMS 10.

With reference to FIG. 40, in some embodiments, a plurality of caps 34 are provided on the stamp 118 or preform so that a plurality of anti-stiction channels 32 may be "closed" and/or "sealed" using a single stamp cycle. The channel caps 34 are preferably arranged in a pattern that corresponds to the pattern of the anti-stiction channels 32 to be sealed thereby. For example, if the anti-stiction channels 32 are arranged in a grid pattern, the caps 34 are preferably arranged in a grid pattern that corresponds thereto. In preparation for closing and/or sealing the anti-stiction channels 32, the stamp 118 or preform may be positioned such that each cap 34 is aligned with a respective one of the channels. A stamp cycle may thereafter be employed to transfer the channel caps 34 to the MEMS 10. Heat may be provided before, during, and/or after the stamp cycle to facilitate the "closing" and/or "sealing" of the anti-stiction channels 32.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10A-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

Figure 41:
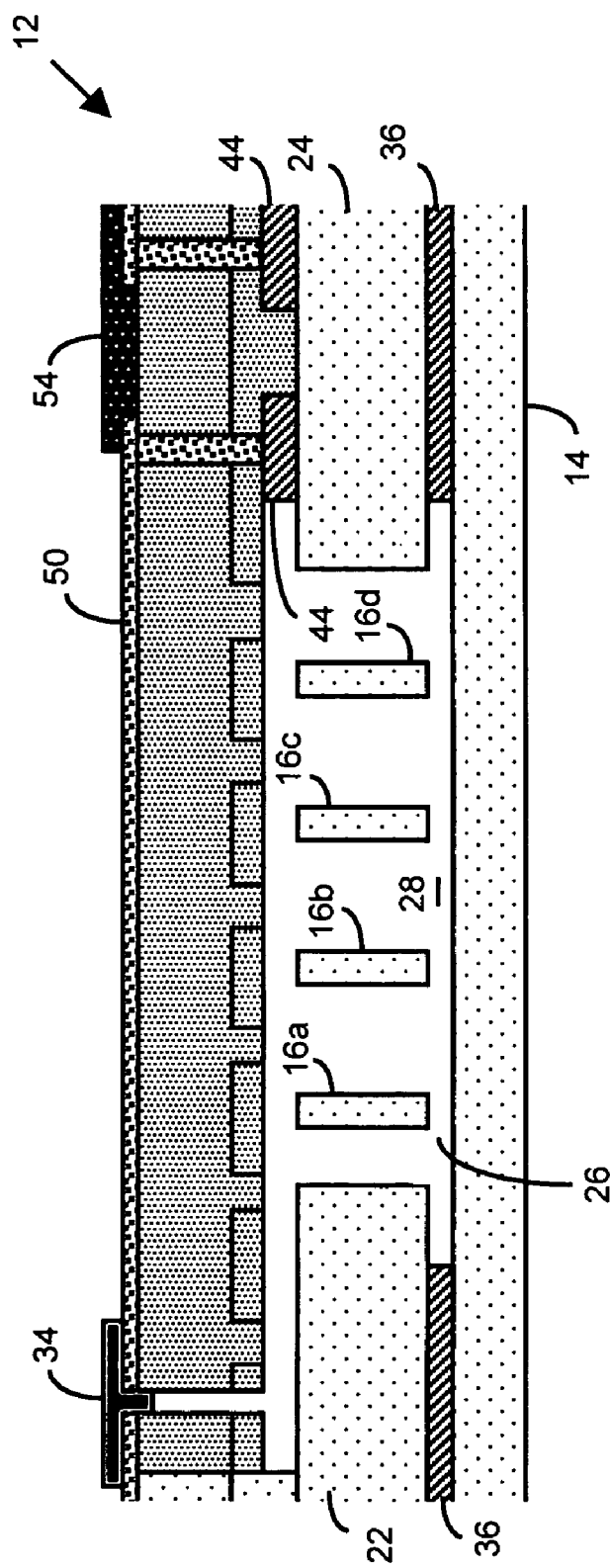
FIG. 41 illustrates a cross-sectional view of a portion of a MEMS, for example, a portion of an interdigitated or comb-like finger electrode array, contact area and a trench isolated contact, in conjunction with an anti-stiction plug or cap, in accordance with another aspect of the present invention.

In another aspect, one or more portions of a channel cap 34 are deposited and/or formed by selective material deposition to close and/or seal the anti-stiction channel. In this regard, with reference to FIG. 41, MEMS 10 includes micromachined mechanical structure 12, anti-stiction channel and channel cap 34. Micromachined mechanical structure 12 may be fabricated using one or more of the methods disclosed herein and/or any other suitable technique. Anti-stiction fluid is introduced into the chamber via the anti-stiction channel. One or more portions of a channel cap 34 are deposited and/or formed by selective material deposition to close and/or seal the anti-stiction channel 32.

In one embodiment, fabrication of MEMS 10 begins as set forth above with respect to FIGS. 3A-3H. Thereafter, with reference to FIG. 42A, a conductive layer 54 may be deposited and/or formed. Conductive layer 54 forms part of the electrical connection to contact 24.

With reference to FIG. 42B, anti-stiction channel 32 is thereafter formed through encapsulation layer(s) 30 to provide access to mechanical structures 16a-d. The anti-stiction channel 32 may be formed using, for example, well-known anisotropic etching techniques (for example, deep reactive ion etching and/or deep silicon trench etching).

After formation of anti-stiction channel 32, an anti-stiction fluid (for example, flourooctatrichlorosilane ("FOTS"), dichlordimethylsilan ("DDMS"), octadecyltrichlorsilan ("OTS"), perfluoroctyltrichlorsilan ("PFOTCS"), perfluorodecanoic acid ("PFDA"), perfluorodecyl-trichlorosilane ("FDTS"), perfluoro polyether ("PFPE"), fluoroalkylsilane and/or other organosilanes) may be introduced into chamber 26 by, for example, vapor deposition (for example, APCVD, LPCVD, or PECVD). The anti-stiction fluid may deposit on one, some or all of mechanical structures 16a-d of MEMS 10 thereby providing an anti-stiction layer, for example, a monolayer coating and/or out-gassing molecules on the mechanical structures. In this way, mechanical structures 16a-d may include suitable anti-adhesive properties. In some embodiments, anti-stiction layer comprises a coating on one, some or all of mechanical structures 16a-d of MEMS 10 to increase hydrophobicity and/or decrease friction and wear of moving MEMS 10 structures.

Figure 42C:
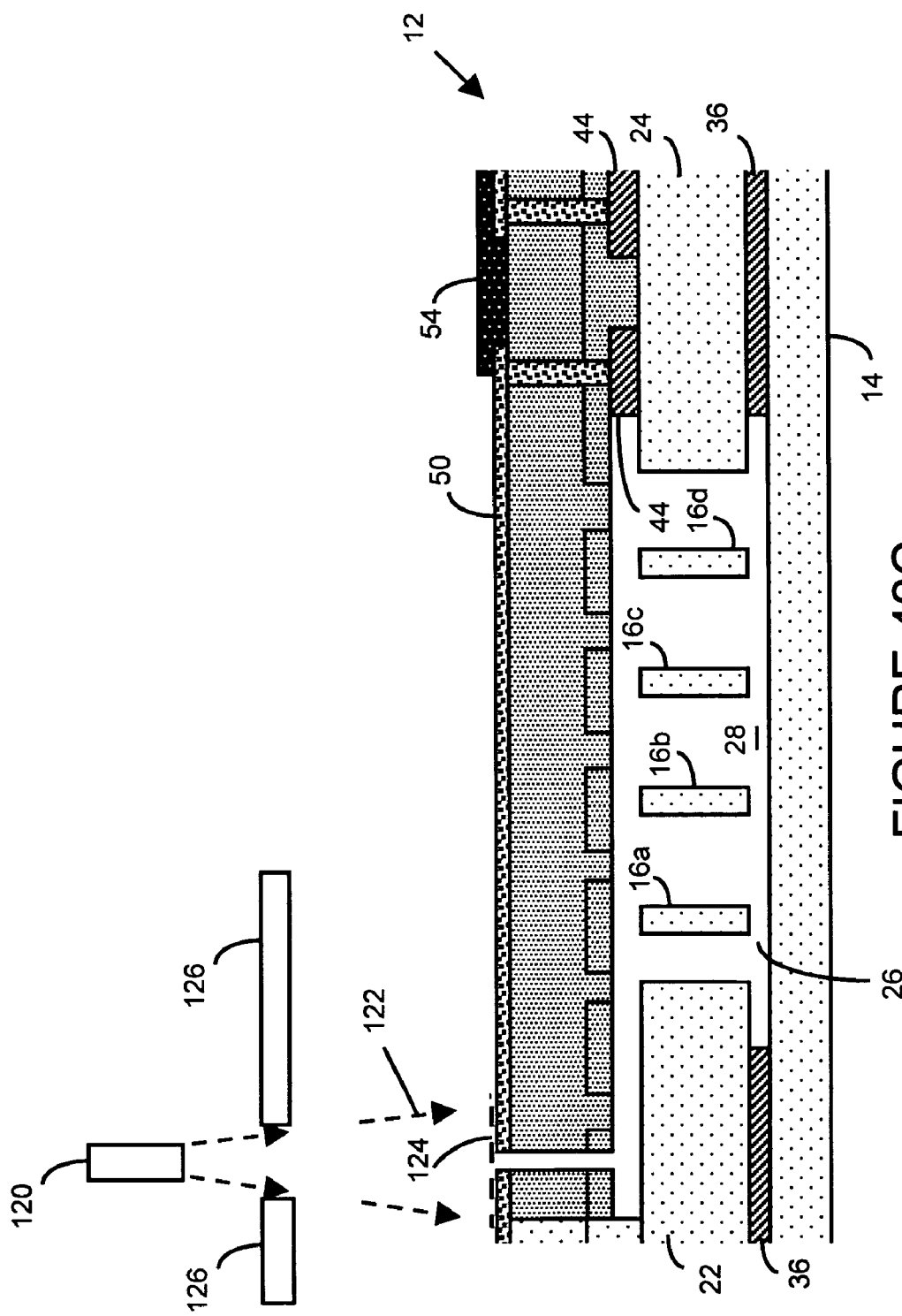
Figure 42D:
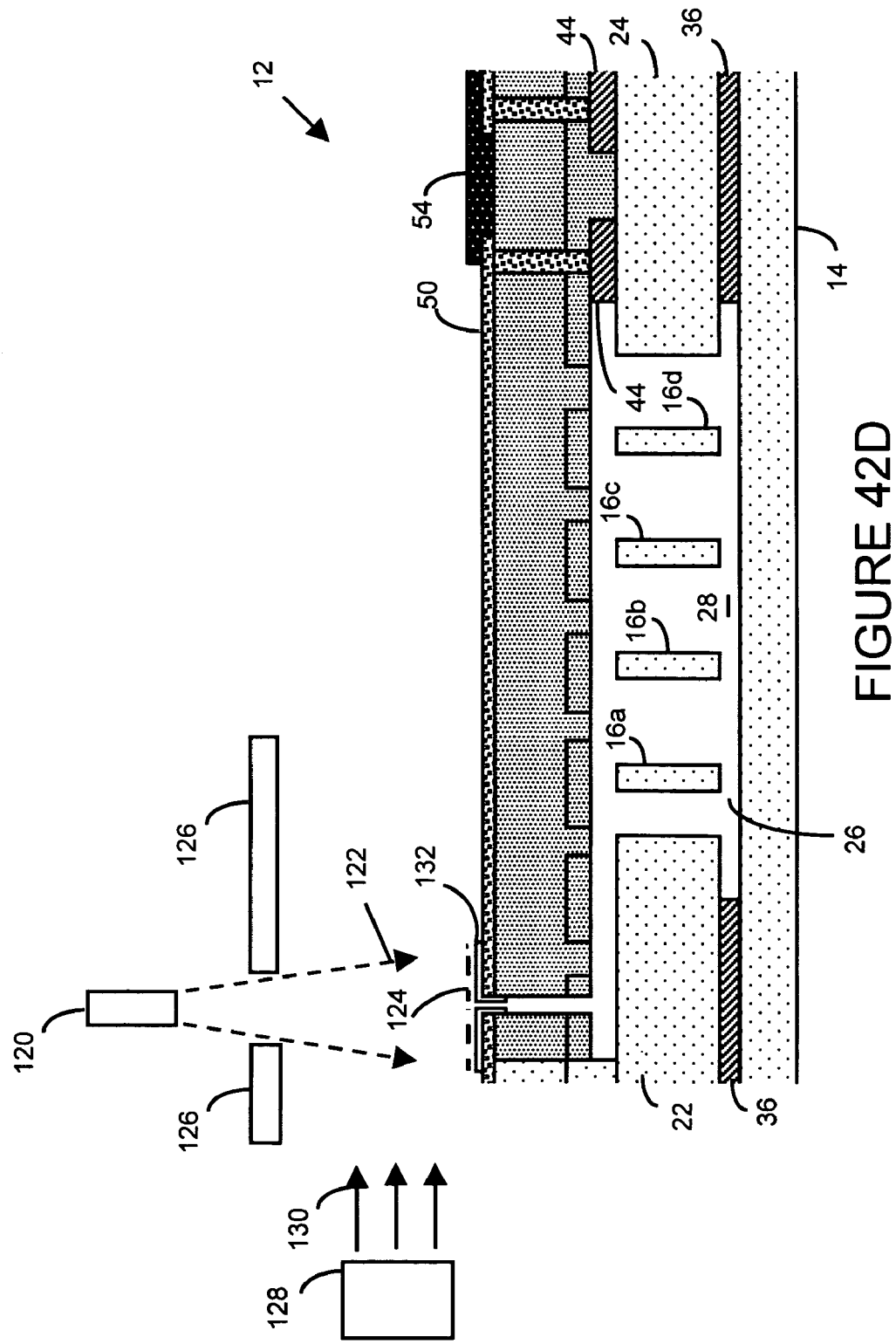
Figure 42E:
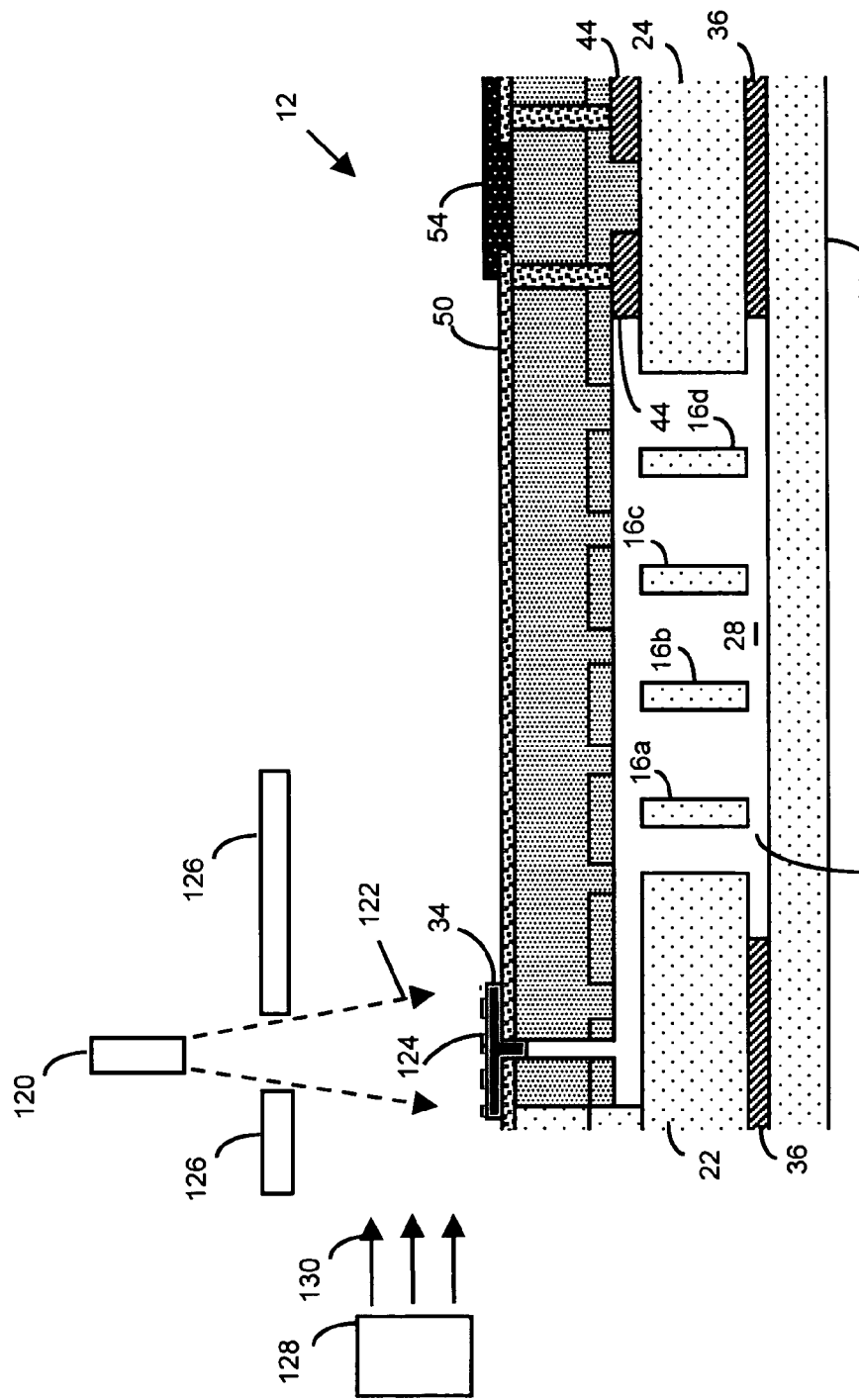

With reference to FIG. 42C-42E, a channel cap 34 may thereafter be deposited and/or formed on MEMS 10 by selectively depositing. In some embodiments, for example, selective deposition utilizes one or more radiation source(s) 120 to irradiate 122 the portion(s) 124 of MEMS 10 that are to receive the selective material deposition. The radiation source(s) 120 may comprise, for example, ultraviolet, infrared and/or visible light source(s). A mask 126 may be employed to define the portion(s) of the MEMS 10 that are to be irradiated and receive the selective deposition of material. One or more material source(s) 128 are employed to provide a supply of material(s) 130 before, during and/or after the radiation is provided, so as to result in a selective deposition of a material on the irradiated portion 124 of the MEMS 10 to close and/or seal the anti-stiction channel 32. The selectively deposited material 132 may comprise, for example, an oxide.

Figure 42F:
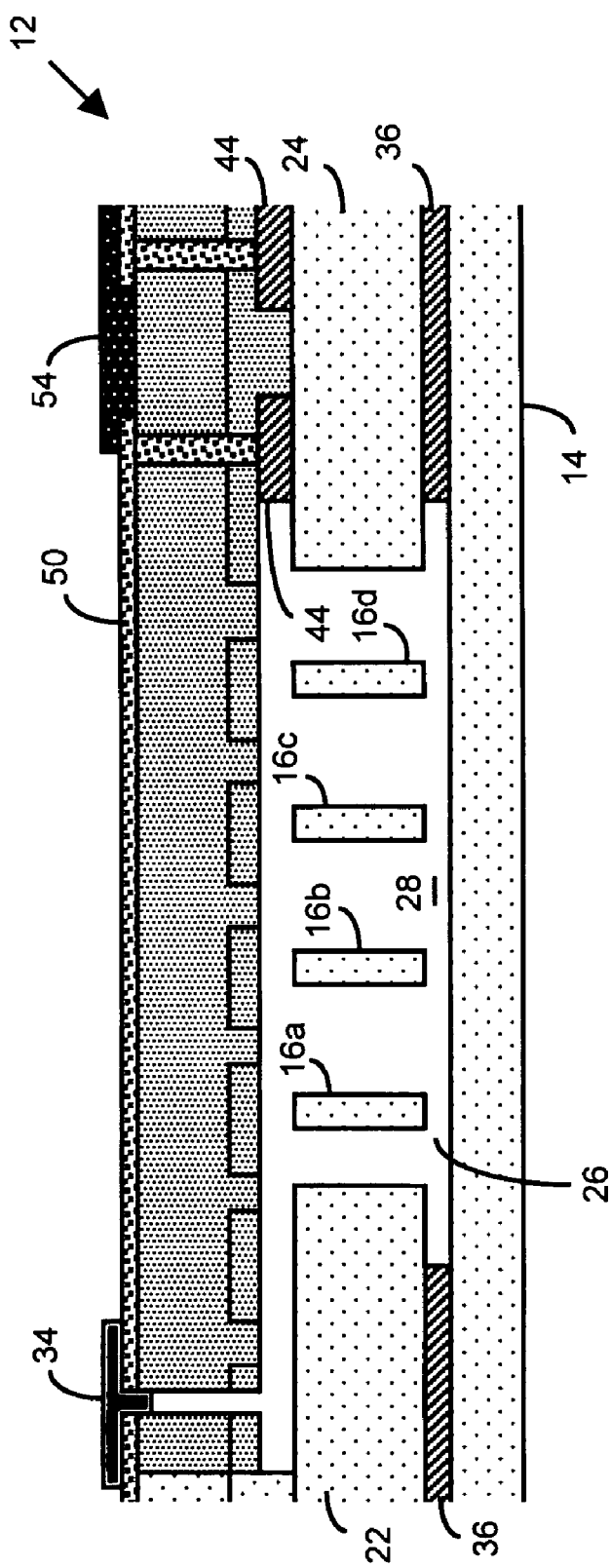

With reference to FIG. 42F, after the channel cap 34 is deposited and/or formed, the radiation and the supply of material source are turned off.

In one embodiment, for example, the radiation source comprises a VUV excimer lamp. The wavelength of the radiation source may be, for example, 172 nanometers. The material source comprises, for example, a source that provides a vapor coating with tetraethylorthsilicate (TEOS) and results in an oxide coating on the irradiated portion of the MEMS 10.

Figure 43:
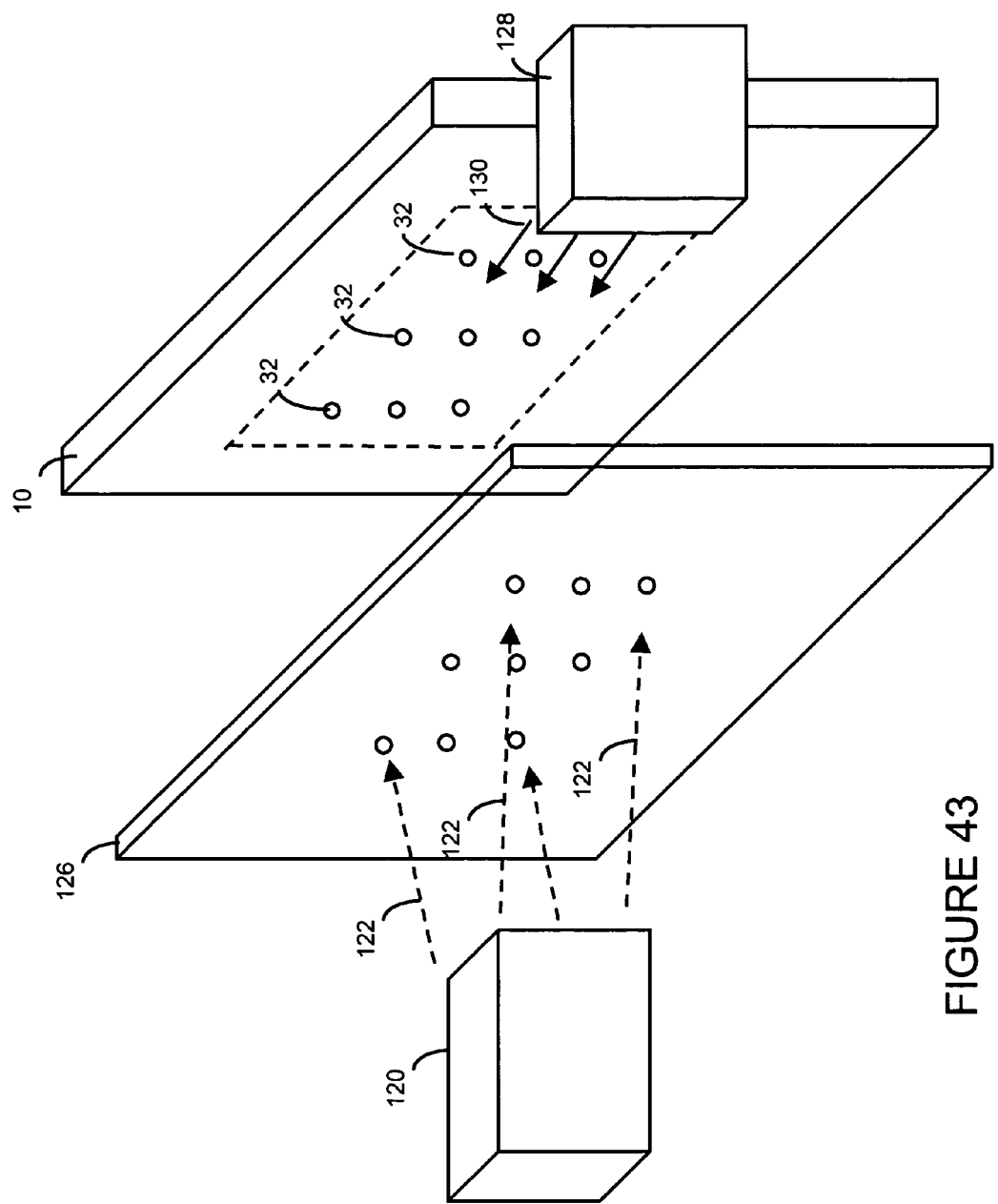
FIG. 43 illustrates a schematic view of a radiation source, a material source, a mask, and a MEMS having a plurality of anti-stiction channels to be closed and/or sealed, according to certain aspects of the present invention.

With reference to FIG. 43, in some embodiments, a plurality of anti-stiction channels 32 may be "closed" and/or "sealed" concurrently, using the radiation source(s) 120, the mask 126 if desired, and the material source(s) 128.

Figure 20A:
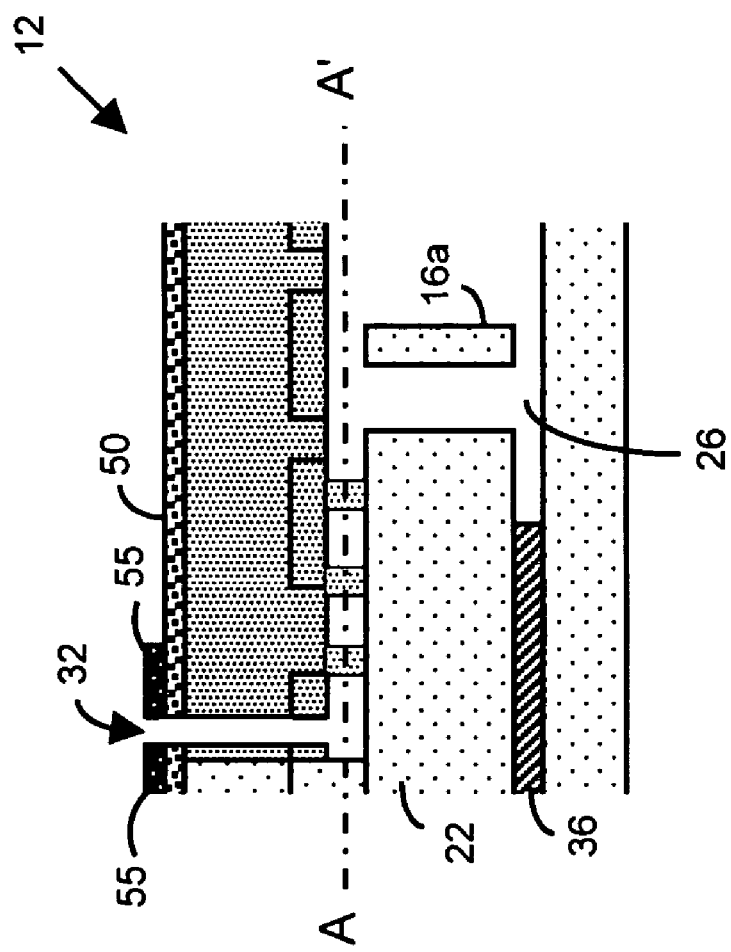
FIG. 20A is a partial cross-sectional view (sectioned along dotted line a-a' of FIG. 1) of the portion of the interdigitated or comb-like finger electrode array, in conjunction with a substantially horizontal trap, in accordance with certain aspects of the present invention.
Figure 20B:
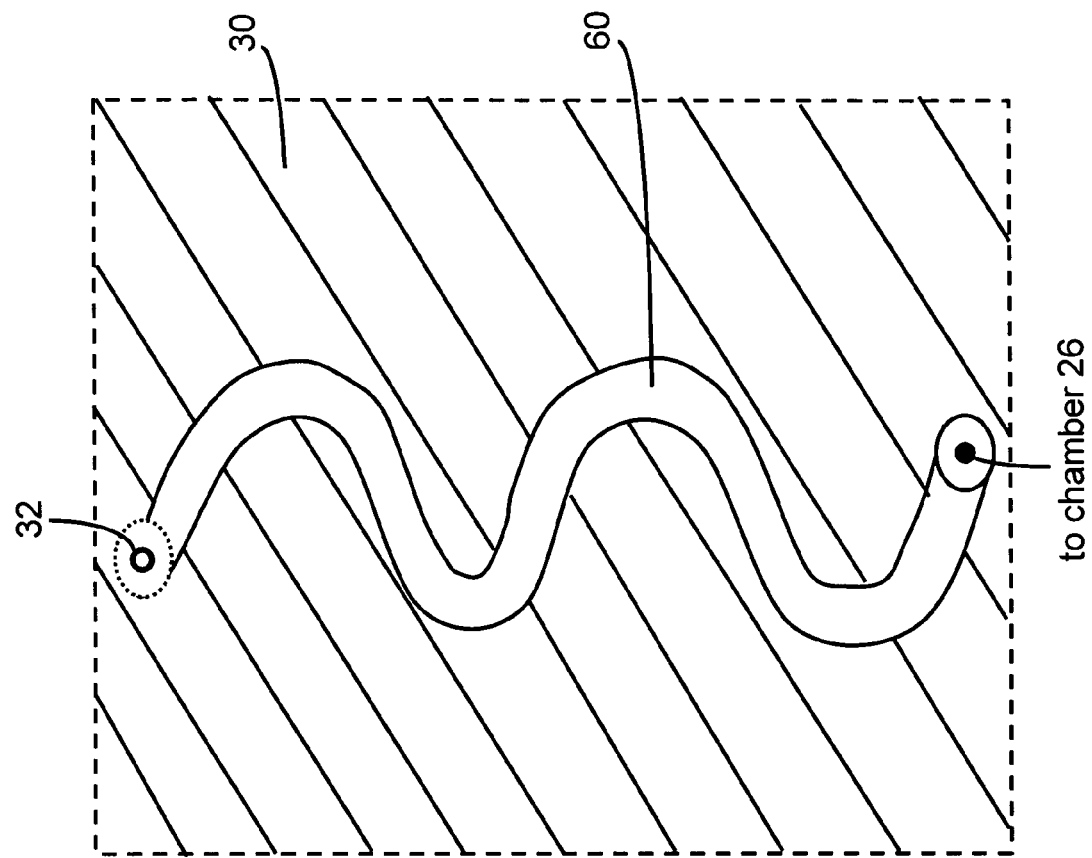
FIG. 20B is a (lateral) cross-sectional view (sectioned along dotted line A-A') of the portion FIG. 20A illustrating the serpentine shape of the substantially horizontal trap.

It should be understood that a vertical and/or horizontal trap (see, for example, trap 60 shown in FIG. 5, as an example of a trap) may be formed in the vicinity of anti-stiction channel 32. Moreover, trap 60 may take any vertical and/or horizontal shape in one or more of the layers of micromachined mechanical structure 12. For example, trap 60 may be formed within encapsulation layer(s) 30 as a substantially horizontal trap that includes serpentine shape before access to chamber 26 (see, for example, trap 60 shown in. FIGS. 20A and 20B, as an example of a trap having a serpentine shape).

In addition, it should also be understood that after fabrication of channel cap 34, one or more diffusion barriers may be deposited and/or formed over anti-stiction channel 32 and/or channel cap 34 in order to enhance the "seal" of anti-stiction channel 32 and thereby enhance the barrier to diffusion of fluid within (or external to) chamber 26 (see, for example, diffusion barrier 64 shown in FIGS. 8A-8B, as an example of a diffusion barrier). Moreover, as mentioned above, the present inventions may be implemented in conjunction with various thin film encapsulation techniques, including the encapsulation techniques described and illustrated in non-provisional patent application entitled "Microelectromechanical Systems, and Method of Encapsulating and Fabricating Same", which was filed on Jun. 4, 2003 and assigned Ser. No. 10/454,867 (hereinafter "Microelectromechanical Systems and Method of Encapsulating Patent Application"). In this regard, any and all of the embodiments described herein may be incorporated into the MEMS 10 of the Microelectromechanical Systems and Method of Encapsulating Patent Application (see, for example FIGS. 9, 10A-10C, and 11A-11C, as examples of anti-stiction techniques implemented in conjunction with various thin film encapsulation techniques). It should also be noted that the present invention may be implemented in a MEMS 10 including micromachined mechanical structure as well as data processing electronics and/or interface circuitry (see, for example, data processing electronics 70 and interface circuitry 72 shown in FIGS. 12, 13A-13B, as examples of data processing electronics and interface circuitry). MEMS 10 may also employ wafer-bonding encapsulation techniques, in conjunction with the anti-stiction techniques (see, for example, FIG. 14, 15A-15F, as an example of wafer-bonding encapsulation techniques, in conjunction with anti-stiction techniques). In addition, while the exemplary embodiments and/or processes of the inventions have been described above according to a particular order, that order should not be interpreted as limiting. For example, contact opening 52 and anti-stiction channel window 53 may be fabricated either consecutively (see, for example, FIGS. 16B-16E, 17A-17E, as examples of fabricating a contact opening and an anti-stiction channel window consecutively) or simultaneously (see, for example, FIG. 3H, as an example of fabricating a contact opening and an anti-stiction channel window simultaneously). Moreover, the anti-stiction fabrication/processes may be performed after deposition of conductive layer 54 (see, for example, FIGS. 3I-3N, FIGS. 17A-17E, as examples of anti-stiction fabrication/processes performed after deposition of a conductive layer) or before fabrication or deposition of conductive layer 54 (see, for example, FIGS. 16B-16F, as an example of an anti-stiction fabrication/processes performed before fabrication or deposition of a conductive layer). In addition, insulation layer 50 may be formed and thereafter etched to form contact opening 52 without formation of anti-stiction window (see for example, FIGS. 18A-18C, as an example of an insulation layer formed and etched to form contact opening without formation of anti-stiction window).

Moreover, it should also be understood that the present inventions may implement the anchors and techniques of anchoring mechanical structures 16 to substrate 14 (as well as other elements of MEMS 10, for example, contact 24) described and illustrated in "Anchors for Microelectromechanical Systems Having an SOI Substrate, and Method for Fabricating Same", which was filed on Jul. 25, 2003 and assigned Ser. No. 10/627,237 (hereinafter the "Anchors for Microelectromechanical Systems Patent Application"). In this regard, see for example, anchor 66 and anchor 68 shown in FIGS. 21A and 21B, as examples of anchors. In one embodiment, anchors 66 and/or 68 may be comprised of a material that is relatively unaffected by the release processes of the mechanical structures.

The term "depositing" and other forms (i.e., deposit, deposition and deposited) in the claims, means, among other things, depositing, creating, forming and/or growing a layer of material using, for example, a reactor (for example, an epitaxial, a sputtering or a CVD-based reactor (for example, APCVD, LPCVD, or PECVD).

Further, in the claims, the term "contact" means a conductive region, partially or wholly disposed outside the chamber, for example, the contact area and/or contact via.

Also, in the claims, "anti-stiction fluid" may be any anti-stiction bearing material (i.e., any material that enhances the non-reactive and/or non-adhesive nature of, for example, the surface of mechanical structures) in a gas or liquid form, whether now known or later developed. For example, anti-stiction fluid (for example, flourooctatrichlorosilane ("FOTS"), dichlordimethylsilan ("DDMS"), octadecyl-trichlorsilan ("OTS"), perfluoroctyltrichlorsilan ("PFOTCS"), perfluorodecanoic acid ("PFDA"), perfluoro-decyl-trichlorosilane ("FDTS"), perfluoro polyether ("PFPE"), fluoroalkylsilane and/or other organosilanes) may be introduced into the chamber by, for example, vapor deposition (for example, APCVD, LPCVD, or PECVD) to thereby provide an anti-stiction layer on the mechanical structures.

It should be further noted that while the present inventions have been described in the context of microelectromechanical systems including micromechanical structures or elements, the present inventions are not limited in this regard. Rather, the inventions described herein are applicable to other electromechanical systems including, for example, nanoelectromechanical systems. Thus, the present inventions are pertinent to electromechanical systems, for example, gyroscopes, resonators, temperatures sensors and/or accelerometers, made in accordance with fabrication techniques, such as lithographic and other precision fabrication techniques, which reduce mechanical components to a scale that is generally comparable to microelectronics. Indeed, any MEMS structure that is encapsulated by using thin film packaging or wafer bonding techniques, and subsequently "opened", and, after application or introduction of an anti-stiction fluid, is "re-sealed" is to be within the scope of the present invention.

In addition, while some embodiments of some aspects have been shown with multiple anti-stiction channels that are closed and/or sealed using a single cycle (e.g., a pressure and/or temperature cycle), this is not meant to imply that other aspects of the present invention could not also be employed with multiple anti-stiction channels that are closed and/or sealed, at least in part, using a single cycle.

Finally, as mentioned above, all of the embodiments of the present invention described and illustrated herein may be implemented in the embodiments of Microelectromechanical Systems and Method of Encapsulating Patent Application and/or Microelectromechanical Systems Having Trench Isolated Contacts Patent Application and/or Anchors for Microelectromechanical Systems Patent Application. For the sake of brevity, those permutations and combinations will not be repeated but are incorporated by reference herein.

Again, there are many inventions described and illustrated herein. In addition, while various embodiments have been described, such description should not be interpreted in a limiting sense. Other embodiments, which may be different from and/or similar to, the embodiments described herein, will be apparent from the description, illustrations and/or claims set forth below. In addition, although various features, attributes and advantages have been described and/or are apparent in light thereof, it should be understood that such features, attributes and advantages are not required in all of the embodiments of the present inventions.

What is claimed is:

1. A method for use in association with an electromechanical device having a substrate and an encapsulation structure, the encapsulation structure being disposed over at least a portion of the substrate and defining at least a portion of a chamber, the electromechanical device further having a mechanical structure disposed in the chamber; the method comprising:
forming at least one anti-stiction channel through the encapsulation structure;
introducing an anti-stiction fluid into the chamber via the anti-stiction channel; and
providing a channel cap having at least one preform portion disposed over or in at least a portion of the anti-stiction channel to seal the anti-stiction channel, at least in part.

2. The method of claim 1 wherein the anti-stiction fluid forms an anti-stiction layer on at least a portion of the mechanical structure.

3. The method of claim 1 wherein providing a channel cap having at least one preform portion comprises affixing the at least one preform portion to the electromechanical device.

4. The method of claim 3 wherein affixing comprises providing force to cause contact between the at least one preform portion and the electromechanical device.

5. The method of claim 3 wherein affixing comprises bonding the at least one preform portion to the electromechanical device.

6. The method of claim 5 wherein bonding comprises ultrasonically bonding the at least one preform portion to the electromechanical device.

7. The method of claim 3 wherein affixing comprises applying heat.

8. The method of claim 7 wherein affixing further comprises providing force to cause contact between the at least one preform portion and the electromechanical device.

9. The method of claim 7 wherein the anti-stiction fluid forms an anti-stiction layer on at least a portion of the mechanical structure and applying heat comprises keeping the amount of heat low enough to prevent destruction of the anti-stiction layer.

10. The method of claim 1 wherein the at least one preform portion has a width greater than a width of the anti-stiction channel.

11. The method of claim 1 wherein the at least one preform portion comprises at least one metal portion.

12. The method of claim 11 wherein the at least one metal portion comprises a wire ball.

13. The method of claim 11 wherein the at least one metal portion comprises a metal stud.

14. The method of claim 11 wherein providing a channel cap having at least one preform portion comprises affixing the at least one metal portion to the electromechanical device.

15. The method of claim 14 wherein affixing comprises providing force to cause contact between the at least one preform portion and the electromechanical device.

16. The method of claim 15 wherein affixing further comprises bonding the at least one metal portion to the electromechanical device.

17. The method of claim 15 wherein affixing comprises applying heat.

18. The method of claim 1 wherein the at least one preform portion comprises at least one solder preform.

19. The method of claim 18 wherein affixing comprises applying heat.

20. The method of claim 1 wherein the encapsulation structure comprises silicon and wherein providing a channel cap having at least one preform portion comprises providing at least one metal preform portion on the encapsulation structure.

21. The method of claim 20 wherein affixing comprises applying heat.

22. The method of claim 1 wherein the at least one preform portion has one or more portions that define a wedged shaped contour.

23. The method of claim 1 further comprising:
providing a bond member superjacent to the encapsulation structure; and
wherein providing a channel cap having at least one preform portion comprises bonding the at least one preform portion to the bond member.

24. The method of claim 23 wherein the bond member comprises a metal bond member.

25. The method of claim 24 wherein the metal bond member comprises a metal ring.

26. A method for use in association with an electromechanical device having a substrate and an encapsulation structure, the encapsulation structure being disposed over at least a portion of the substrate and defining at least a portion of a chamber, the electromechanical device further having a mechanical structure disposed in the chamber; the method comprising:
forming at least one anti-stiction channel through the encapsulation structure;
introducing an anti-stiction fluid into the chamber via the anti-stiction channel; and
providing a channel cap having at least one portion disposed over or in at least a portion of the anti-stiction channel to seal the anti-stiction channel, at least in part,
wherein providing a channel cap comprises fabricating the at least one portion apart from the electromechanical device and thereafter affixing the at least one portion to the electromechanical device.

27. The method of claim 26 wherein affixing comprises providing force to cause contact between the at least one portion and the electromechanical device.

28. The method of claim 27 further comprising removing the force.

29. The method of claim 26 wherein affixing comprises applying heat.

30. A method for use in association with an electromechanical device having a substrate and an encapsulation structure, the encapsulation structure being disposed over at least a portion of the substrate and defining at least a portion of a chamber, the electromechanical device further having a mechanical structure disposed in the chamber; the method comprising:
forming at least one anti-stiction channel through the encapsulation structure;
introducing an anti-stiction fluid into the chamber via the anti-stiction channel; and
providing a channel cap having at least one portion disposed over or in at least a portion of the anti-stiction channel to seal the anti-stiction channel, at least in part,
wherein the at least one portion comprises a wire ball, a stud, or a solder preform.

31. The method of claim 1, wherein the anti-stiction fluid is introduced into the chamber at a temperature of between 20° C. and 600° C.

32. The method of claim 31, wherein the anti-stiction fluid is introduced into the chamber at a temperature of between 100° C. and 300° C.

33. The method of claim 1, wherein the anti-stiction fluid is introduced into the chamber at a pressure of between 100 µTorr and 1 Torr.

34. The method of claim 1, wherein the anti-stiction fluid is one of a gas and a gas vapor of a material used to form the channel cap.

35. The method of claim 1, wherein the anti-stiction fluid is introduced by forming the channel cap.

36. The method of claim 1, wherein the anti-stiction fluid is a by-product of a reaction of material of the electromechanical device with one of a gas and a gas vapor of a material used during formation of the channel cap.

* * * * *